United States Patent [19]
Abe et al.

[11] Patent Number: 5,400,275
[45] Date of Patent: Mar. 21, 1995

[54] SEMICONDUCTOR MEMORY DEVICE USING FERROELECTRIC CAPACITOR AND HAVING ONLY ONE SENSE AMPLIFIER SELECTED

[75] Inventors: Kazuhide Abe, Kawasaki; Hiroshi Toyoda, Yokohama; Koji Yamakawa, Kawasaki; Motomasa Imai; Koji Sakui, both of Tokyo, all of Japan

[73] Assignee: Kabushiki Kaisha Toshiba, Kawasaki, Japan

[21] Appl. No.: 712,092

[22] Filed: Jun. 7, 1991

[30] Foreign Application Priority Data

Jun. 8, 1990 [JP] Japan .................. 2-148561
Jul. 13, 1990 [JP] Japan .................. 2-184209

[51] Int. Cl.$^6$ .................. G11C 7/00; G11C 11/22
[52] U.S. Cl. .................. 365/145; 365/149; 365/203
[58] Field of Search .................. 365/145, 149, 203

[56] References Cited

U.S. PATENT DOCUMENTS

| | | | |
|---|---|---|---|
| 4,873,664 | 10/1989 | Eaton, Jr. | 365/145 |
| 4,893,272 | 1/1990 | Eaton, Jr. et al. | 365/145 |
| 5,086,412 | 2/1992 | Jaffe et al. | 365/145 |
| 5,121,353 | 6/1992 | Natori | 365/145 |
| 5,136,534 | 8/1992 | McDavid et al. | 365/145 X |

FOREIGN PATENT DOCUMENTS 0293798 12/1988 European Pat. Off. .
63-201998 8/1988 Japan .
1-158691 6/1989 Japan .
364813 4/1990 Japan .................. 365/145

OTHER PUBLICATIONS

IEEE Journal of Solid State Circuits, vol. 24, No. 5, pp. 1206–1212, Oct., 1989, M. Aoki, et al., "A 1.5–V DRAM for Battery-Based Applications".

Primary Examiner—Benny Lee
Attorney, Agent, or Firm—Oblon, Spivak, McClelland, Maier, & Neustadt

[57] ABSTRACT

A semiconductor memory device comprises a plurality of memory cells arranged in the form of a matrix to constitute rows and columns, a plurality of first driving lines, connected to the memory cells, for transmitting a first driving signal to the memory cells, one of the plurality of first driving lines being selected by a row address, a plurality of second driving lines, connected to the memory cells, for transmitting a second driving signal to the memory cells, one of the plurality of second driving lines being selected by a column address, a plurality of read/write lines, connected to the memory cells, for performing read/write operations with respect to the memory cells, and a plurality of sense amplifiers connected to the read/write lines, wherein one of the plurality of sense amplifiers is selected by the column address, and the memory cells in the same column are connected to the same sense amplifier through the read/write lines.

22 Claims, 74 Drawing Sheets

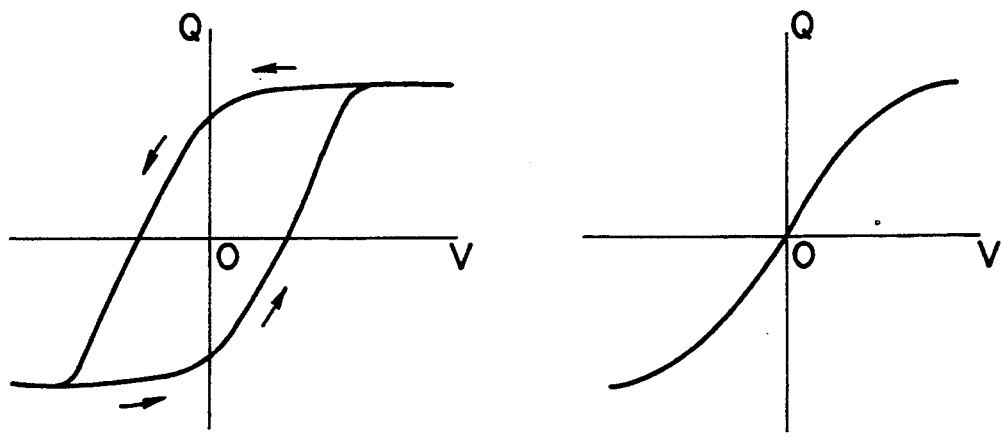
(PRIOR ART)
FIG. 1A
(PRIOR ART)
FIG. 1B
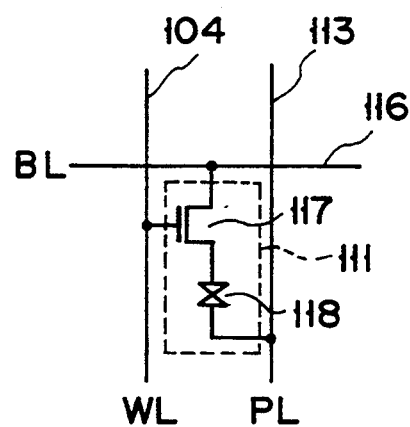
(PRIOR ART)
FIG. 2

$X_1 - X_1$ $X_2 - X_2$ $Y_1 - Y_1$ $Y_2 - Y_2$ $X_1 - X_1$ $X_2 - X_2$ $Y_1 - Y_1$ $Y_2 - Y_2$

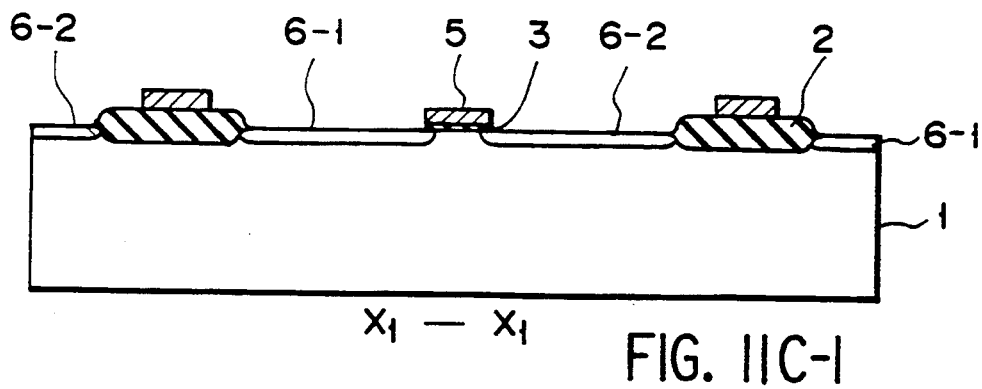
FIG. IIC-1
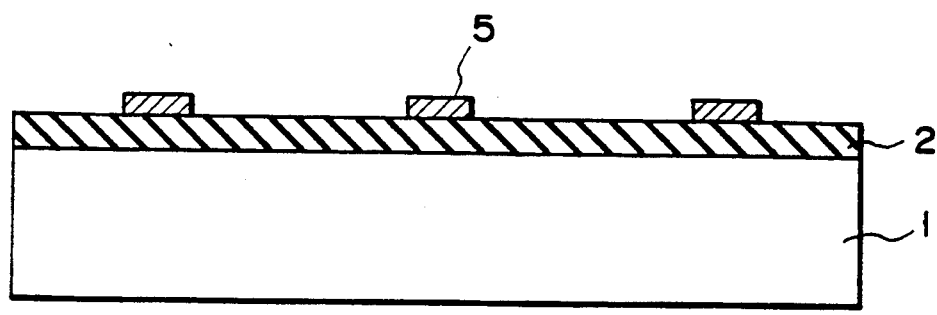
FIG. IIC-2
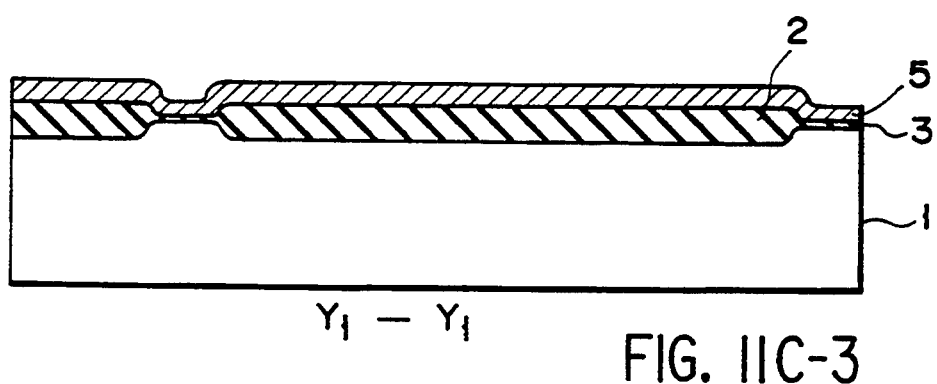
FIG. IIC-3
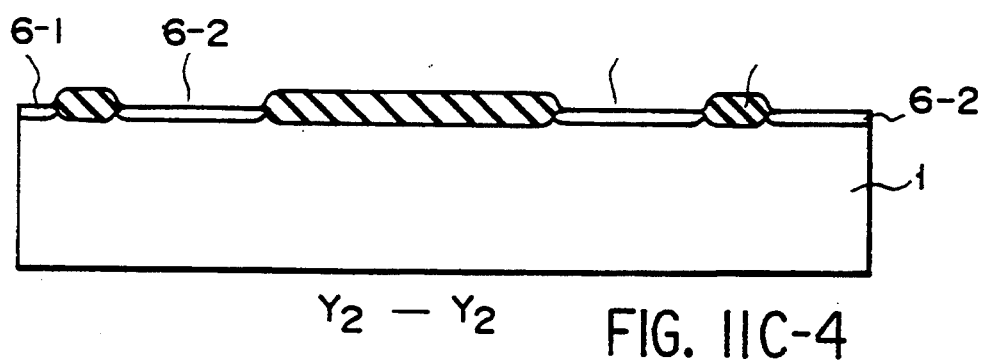
FIG. IIC-4

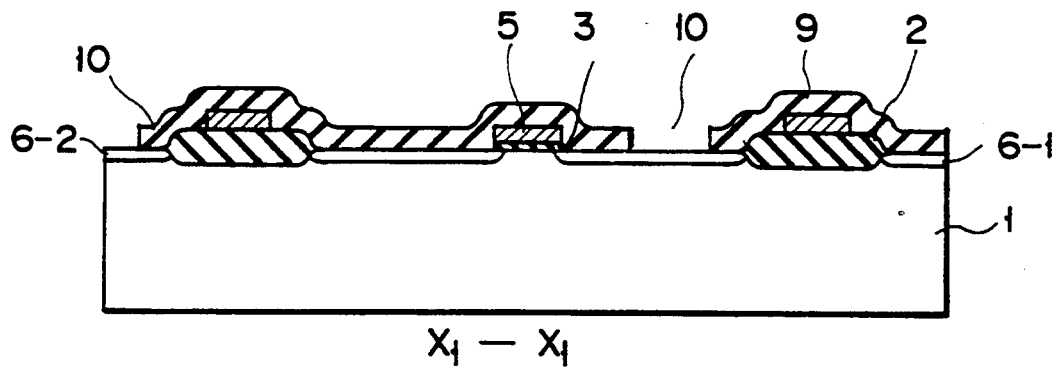
$X_1 - X_1$
FIG. 11D-1
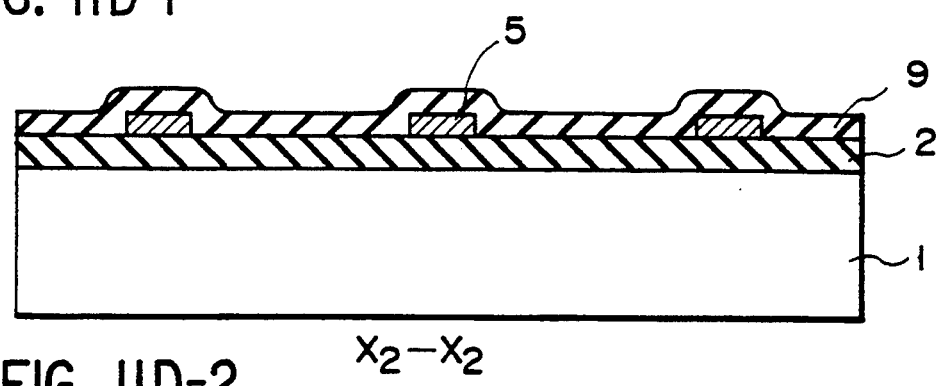
$X_2 - X_2$
FIG. 11D-2
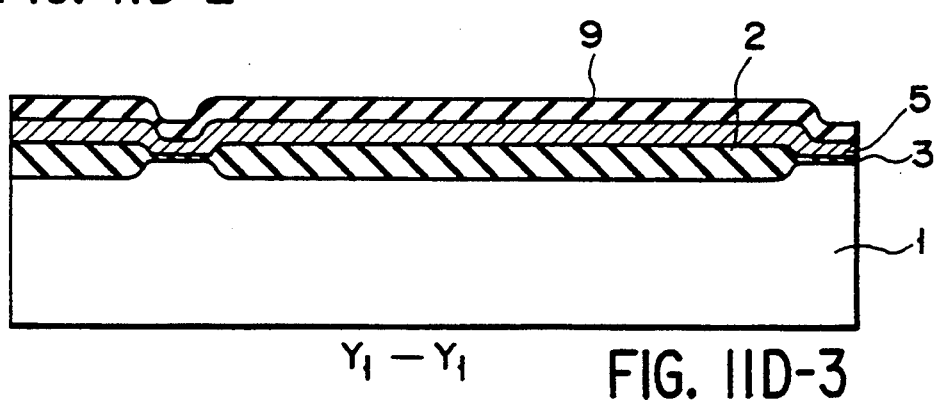
$Y_1 - Y_1$  FIG. 11D-3
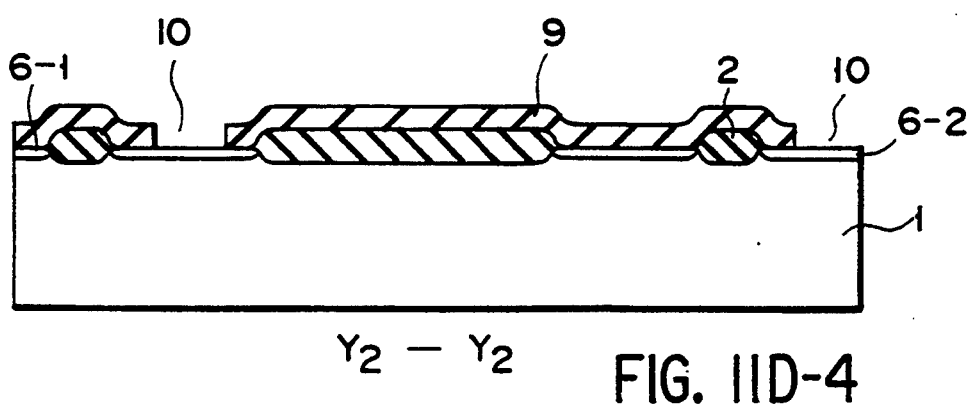
$Y_2 - Y_2$  FIG. 11D-4

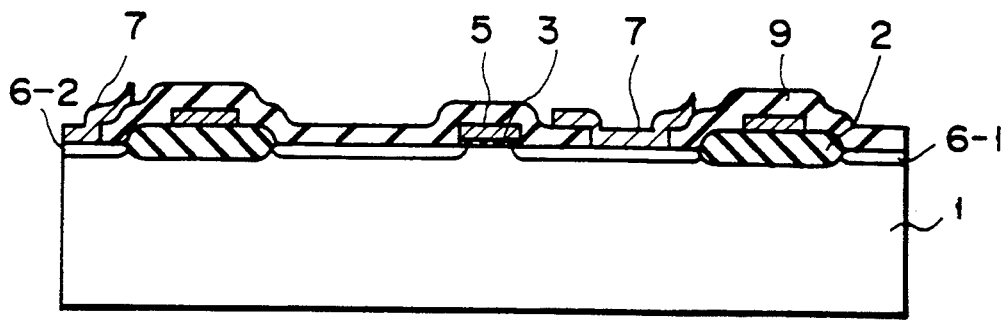
FIG. 11F-1  $X_1 - X_1$
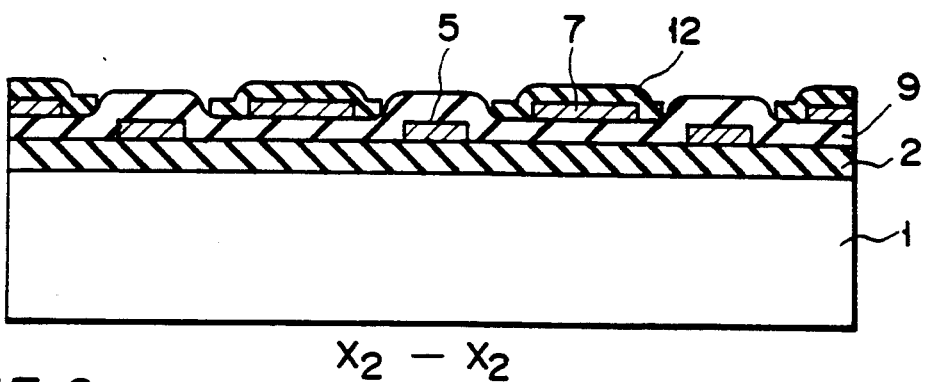
FIG. 11F-2  $X_2 - X_2$
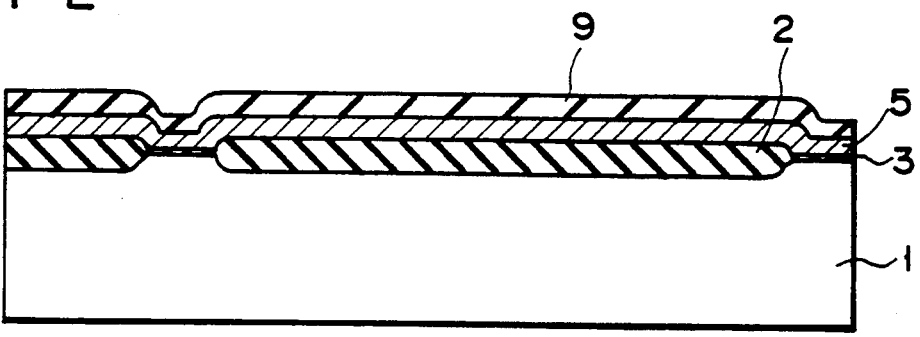
FIG. 11F-3  $Y_1 - Y_1$
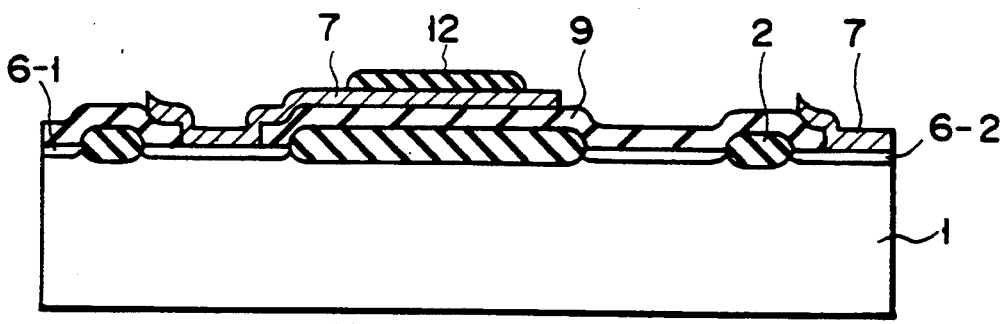
FIG. 11F-4  $Y_2 - Y_2$

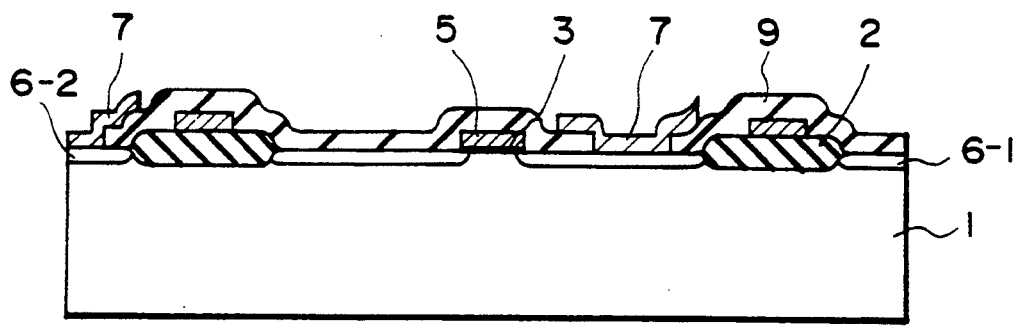
FIG. 11G-1    $X_1 - X_1$
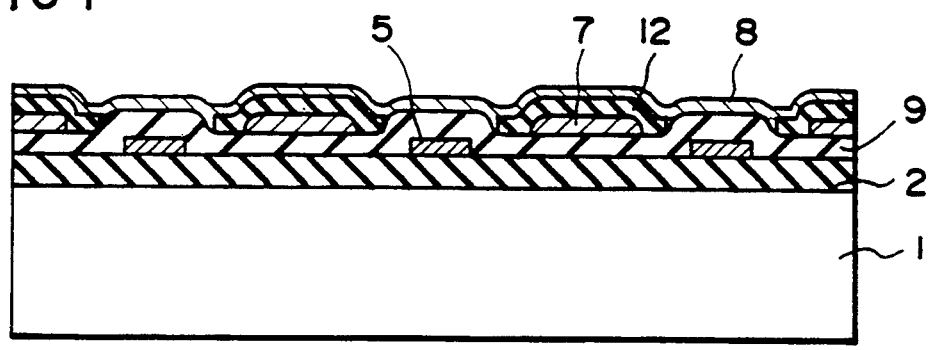
FIG. 11G-2    $X_2 - X_2$
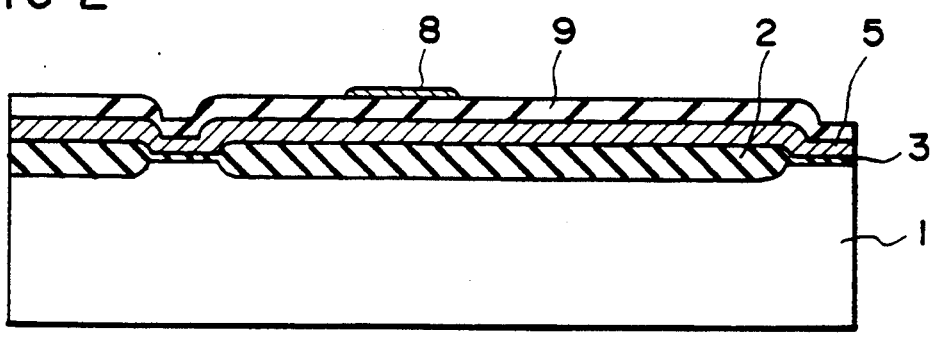
FIG. 11G-3    $Y_1 - Y_1$
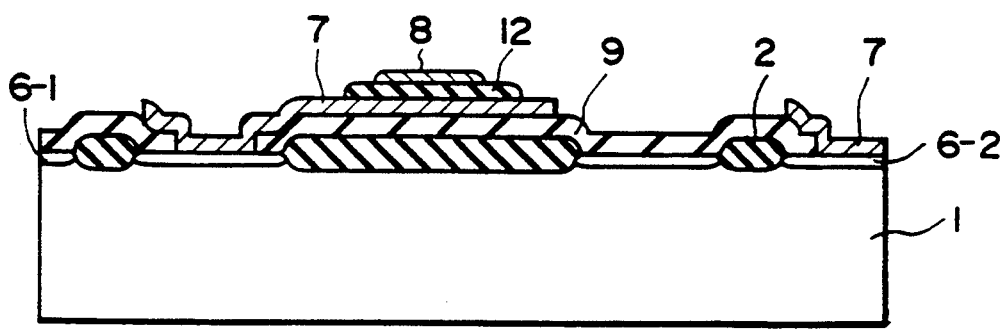
FIG. 11G-4    $Y_2 - Y_2$

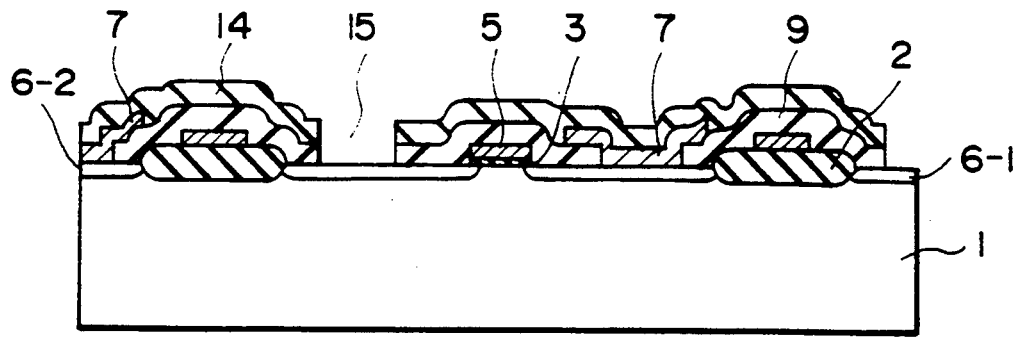
FIG. 11H-1    $X_1 - X_1$
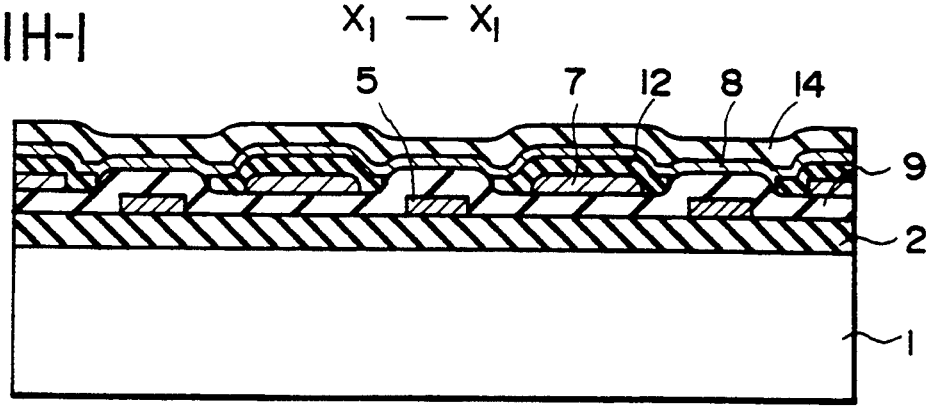
FIG. 11H-2    $X_2 - X_2$
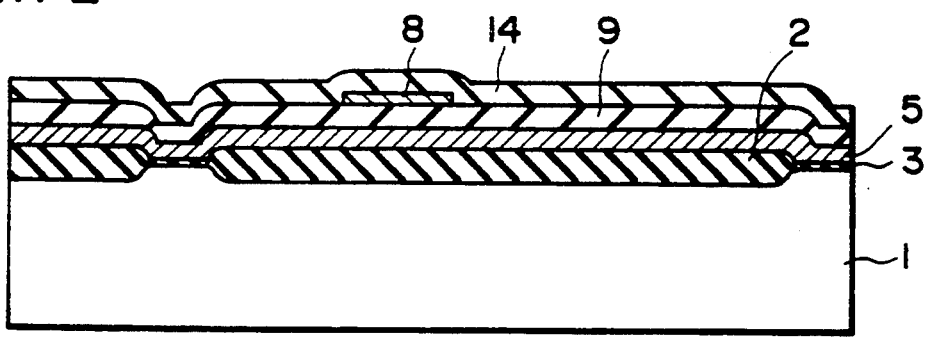
FIG. 11H-3    $Y_1 - Y_1$
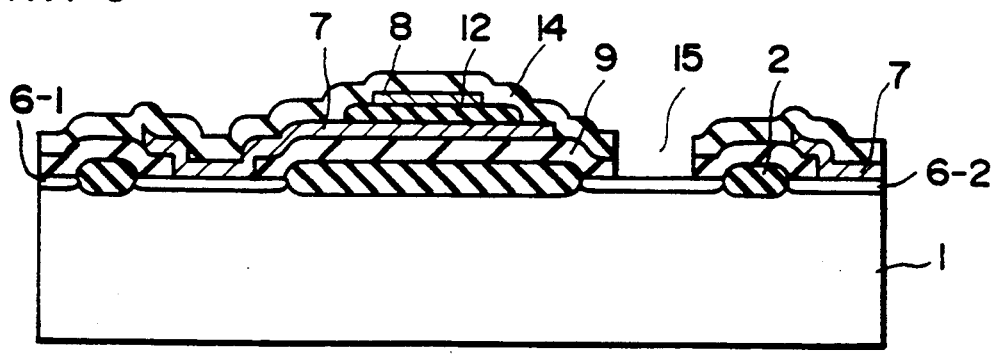
FIG. 11H-4    $Y_2 - Y_2$

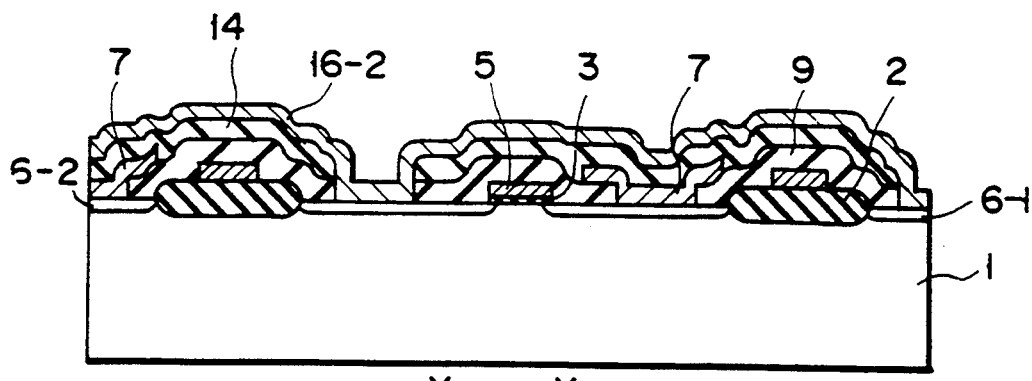
FIG. III-1    $X_1 - X_1$
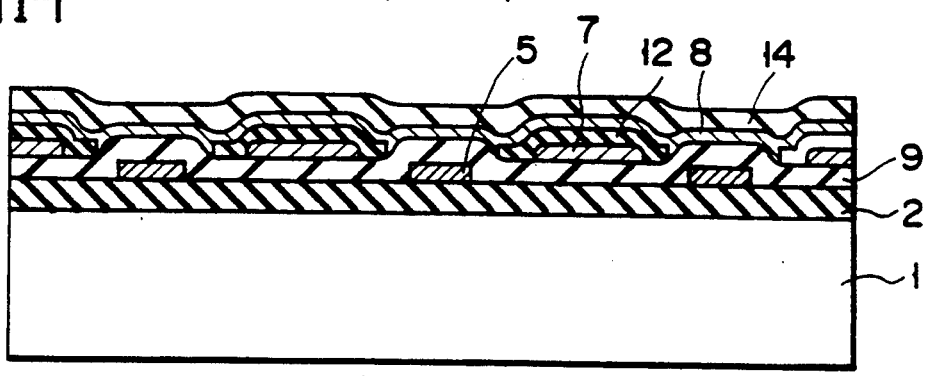
FIG. III-2    $X_2 - X_2$
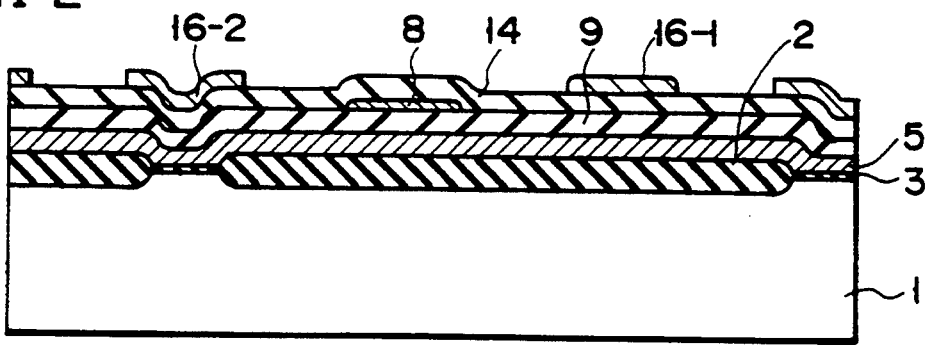
FIG. III-3    $Y_1 - Y_1$
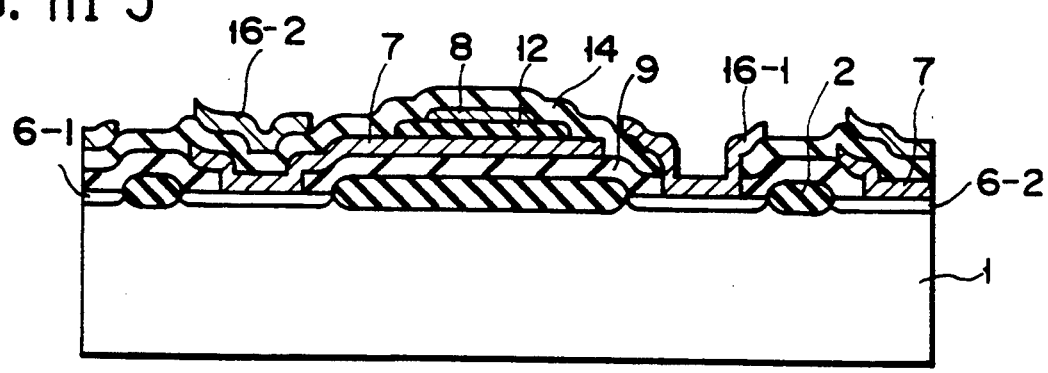
FIG. III-4    $Y_2 - Y_2$

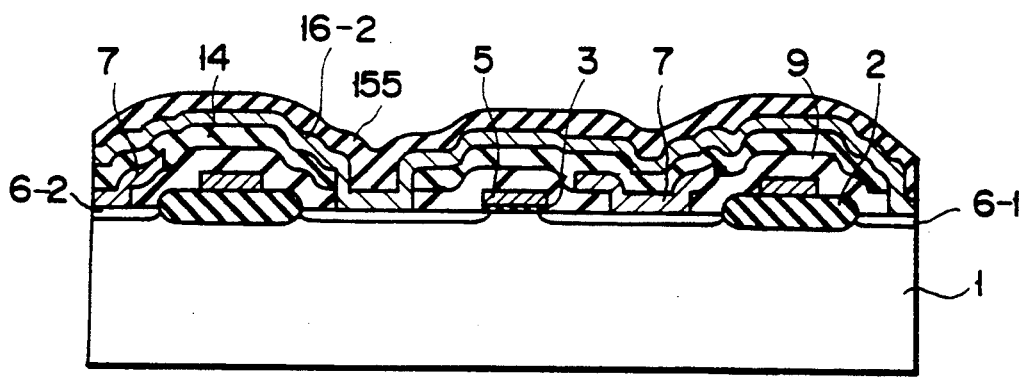
FIG. 11J-1  $X_1 - X_1$
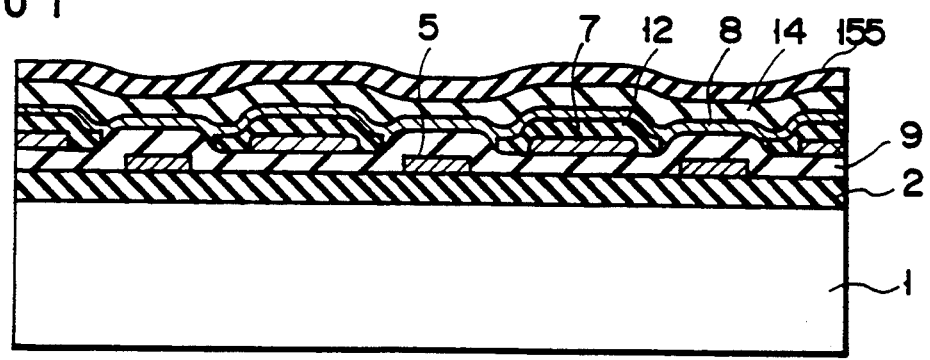
FIG. 11J-2  $X_2 - X_2$
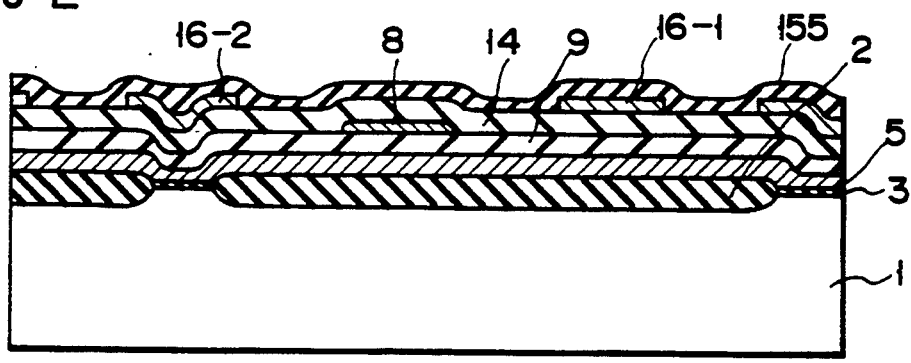
FIG. 11J-3  $Y_1 - Y_1$
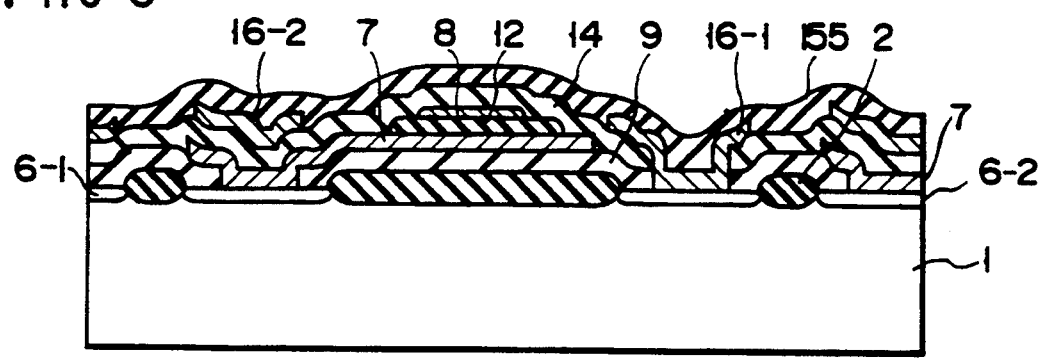
FIG. 11J-4  $Y_2 - Y_2$

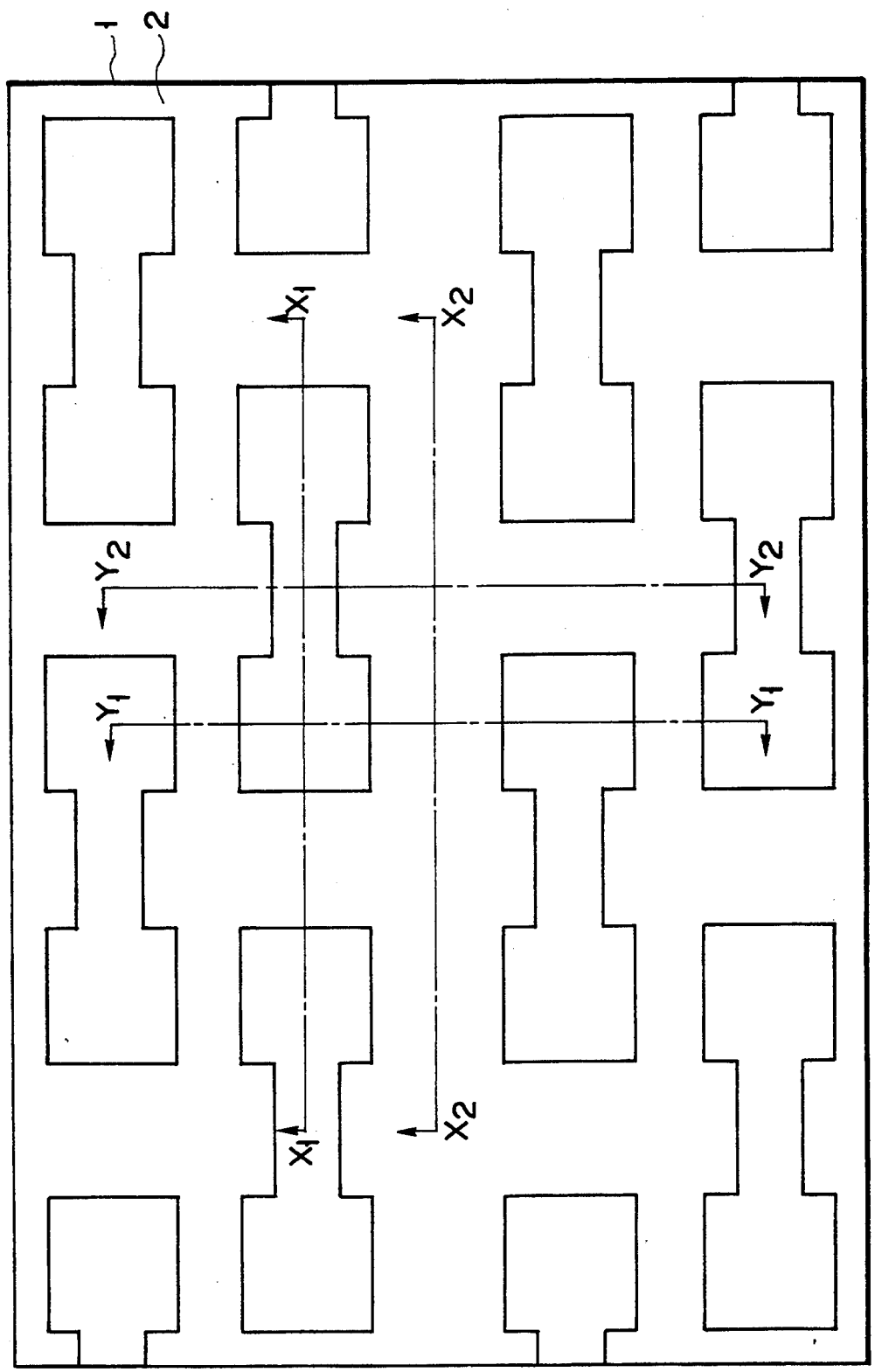
F I G. 12A

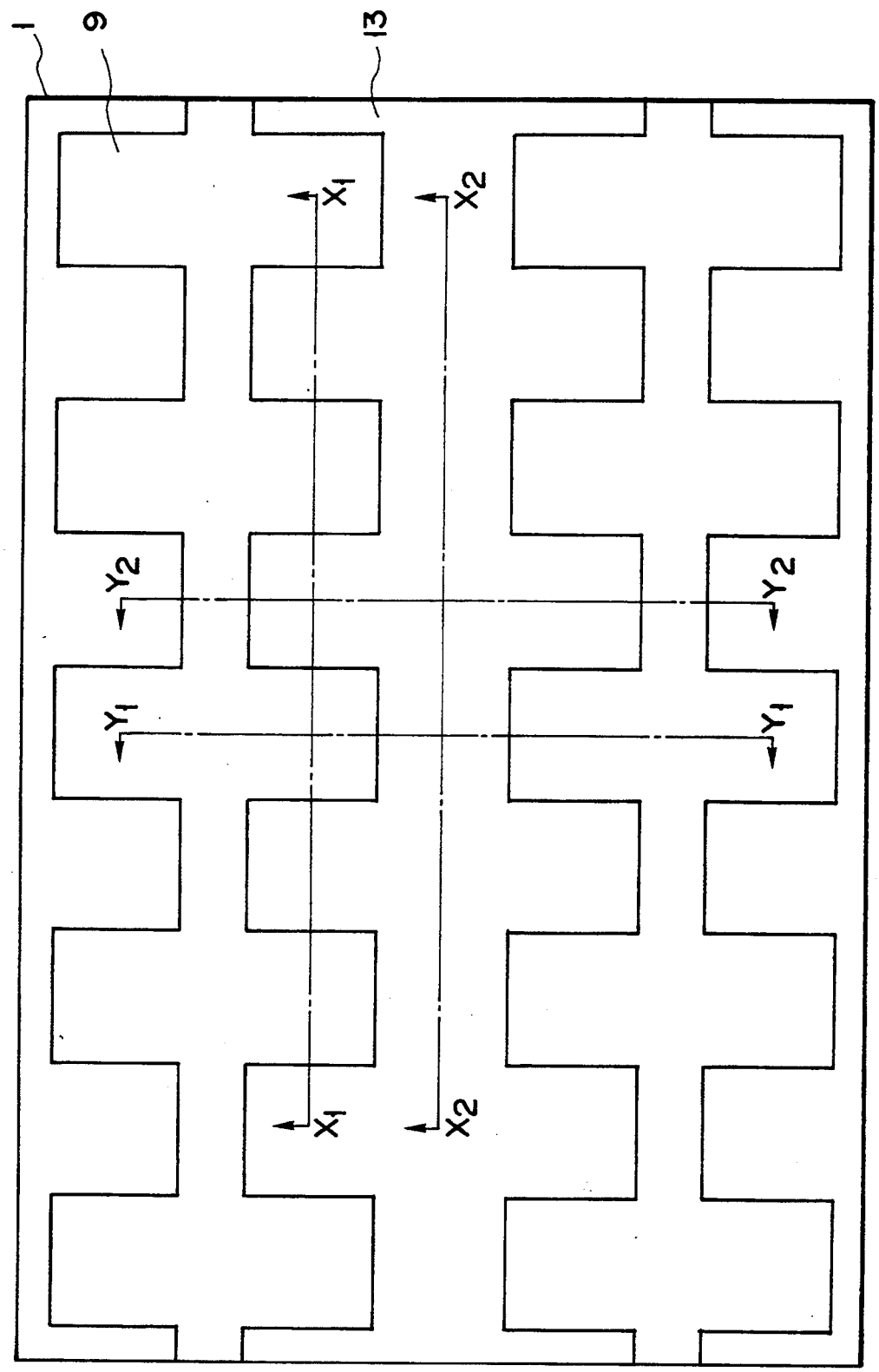
F I G. 12D

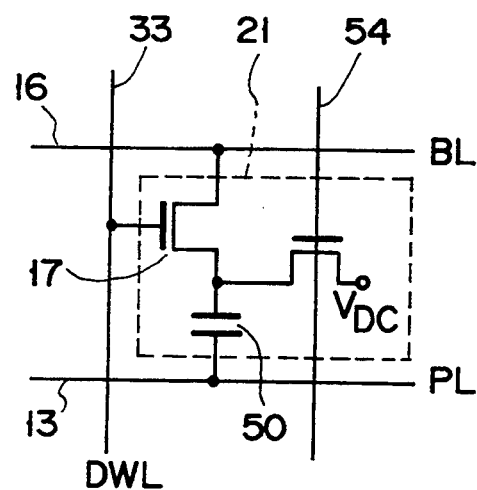
F I G. 17

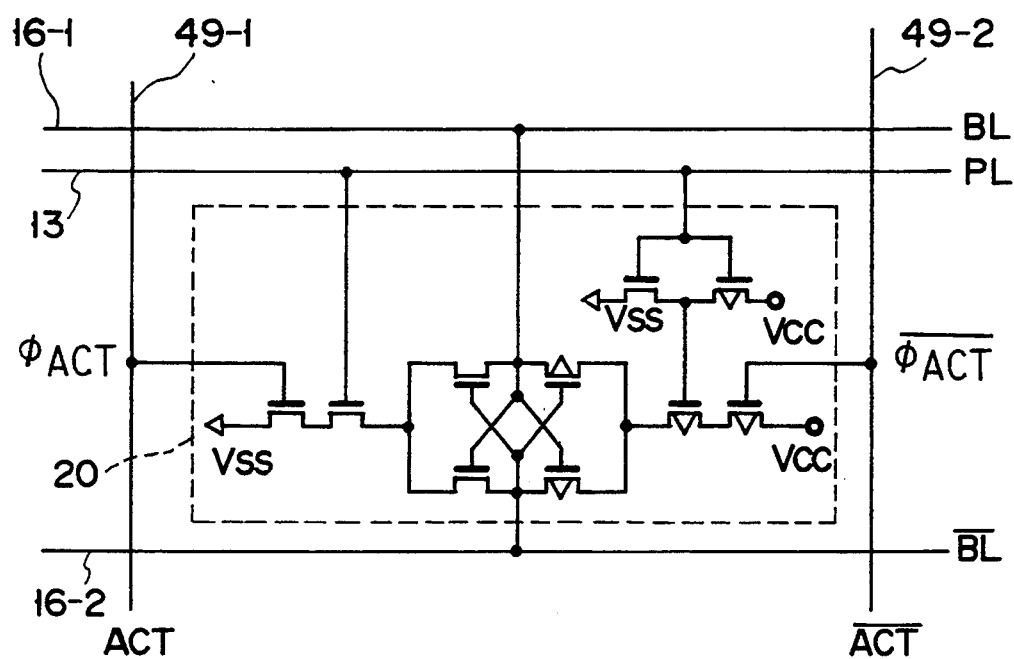
F I G. 22

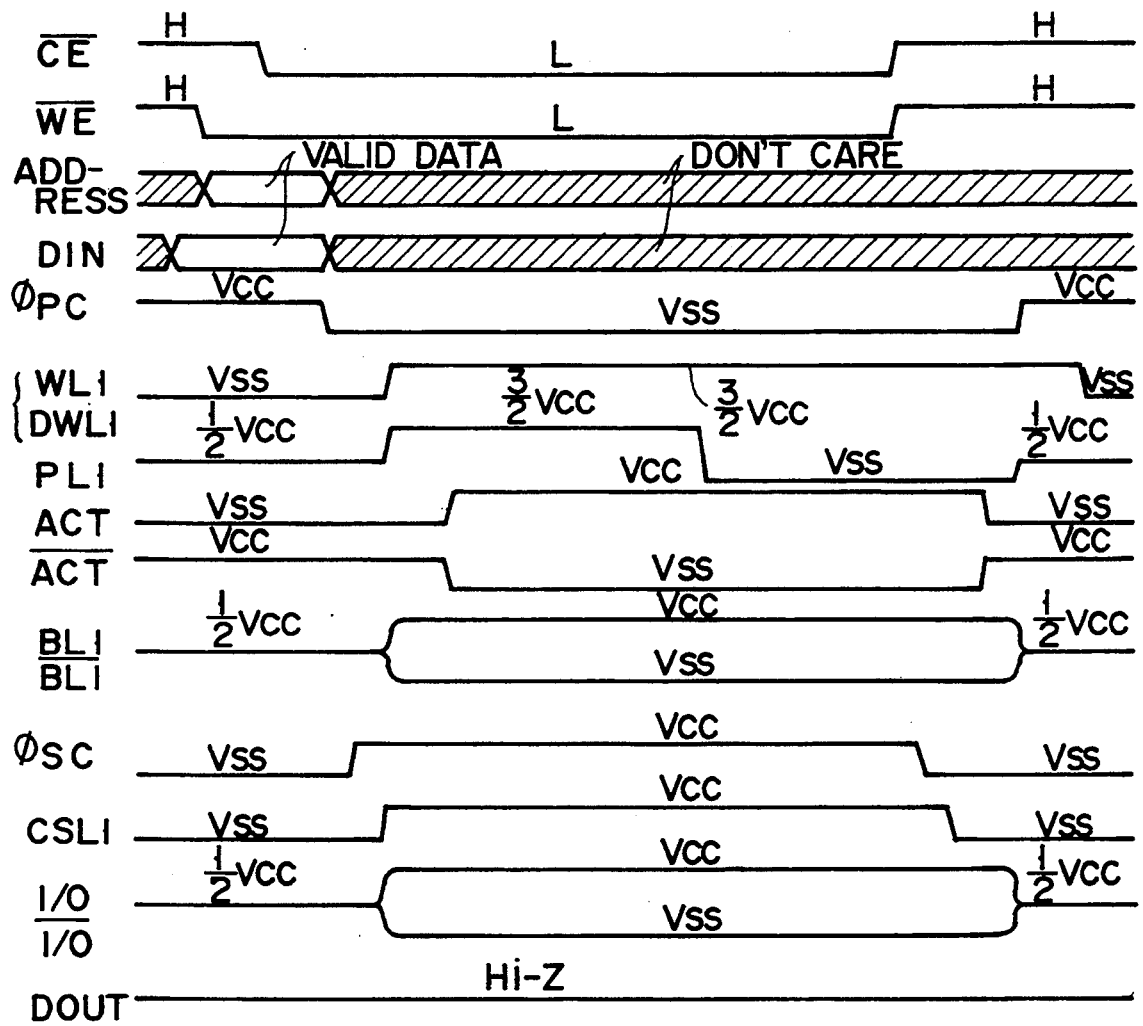
F I G. 28

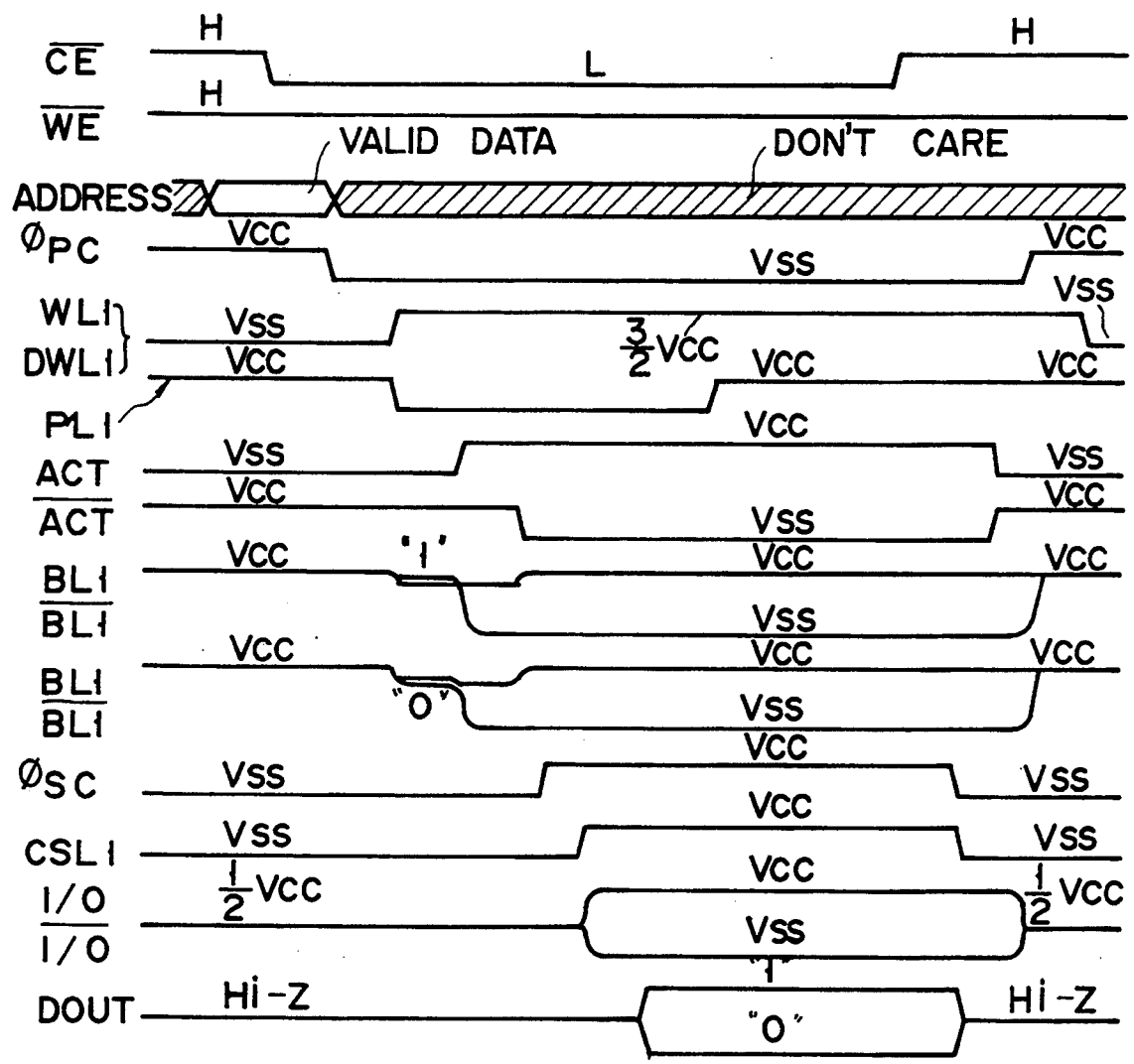
F I G. 31

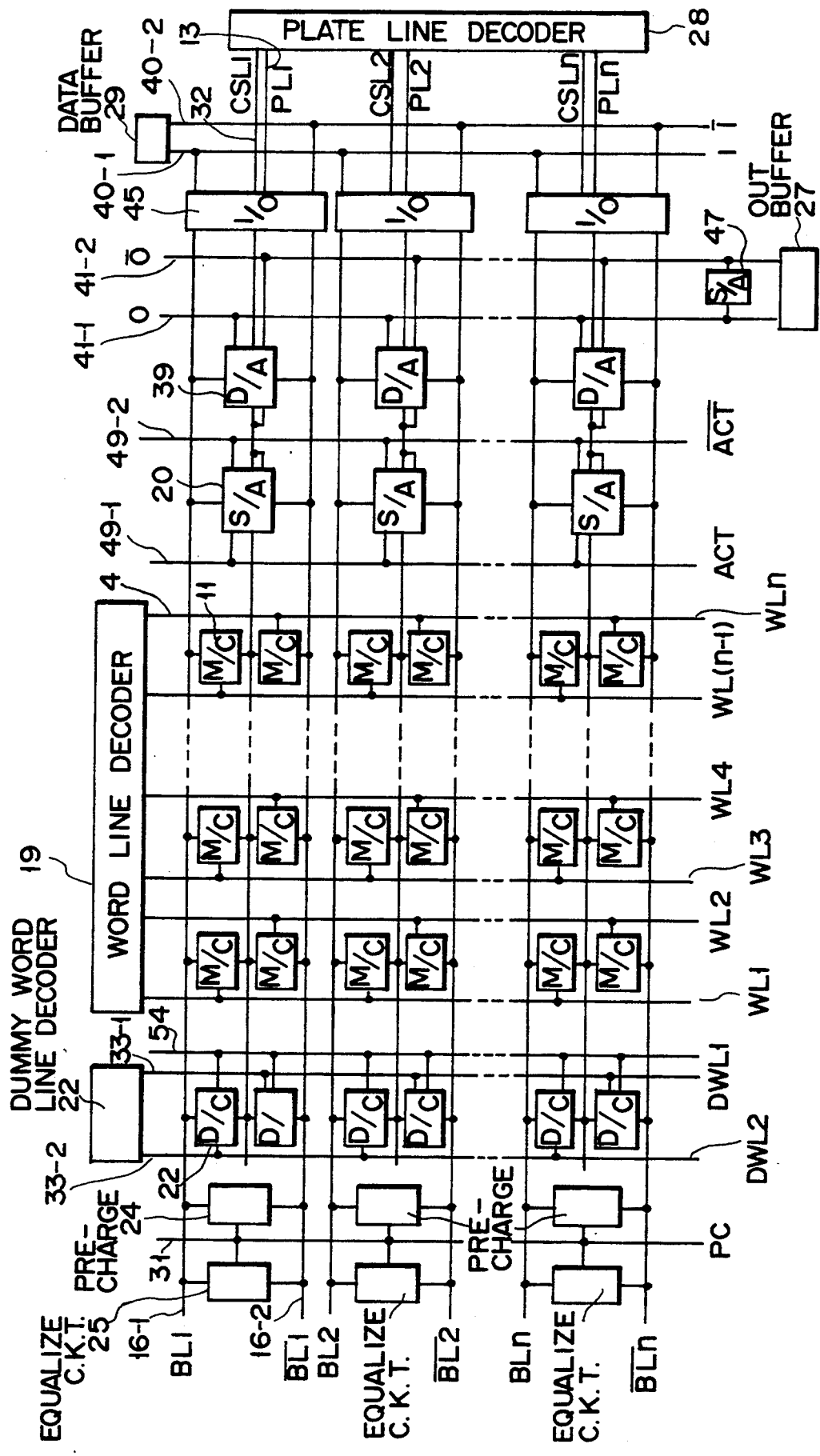
F I G. 32

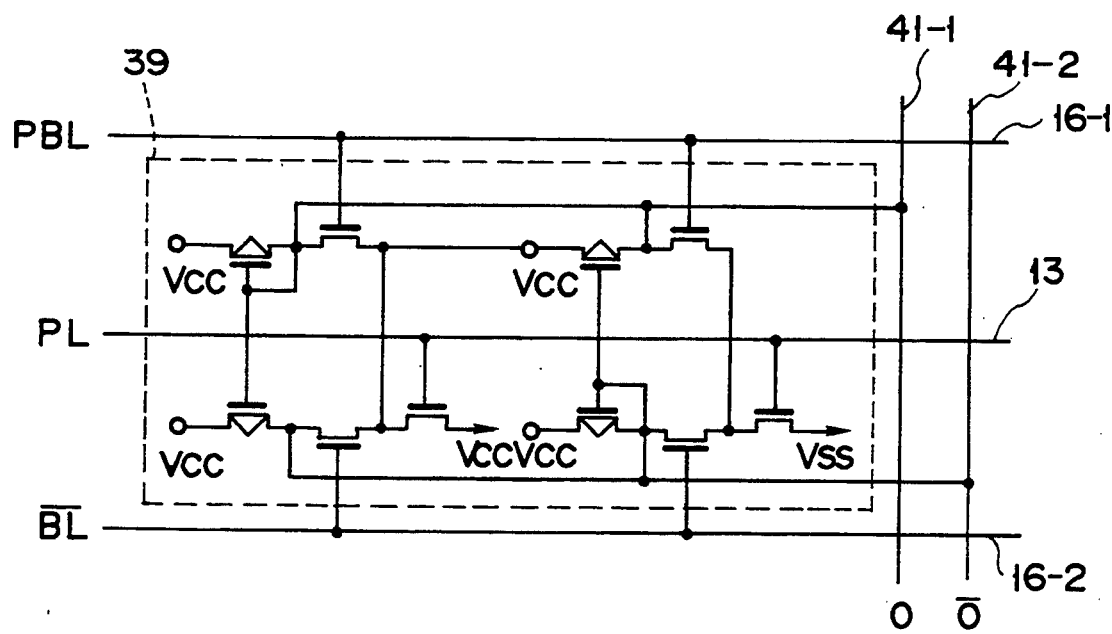
F I G. 33

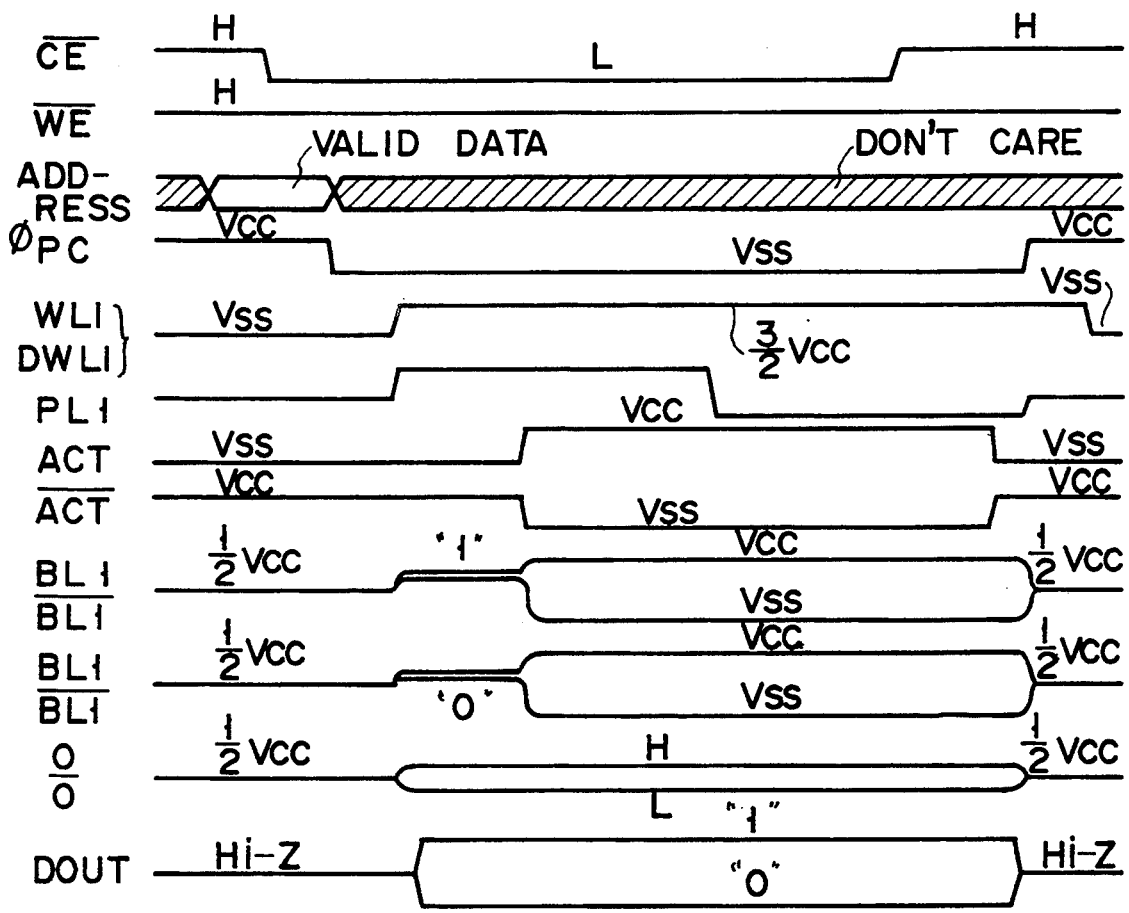
F I G. 34

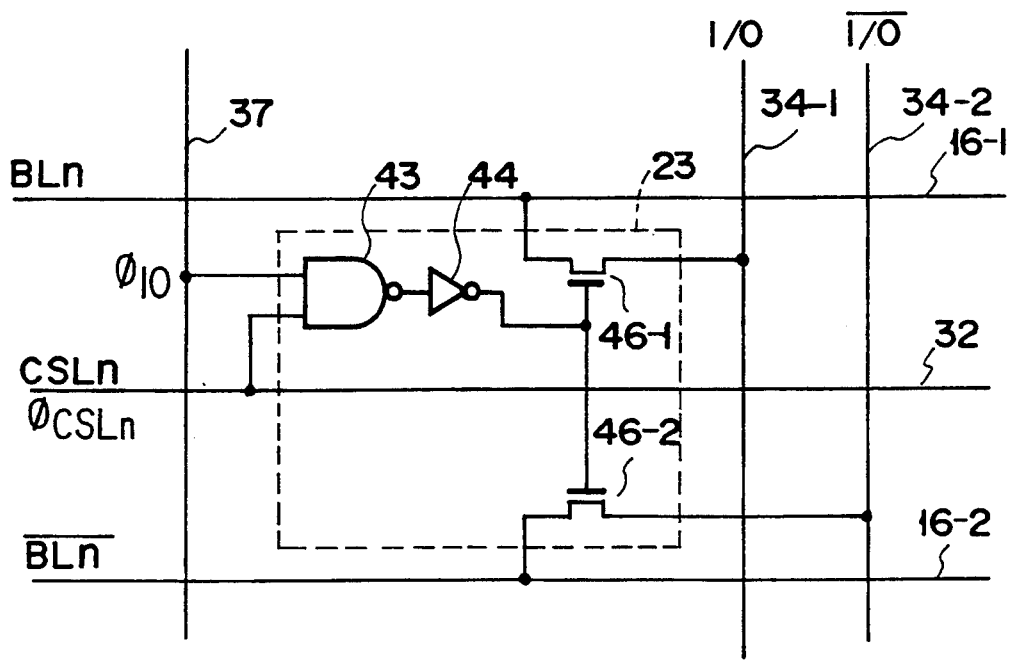
F I G. 39
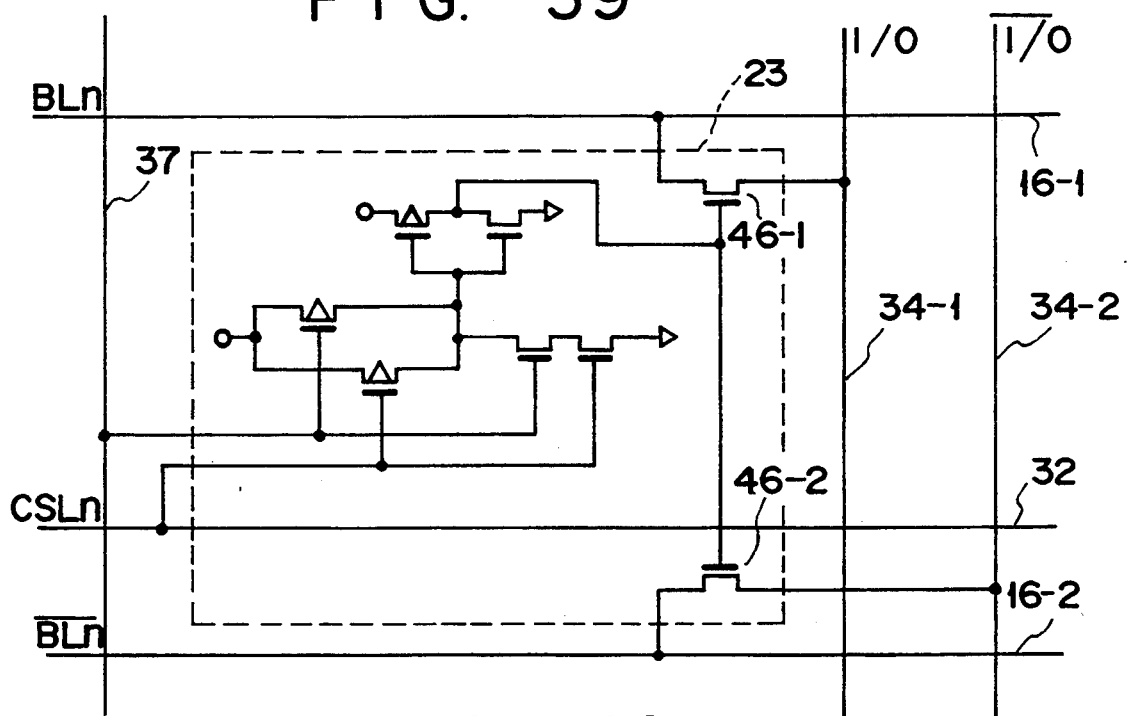
F I G. 40

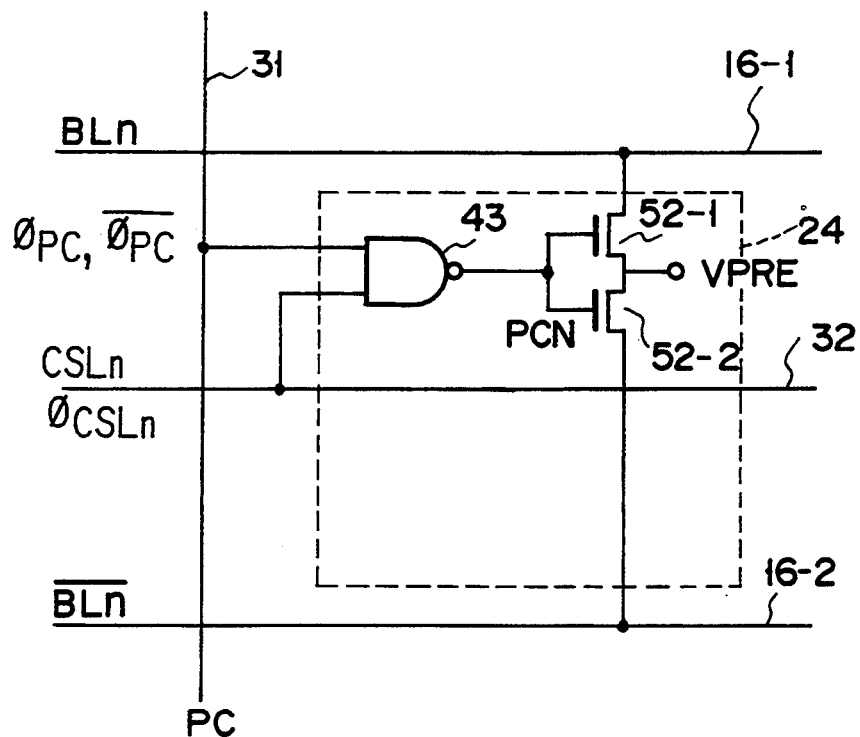
F I G. 41
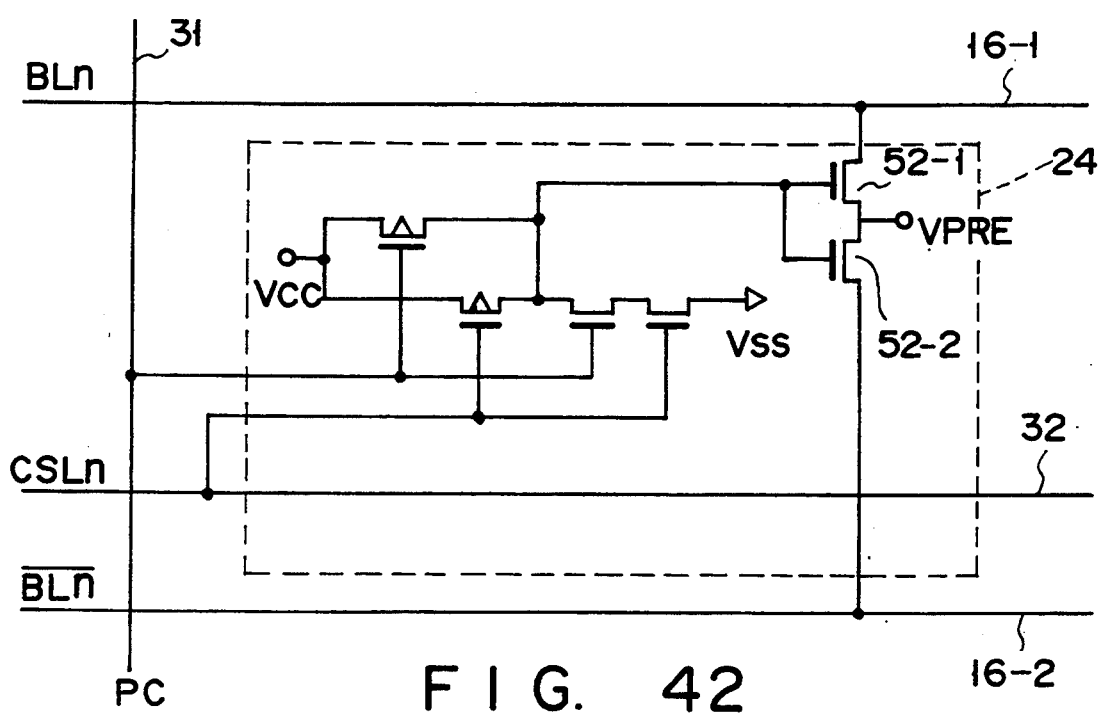
F I G. 42

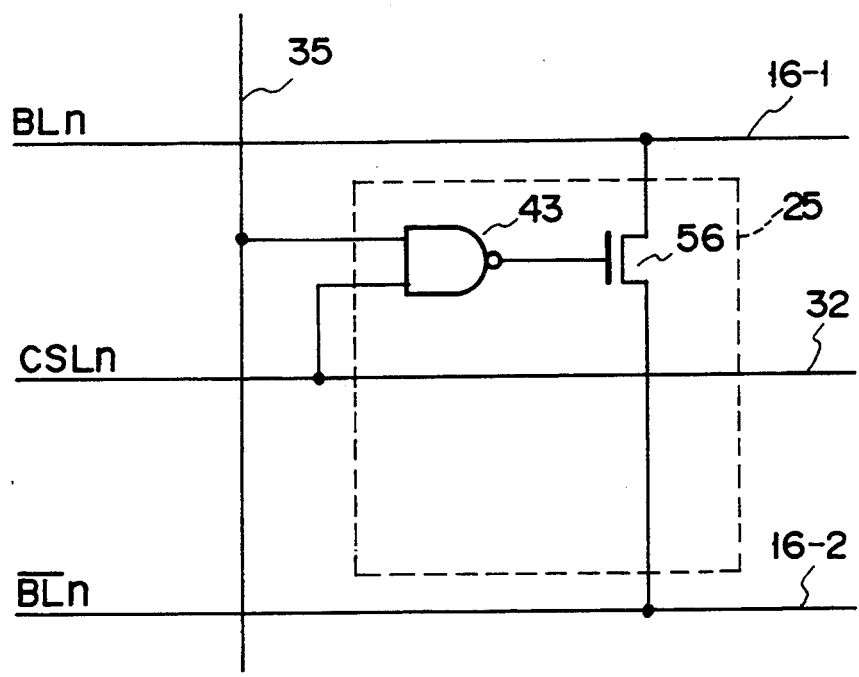
F I G. 43
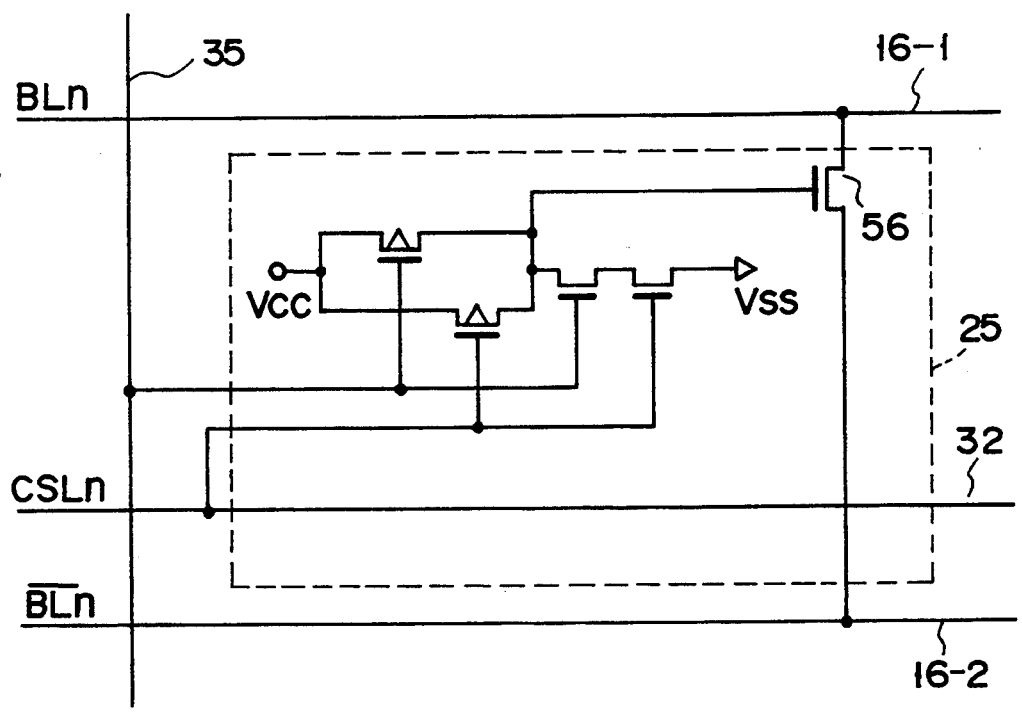
F I G. 44

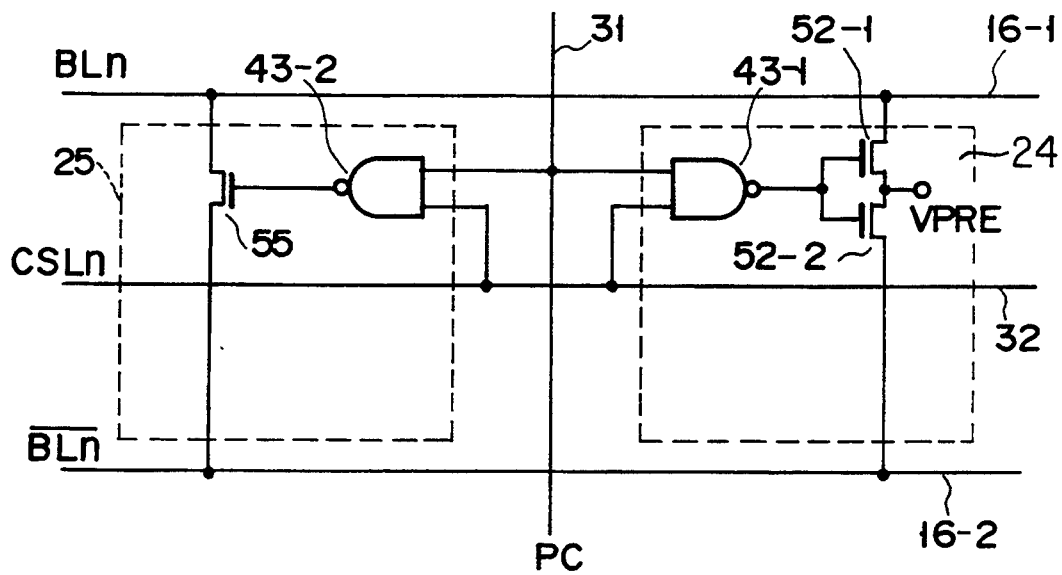
F I G. 45
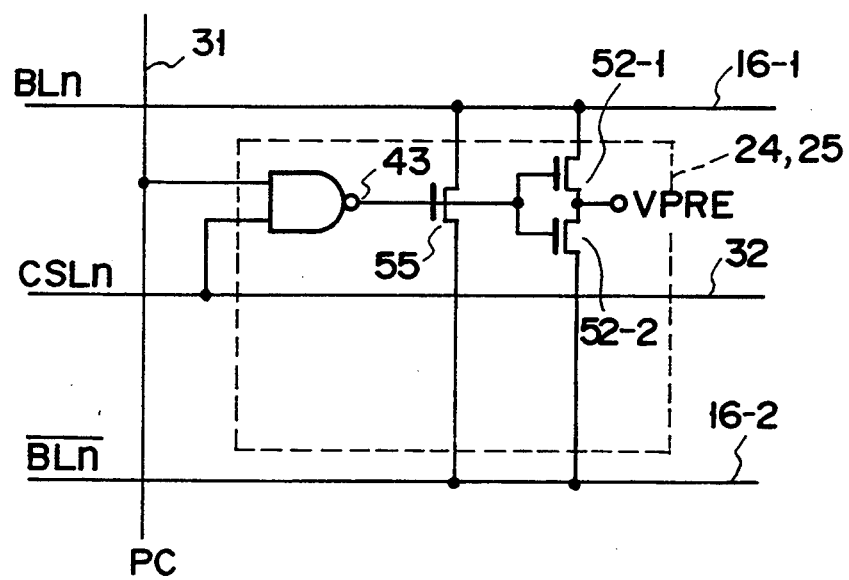
F I G. 46

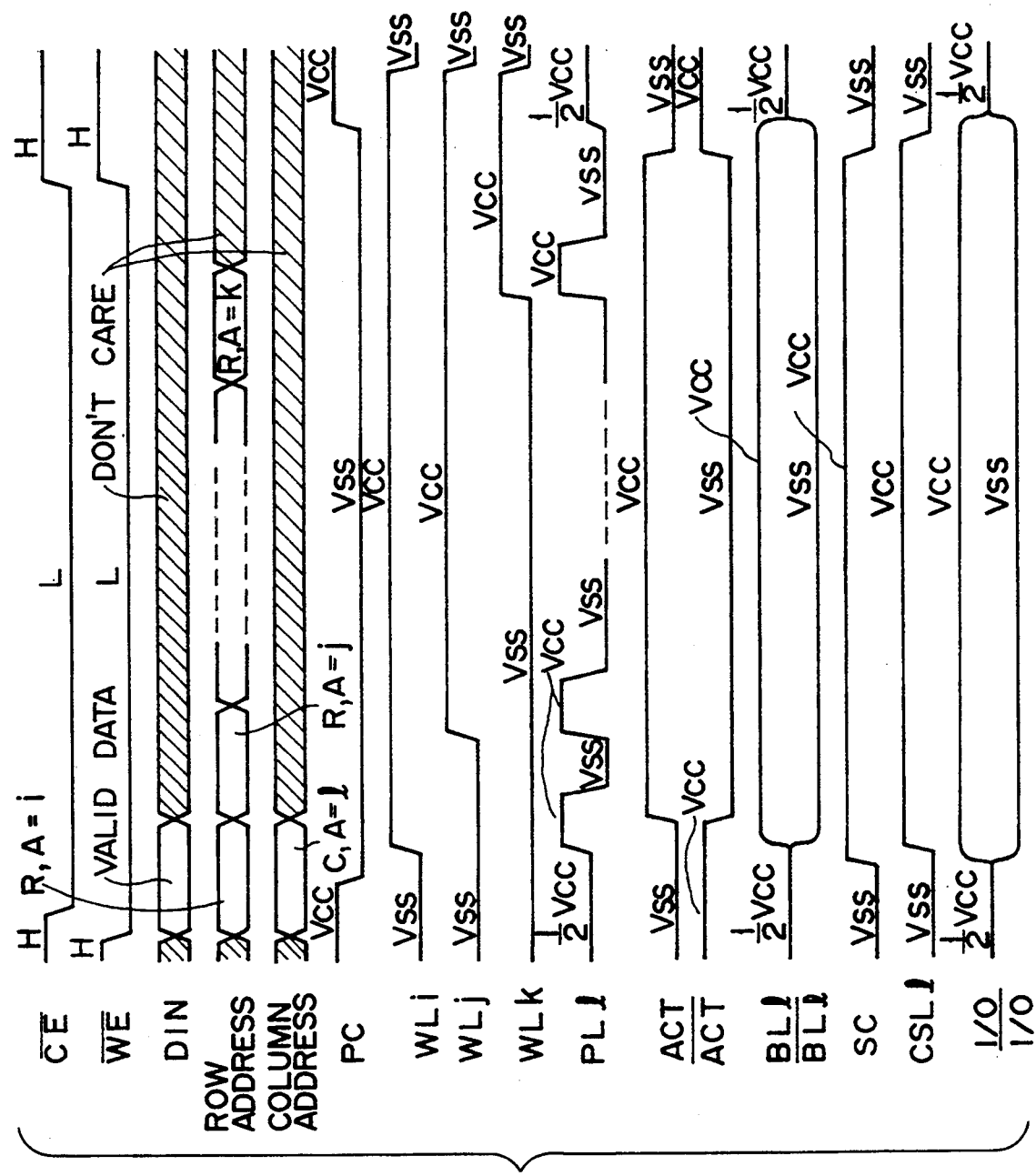
F I G. 48

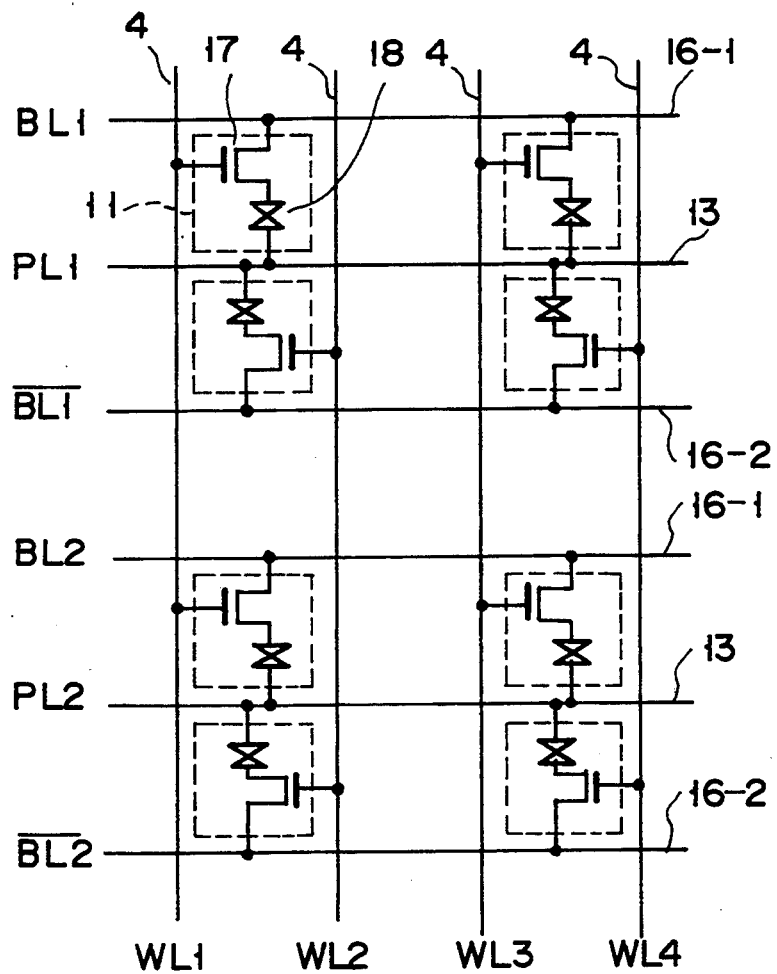
F I G. 51

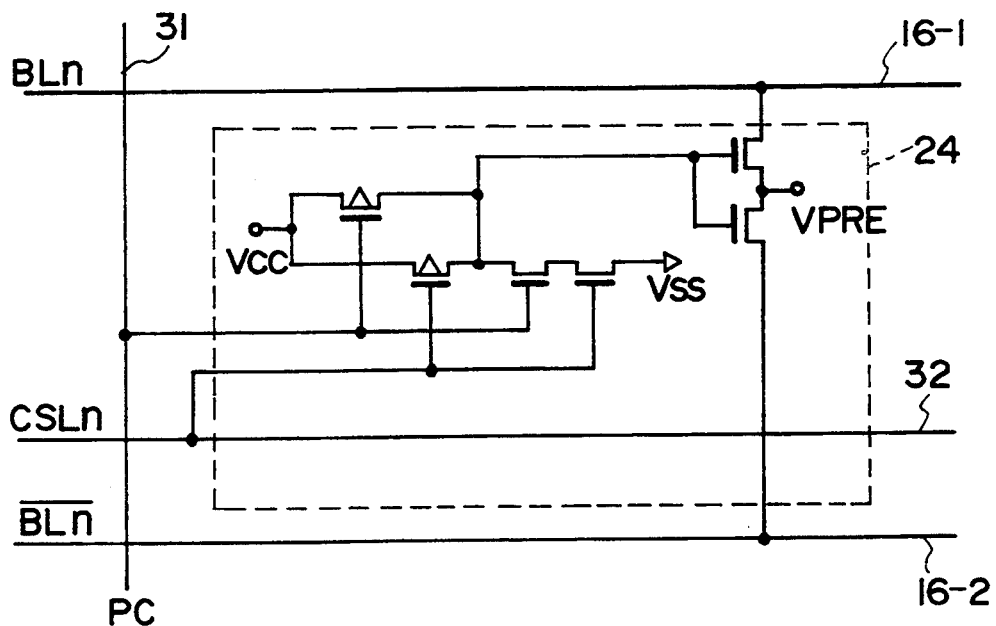
F I G. 56
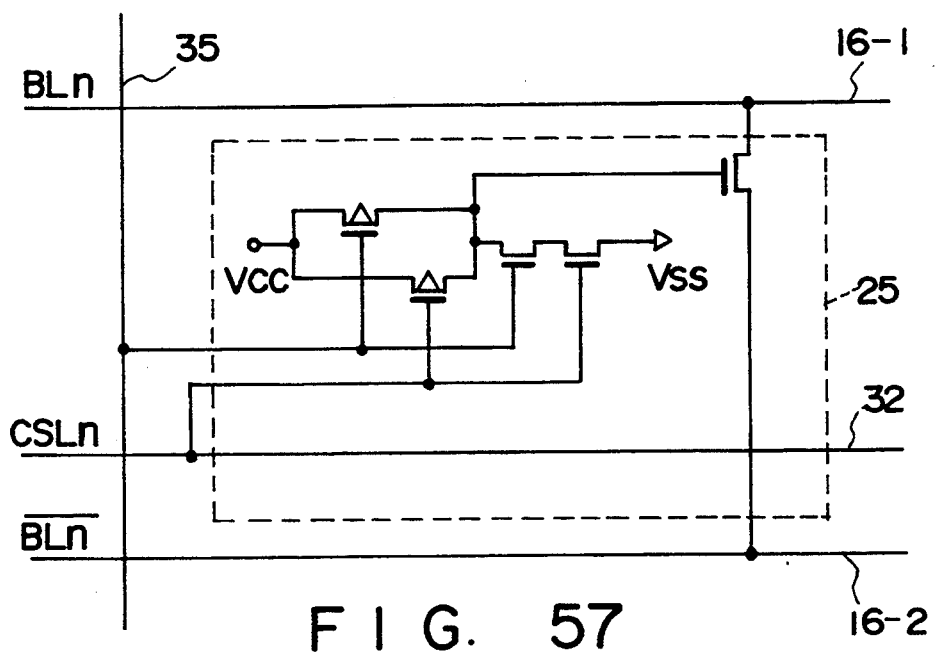
F I G. 57

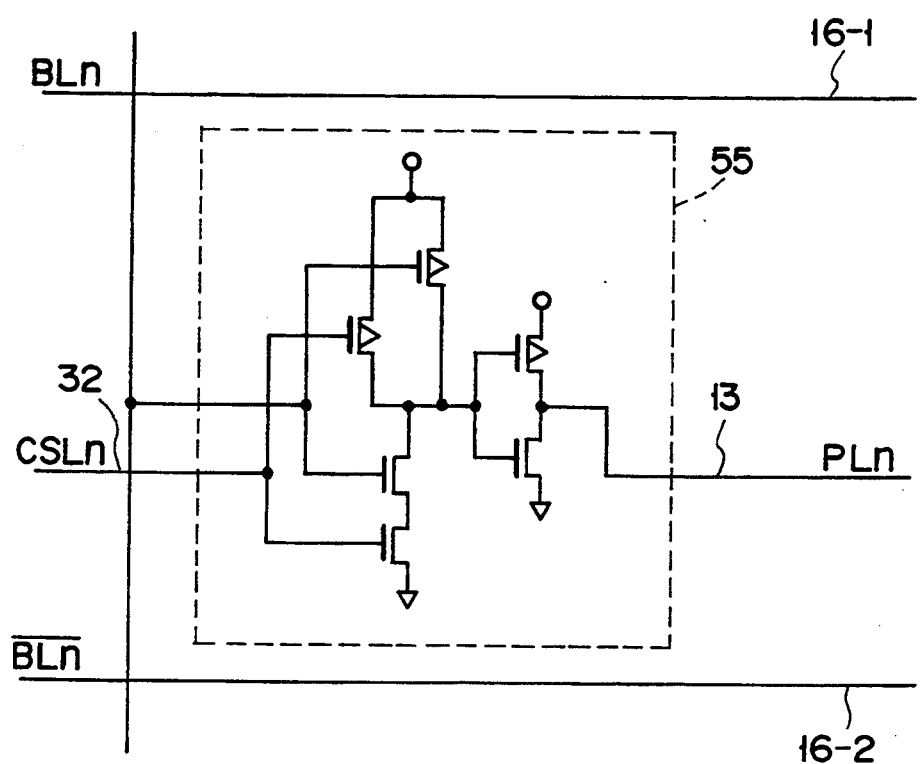
F I G. 58

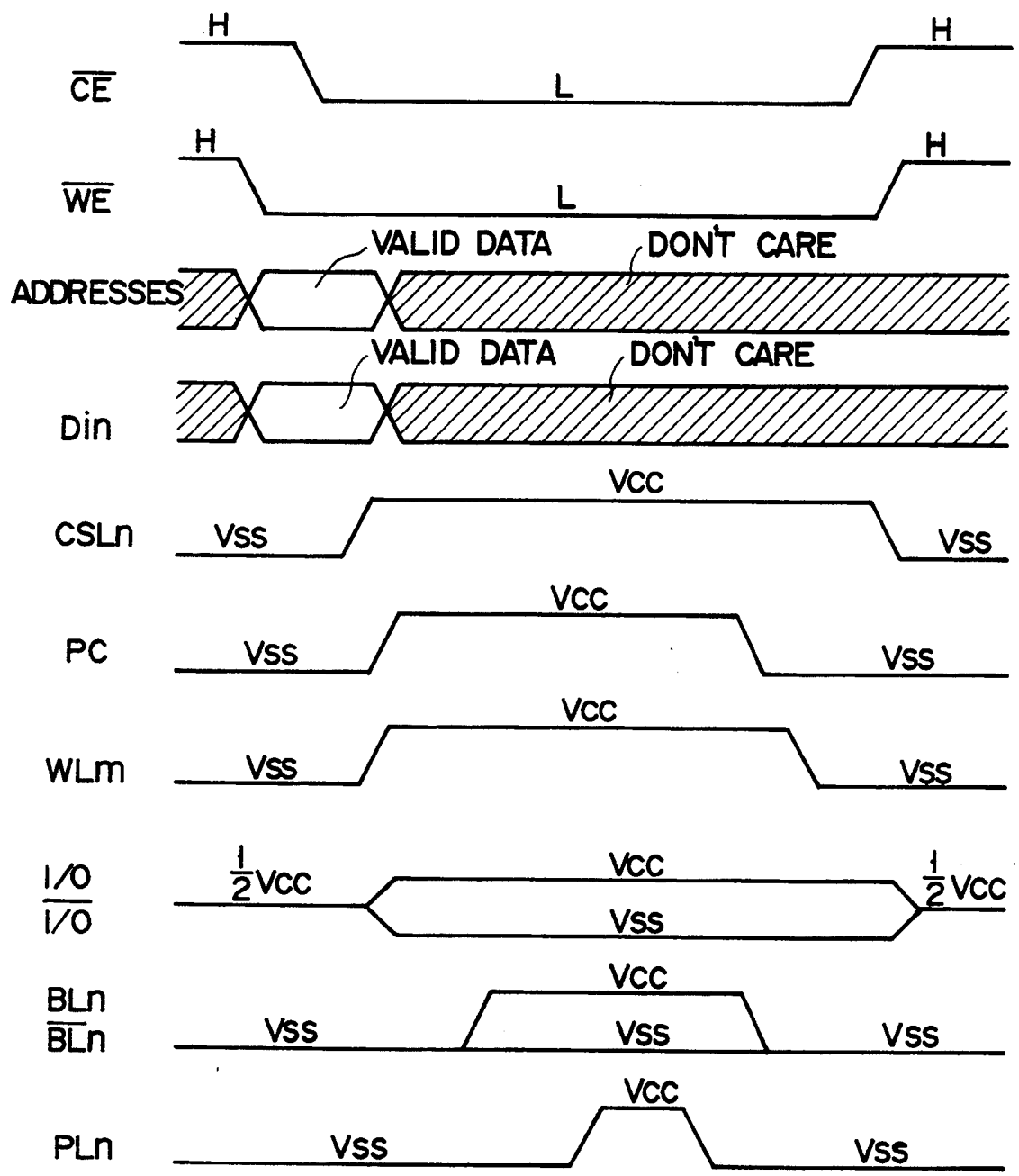
F I G. 59

SEMICONDUCTOR MEMORY DEVICE USING FERROELECTRIC CAPACITOR AND HAVING ONLY ONE SENSE AMPLIFIER SELECTED

BACKGROUND OF THE INVENTION

1. Field of the Invention

The present invention relates to a nonvolatile semiconductor memory device and a method of read- and write-accessing and operating the same.

2. Description of the Related Art

With an increase in capacity and packing density of a semiconductor memory device such as a dynamic random access memory (DRAM), a ratio of an area occupied by a capacitor to the remaining area in a memory cell is increased. For this reason, for example, in a 4-Mbit DRAM, a capacitor having a three-dimensional structure, such as a stacked capacitor or a trench capacitor, is used as a capacitor in a memory cell. Since a further increase in packing density of a memory device is expected, the structure of a memory cell will be increasingly complicated.

Under these circumstances, the use of ferroelectric materials having large dielectric constants, in place of conventional dielectric materials such as silicon oxides and nitrides, has been considered to simplify the structure of a capacitor. For example, lead zirconate titanate (PZT), a typical ferroelectric material, has a dielectric constant of 1,000 or more. Theoretically, therefore, a capacitor consisting of such a material can store a large amount of charge with a small area even if it has a planar structure. For this reason, it is expected that a semiconductor memory device obtained by using a ferroelectric material as a capacitor material allows a high packing density with a simple structure. A ferroelectric capacitor having a planar structure can be formed by a relatively simple process, i.e., sandwiching the upper and lower surfaces of a ferroelectric film deposited by sputtering or CVD between electrodes consisting of polysilicon or a metal.

In addition, manufacturing of a nonvolatile RAM by using ferroelectric capacitors is disclosed in, e.g., Published Unexamined Japanese Patent Application No. 63-201998. This memory is based on the fact that a relationship between the dielectric field and polarization of a ferroelectric material is represented by hysteresis characteristics. In a ferroelectric capacitor, even if an applied voltage becomes zero, a remanent polarization corresponding to the direction of the applied voltage is retained. If, therefore, the direction of remanent charge in an electrode is set to correspond to, e.g., "0" or "1", digital information can be stored in the ferroelectric capacitor.

In a ferroelectric capacitor, an applied voltage V and stored charge Q have a relationship shown in FIGS. 1A and 1B. FIG. 1A shows a Q-V curve observed at temperatures lower than the Curie temperature (ferroelectric phase). FIG. 1B shows a Q-V curve observed at temperature higher than the Curie temperature (normal dielectric phase).

FIG. 2 shows a conventional memory cell formed by combining such a ferroelectric capacitor with a MOS transistor. FIG. 3 is a partial circuit diagram showing a semiconductor memory device for writing and reading information of 1 bit in and from such a memory cell.

In the memory cell shown in FIG. 2, a word line (WL) 104 is connected to the gate electrode of a MOS transistor 117, the source and drain of the MOS transistor 117 are respectively connected to a bit line (BL) 116 and one electrode of a ferroelectric capacitor 118, and the other electrode of the ferroelectric capacitor 118 is connected to a plate line (PL) 113. The plate line 113 and the word line 104 are formed to be parallel with each other. Furthermore, in the semiconductor memory device shown in FIG. 3, two bit lines (BL) 116-1 and ($\overline{BL}$) 116-2 connected to one sense amplifier (S/A) 120 constitute a bit line pair and are formed on both sides of the sense amplifier 120.

The structure shown in FIG. 3 is considered as one column. A plurality of columns, each having the same structure as that shown in FIG. 3, are arranged in the Y direction (parallel to the length of the paper) to constitute a memory cell (rows are arranged along the X direction parallel to the width of the paper) array. FIG. 4 is a circuit diagram of the memory cell array. A word line 104 is connected to the gate electrodes of MOS transistors 117 of a plurality of memory cells arranged in the same row, which are arranged in the Y direction (the X direction is perpendicular to the Y direction). The word line 104 is also connected to a word line decoder 119. The plate line 113 is connected to the electrodes of ferroelectric capacitors 118 of the memory cells in the same row and is also connected to a plate line decoder 128.

In a read or write cycle in such a memory cell array, the word line 104 and plate line 113 of the same row are respectively selected by the word line decoder 119 and the plate line decoder 128. If, for example, a word line WL2 is selected, a plate line PL2 of the same row is selected in the corresponding cycle.

That is, when the single word line WL2 and the corresponding plate line PL2 are selected, the memory cells, of all the columns, connected to these lines are simultaneously selected. The pieces of digital information of these memory cells are extracted through the bit lines 116-1 or 116-2. In the semiconductor memory device, once information is read out, the information stored in a corresponding memory cell is erased. If, therefore, information in a memory cell is to be retained after a read operation, information identical to the read-out digital information must be written in the memory cell again. That is, a rewrite operation must be performed.

For this reason, a flip-flop type amplifier is normally used as a sense amplifier. FIG. 5 shows a typical sense amplifier constituted by complementary MOS transistors. A sense amplifier 120 of this type is activated in accordance with a sense amplifier activating signal input through a sense amplifier activating line (ACT) 149-1 or ($\overline{ACT}$) 149-2 so as to amplify a small potential difference between the bit lines 116-1 and 116-2. With this operation, the potentials of the bit lines are determined such that one potential of power source voltages of the sense amplifier, e.g., $V_{SS}$ and $V_{CC}$, is transferred to one bit line; and the other potential, to the other bit line.

In the semiconductor memory device having the conventional structure shown in FIG. 4, once a word line and a plate line are selected, the pieces of digital information of all the memory cells connected to these lines are extracted through bit lines, and all the sense amplifiers are activated. Once a sense amplifier is selected, the potentials of a corresponding bit line pair are changed. After one cycle is completed, the bit lines must be precharged within a preparation period before an access operation. For this reason, in the semiconductor memory device having the conventional structure shown in FIG. 4, the power consumed to activate the sense amplifiers and charge/discharge the bit lines is inevitably increased. In addition, with regard to a precharge operation of bit lines, since the charge quantity required to charge/discharge operations is increased with an increase in the number of bits, the time required to charge/discharge the bit lines is inevitably prolonged.

The above-described arrangement and operation are similar to those of a dynamic random access memory (DRAM). In a DRAM, when a word line is selected by a row address, the pieces of information stored in all the memory cells connected to the word line are respectively extracted through bit lines connected to the respective memory cells. For this reason, all the sense amplifiers connected to the bit lines through which the pieces of information are extracted from the memory cells are activated regardless of whether they are selected by column addresses. With this operation, sensing operations of the bit lines are performed. As a result, a rewrite operation of the stored information in the memory cells is performed. Such a rewrite operation is performed because a DRAM is constituted by destructive read type memory cells unlike an DRAM.

Three problems, i.e., a decrease in operation speed, an increase in power consumption, and generation of noise due to a charge/discharge operation of charge in/from all the bit lines, will be described below with reference to a DRAM.

For example, a 1-Mbit DRAM having a cycle time of 200 ns and an average current of 60 mA in an active period will be considered. In this 1-Mbit DRAM, the capacitance c of one bit line is about 0.6 pF. As described above, in the DRAM, 2048 bit lines are charged/discharged by a voltage V with an amplitude of 5 V in one access operation. In this case, a required charge quantity Q is given by $$\begin{aligned} Q &= nCV \\ &= 2048 \text{ (lines)} \times 0.6 \text{ (pF)} \times 5 \text{ (V)} \\ &= 6.1 \text{ (nC)} \end{aligned}$$

If the resultant value is divided by a cycle T time of 200 nS, an average current I is provided:

$$\begin{aligned} I &= Q/T \\ &= 6.1 \text{ (nC)}/200 \text{ (ns)} \\ &= 31 \text{ (mA)} \end{aligned}$$

This indicates that about 50% of the average current in an active period is used for a bit line charge/discharge operation. Of the average current in an active period, the proportion of a bit line charge/discharge current tends to be increased as the capacity of the DRAM is increased, e.g., from 1 Mbit to 4 and 16 Mbits.

In the 1-Mbit DRAM, the total capacitance of the bit lines which must be charged/discharged in each access operation is 0.6 (pF) ×2,048 (lines) =1.2 (nF), and a large current peak appears when a charge/discharge operation of the capacitance is performed at once. That is, a current of 60 mA in an active period does not flow constantly but substantially concentrates in a period in which a bit line charge/discharge operation is performed. An abrupt change dI/dt of this current causes variations in power source voltages, e.g., $V_{CC}$ and $V_{SS}$, together with inductances inside/outside a chip. Power source noise generated in this manner leads to erroneous operations of circuits in the chip or to cause the ground level of logic "0" of output information to float, thus causing undesired operations.

In order to perform a rewrite or precharge operation with respect to all the bit lines in every access operation, a large capacitance of 1.2 (nF) must be charged/discharged. The time required for such a charge/discharge operation is determined by this capacitance, the wiring resistances of aluminum wires, and the ON resistances of transistors. In a 1-Mbit DRAM, for example, of a cycle time of 200 ns, about 100 ns, i.e., about 50% of the cycle time, is consumed for a bit line charge/discharge operation.

In the conventional semiconductor memory device shown in FIG. 4, since all the bit lines are charged/discharged in an access operation, the problems of a decrease in operation speed, an increase in power consumption, and generation of noise are posed, similar to the above-described DRAM. In the semiconductor device shown in FIG. 4, when a given plate line is selected, and its potential is changed, a corresponding word line is always selected. Assume that the level of a plate line is changed from L level to H level. In this case, as the charges stored in ferroelectric capacitors in the row direction are discharged to the bit lines, the ferroelectric capacitors act as loads for the plate line. That is, the capacitance of all the ferroelectric capacitors connected to the plate line acts as a load for the plate line decoder. This capacitance is large in comparison with the gate capacitance of a MOS transistor acting as a main load for a word line. For this reason, the plate line decoder requires a driving capacity larger than that of the word line decoder. Otherwise, it takes much time to charge a plate line capacitance, and the time required for an access operation is further prolonged.

In addition, as described above, in the conventional semiconductor memory device shown in FIG. 4, when one memory cell is to be accessed, all the memory cells of the same row are simultaneously accessed. The charges of the memory cells are then extracted to bit lines, and a rewrite operation must be performed. In a ferroelectric capacitor, that information is read out and written means that polarization reversal occurs at a 50% probability. That is, one of the stored information of "1" and "0" undergoes polarization reversal in an access operation. In a ferroelectric capacitor, it is known that as polarization reversal is repeated, the remnant polarization, i.e., the amount of charge stored in the electrode in a nonvolatile manner, is reduced. For example, in a semiconductor memory device having 1,024 memory cells connected to one word line, every time one memory cell is read-accessed, each of the remaining 1,023 memory cells is set in a state wherein the polarization of a corresponding ferroelectric capacitor can be reversed and is reversed at a 50% probability. In the worst case, the polarizations of all the 1,023 ferroelectric capacitors are reversed. As described above, in a semiconductor memory device constituted by such conventional ferroelectric capacitors, there is a possibility that the polarizations of the ferroelectric capacitors of all the memory cells in the same row are reversed. This accelerates a deterioration in dielectric characteristics of each ferroelectric capacitor and shortens the service life of the semiconductor memory device.

In the semiconductor memory device using the ferroelectric capacitors shown in FIG. 4, a memory cell can be constituted by one MOS transistor and one ferroelectric capacitor. Such a structure, therefore, is suitable for a large-capacity semiconductor memory device. In addition, the method of operating the memory device using the ferroelectric capacitors is similar to that of a DRAM in many respects, e.g., rewriting information in the ferroelectric capacitor of a memory cell by amplifying the potential of a corresponding bit line by using a flip-flop type sense amplifier. Therefore, many of the circuit techniques for DRAMs can be directly applied to the semiconductor memory device using the ferroelectric capacitors. In addition, this semiconductor memory device is superior to a DRAM in that it theoretically requires no refresh operation and is nonvolatile.

In the semiconductor memory device using such ferroelectric capacitors, however, a problem associated with refresh characteristics (to be described in detail below) is posed, even though no refresh operation is theoretically required as described above. In practice, therefore, refresh operations are required, although its frequency is not so high as that in a DRAM.

In DRAMs, a problem is posed in terms of leakage currents which lead to a decrease in charge stored in the capacitor of each memory cell over time. Such leakage currents include, e.g., a p-n Junction leakage current flowing between a storage node and a semiconductor substrate, a sub-threshold current from an access transistor, a leakage current from a parasitic field transistor, and a leakage current from a capacitor dielectric film. Of these leakage currents, the problem is mainly associated with the p-n Junction leakage current. Such leakage occurs when carriers such as electrons and holes are thermally generated in a depletion layer of a p-n junction between the source of drain of a MOS transistor and a semiconductor substrate, and the carriers are moved upon application of an electric field to the depletion layer. In a DRAM, different potentials, e.g., 5 V and 0 V are applied to a storage node depending on whether charge is stored in the capacitor of a memory cell. In a DRAM, since such a potential is reduced to a thermal equilibrium state due to leakage currents over time, a refresh operation is required.

In contrast to this, in the semiconductor memory device using the ferroelectric capacitors, if the two ends of a ferroelectric capacitor can be maintained at the same potential, the information stored in the memory cell is retained, and no refresh operation is required. If, however, similar to a DRAM, a bias potential is applied to a semiconductor substrate in order to reduce the capacitance of each bit line, and a reverse bias is applied to a depletion layer between the source of drain of a transistor and the semiconductor substrate, the potential of the storage node of a corresponding memory cell approaches the substrate potential over time, resulting in a potential difference between the two ends of a corresponding ferroelectric capacitor. This is because electrons and holes thermally generated in the depletion layer receive an electrostatic force due to an electric field in the depletion layer and are attracted to the source or drain of the transistor and the substrate. In the semiconductor memory device using such ferroelectric capacitors, therefore, refresh operations are required, although its frequency is not so high as that in a DRAM.

Similar to a DRAM, in such a semiconductor memory device, the problem of erroneous operations based on soft errors is posed. A soft error means that the contents stored in a memory cell are volatiled by a particles emitted from radioactive elements, such as uranium and thorium, contained in a package in a small amount. An a particle enters the semiconductor substrate by a distance of about several tens micrometers, and an electron-hole pair of about 200 fC are generated along the path of the $\alpha$ particle. When the charge generated in this manner flows into the storage node of a memory cell or a bit line upon diffusion and movement, the stored information is volatiled. As described above, a soft error volatiles the information stored in a memory cell to cause an erroneous operation. As a result, reliability of the semiconductor memory device is greatly deteriorated. In a conventional DRAM, however, there is no method of completely eliminating such soft errors. Furthermore, in the semiconductor memory device using the ferroelectric capacitors, no method has been developed, which can eliminate soft errors.

As described above, in the semiconductor memory device using the ferroelectric capacitors, there are various problems, e.g., a decrease in operation speed, an increase in power consumption, generation of noise, and shortening of a service life. Therefore, such a memory device has not yet been put into practical use.

In the semiconductor memory device using the ferroelectric capacitors, similar to a DRAM, refresh operations are required, and erroneous operations are caused by soft errors. In addition, such a semiconductor memory device, the refresh characteristics and reliability tend to be deteriorated with a decrease in amount of charge stored in each ferroelectric capacitor. That is, the above-described problems become more serious as the capacitance of each ferroelectric capacitor is decreased. Therefore, such problems interfere with an increase in packing density of a semiconductor memory device.

SUMMARY OF THE INVENTION

It is the first object of the present invention to provide a semiconductor device in which a cycle time required for an access operation is short.

It is the second object of the present invention to provide a semiconductor device in which the amount of power consumed for an access operation is small.

It is the third object of the present invention to provide a semiconductor device in which only small noise is generated in an access operation.

It is the fourth object of the present invention to provide a semiconductor device which has a long service life.

It is the fifth object of the present invention to provide an improved method of reading information from the semiconductor device.

It is the sixth object of the present invention to provide an improved method of writing information in the semiconductor device.

It is the seventh object of the present invention to provide a method of operating a semiconductor device with excellent refresh characteristics.

It is the eighth object of the present invention to provide a method of operating a semiconductor device with a small probability of erroneous operations.

It is the ninth object of the present invention to provide a method of operating a semiconductor device with a small power consumption.

It is the tenth object of the present invention to provide a method of operating a semiconductor device with high reliability.

In order to achieve the first to fourth objects, according to the present invention, there is provided a semiconductor memory device comprising a memory cell group constituted by a plurality of memory cells arranged in the form of a matrix to constitute rows and columns, a plurality of first and second driving lines, connected to the memory cells, for transmitting driving signals to be input to the memory cells, a plurality of read/write lines, connected to the memory cells, for performing read/write operations with respect to the memory cells, and a plurality of sense amplifiers connected to the read/write lines, memory cells in the same column being connected to the same sense amplifier through the read/write lines, wherein the plurality of first driving lines and the plurality of second driving lines are respectively selected by row and column addresses. In addition, the semiconductor memory device of the present invention is characterized in that each memory cell is constituted by one MOS transistor and one ferroelectric capacitor, the first driving line, the second driving line, and the read/write line are respectively a word line, a plate line, and a bit line, the gate electrode of the MOS transistor is connected to the word line, the source and drain of the MOS transistor are respectively connected to the bit line and one of the electrodes of the ferroelectric capacitor, and the other electrode of the ferroelectric capacitor is connected to the plate line.

Furthermore, the semiconductor memory device of the present invention is characterized in that the first and second driving lines connected to one of the memory cells are respectively selected by different addresses, and one of the sense amplifiers is selected by a column address.

In order to achieve the fifth object, according to the present invention, there is provided a method of performing a read operation with respect to the semiconductor memory device according to the present invention, comprising the first step of selecting a word line and a plate line by using row and column addresses, activating the selected word and plate lines to input driving signals to a memory cell connected to the word and plate lines so as to drive the memory cell, and extracting a signal, generated in accordance with information stored in the memory cell, to a bit line connected to the memory cell, the second step of selecting a sense amplifier connected to the bit line by using a column address after the first step, and activating the sense amplifier to cause the sense amplifier to amplify the signal extracted to the bit line, and the third step of outputting the amplified signal after the second step, detecting an amount of the output signal, and reading out the information stored in the memory cell.

In order to achieve the sixth object, according to the present invention, there is provided a method of performing a write operation with respect to a semiconductor memory device, comprising the first step of inputting a signal corresponding to write information to a bit line connected to a predetermined memory cell, and the second step of selecting word and plate lines connected to the memory cell by using row and column addresses after the first step, activating the word and plate lines to input driving signals to the memory cell so as to drive the memory cell, and writing the signal input to the bit line in the memory cell.

with the above-described arrangement, in the semiconductor memory device of the present invention, in an access operation, one first driving line and one second driving line are respectively selected by row and column addresses. Therefore, only a memory cell selected by the product of the row and column addresses is driven, and information is extracted to only the read/write line connected to the memory cell. In a read operation, therefore, if a sense amplifier connected to the read/write line is selected by a column address and the only the selected sense amplifier is activated, no information is extracted to the read/write lines connected to non-selected memory cells, and the information in only the selected memory cell can be read out. Similarly, in a write operation, since no information is extracted to the read/write lines connected to non-selected memory cells, information can be written in only the selected memory cell without activating the sense amplifiers connected to the read/write lines connected to the non-selected memory cells.

In order to achieve the seventh to tenth objects, according to the present invention, there is provided a method of operating a semiconductor memory device in which memory cells, each constituted of a ferroelectric capacitor and a switching transistor formed on a semiconductor substrate, are arranged in the form of a matrix, one electrode of each of the ferroelectric capacitors is connected to a bit line through a corresponding one of a source and drain of the switching transistors, the other electrode of the ferroelectric capacitor is connected to a plate line, and a gate electrode of the switching transistor is connected to a word line, the method of operating the semiconductor memory device comprising the steps of transmitting a driving signal through the word line to turn on the switching transistor, transmitting a driving signal through the plate line to access the memory cell, and subsequently disabling the driving signal transmitted through the word line while potentials of the bit and plate lines are set to be equal to a substrate potential of a semiconductor substrate, thereby turning off the switching transistor.

The method of operating the semiconductor memory device according to the present invention is characterized in that when a driving signal transmitted through a word line is disabled to turn off the switching transistor of a memory cell after the memory cell is accessed, the potentials of corresponding bit and plate lines are set to be equal to the substrate potential of the semiconductor substrate.

In addition, in the method of operating the semiconductor memory device, the precharge potential of a bit line is set to be equal to that of the semiconductor substrate.

The substrate potential is preferably set to be $V_{SS}$ or $V_{CC}$, i.e., 0 V or 5 V by a power source voltage generating means for applying a power source voltage to a bit line, a plate line, and the like from the outside of the semiconductor element. In addition, when a bit line is to be precharged, if a voltage is applied from the power source voltage generating means to a precharge circuit for the bit line, the precharge potential of the bit line can be set to be equal to the substrate potential of the semiconductor substrate.

During a period other than an access period, even after the switching transistor of a memory cell is turned off, the potential of a corresponding plate line is preferably maintained at the substrate potential of the semiconductor substrate in order to prevent the information stored in the memory cell from being erased upon reversal of the charge stored in the ferroelectric capacitor of the memory cell.

In the present invention, when a driving signal transmitted through a word line is disabled to turn off the switching transistor, e.g., a MOS transistor, of a memory cell after the memory cell is accessed, the potentials of corresponding bit and plate lines are set to be equal to the substrate potential of the semiconductor substrate. Therefore, while the information stored in the memory cell is retained, the potential of a storage node between the ferroelectric capacitor and the switching transistor is kept equal to the substrate potential of the semiconductor substrate. That is, since no electric field is applied to a depletion layer in the p-n junction between the storage node and the semiconductor substrate, the generation of a p-n junction leakage current, which is the main cause of a deterioration in refresh characteristics of the semiconductor memory device, is suppressed. In the semiconductor memory device of the present invention, if the switching transistor of a memory cell is a CMOS transistor, in order to suppress the generation of a p-n junction leakage current in this manner, the potentials of the bit and plate lines must be set to be equal to the potential of a well in the semiconductor substrate. In the present invention, the substrate potential includes the potential of a well in such a case.

In addition, according to the present invention, soft errors can be suppressed to greatly reduce the possibility of an erroneous operation in the semiconductor memory device. More specifically, a soft error is caused when charge generated in the semiconductor substrate upon entrance of α particles flows into a storage node or a bit line. In the present invention, since the storage node and the semiconductor substrate are held at the same potential, the number of charge carriers flowing in the storage node is decreased to suppress the occurrence of soft errors. Furthermore, in the present invention, since the precharge potential of a bit line is set to be equal to the substrate potential of the semiconductor substrate so as to reduce the number of charge carriers flowing in the bit line, the occurrence of soft errors is further suppressed. It is apparent that in a case wherein the switching transistor of a memory cell is a CMOS transistor, the substrate potential includes the potential of a well. In addition, this equally applies to the following description.

In the present invention, if a substrate potential is applied to the semiconductor substrate by using a power source voltage generating means for applying a power source voltage from the outside of the semiconductor element, variations in substrate potential are suppressed in an operation of the semiconductor memory device.

In the semiconductor memory device having the above-described memory cell, similar to a DRAM, variations in substrate potential always occur when bit lines and peripheral circuits are charged and discharged, and especially the influences of a charge/discharge operation of bit lines cannot be neglected. This is because, in such a semiconductor memory device, a coupling capacitance in the p-n junction between a source or drain connected to a bit line and the semiconductor substrate is inevitably increased to a certain extent.

For this reason, in the semiconductor memory device, in order to keep the substrate potential constant, a predetermined potential is always applied to the semiconductor substrate. For example, in a conventional DRAM, a combination of a ring transmitter, a diode, a capacitor, and the like is used as a substrate voltage generator to constitute a charge pump in a semiconductor element. However, since the substrate voltage generator serves as a high-impedance power source, it has poor response characteristics with respect to variations in substrate voltage. For this reason, it is difficult to keep the substrate voltage constant.

In contrast to this, the above-mentioned power source voltage generating means for applying a power source voltage from the outside of the semiconductor element has good response characteristics with respect to variations in substrate potentials because the impedance of a voltage source is low. For this reason, the above-mentioned variations in substrate potential can be suppressed. In the present invention, therefore, by using the power source voltage generating means as a substrate voltage generator, variations in substrate potentials can be reduced, and the generation of leakage currents, e.g., a p-n junction leakage currents between a storage node and the semiconductor substrate can be further suppressed. This more effectively improves the refresh characteristics and prevents an erroneous operation due to soft errors.

Furthermore, in the semiconductor memory device according to the present invention, word lines and plate lines are formed to cross each other at right angles so that when a memory cell is to be accessed, word and plate lines for transmitting driving signals can be selected by different addresses, thus greatly reducing the probability of a soft error in an operation of the semiconductor memory device. The reason for this will be described in detail below.

In the semiconductor memory device of the present invention, when a memory cell is to be accessed, one word line WL and one plate line PL are selected by different addresses, i.e., row and column addresses. Thereafter, the only memory cell connected to the selected word and plate lines WL and PL is driven to extract information to only a bit line BL or $\overline{BL}$ connected to the memory cell. In a read operation, therefore, it is only required that the precharge state of only a bit line pair to which information is extracted be canceled.

In contrast to this, in the semiconductor memory device having the memory cell array shown in FIG. 4, a memory cell 111 is accessed by selecting a word line 104 and a plate line 113 by using the same address, i.e., a row address. Therefore, in the selected row, since information are extracted from all the memory cells 111 in all the columns to bit lines 116-1 or 116-2, all the pieces of extracted information extracted to the bit lines 116-1 or 116-2 must be rewritten in these memory cells 111. That is, in a read operation, before one word line 104 and one plate line 113 are selected, the precharge states of all the bit line pairs must be canceled. In addition, after one word line 104 and one plate line 113 are selected to drive the corresponding memory cell 111, sense amplifiers 120 in all the columns must be activated to perform a rewrite operation.

Soft errors are caused when charge generated upon entrance of α particles into the semiconductor substrate flows into a storage node or a bit line. Of these errors, a soft error caused when charge flows into a bit line occurs in a time interval between the instant at which the bit line is shifted from a precharge state to a flowing state and the instant at which a corresponding sense amplifier is activated.

In the semiconductor memory device having the memory cell array shown in FIG. 4 in which the precharge states of the bit line pairs in all the columns are canceled when a read operation is to be performed, soft errors may occur in all the columns.

In contrast to this, in the semiconductor memory device of the present invention, since the word and plate lines are selected by different addresses as described above, only a target memory cell can be driven. Therefore, cancellation of a precharge state is required for only a bit line pair in the same column of a target memory cell with this operation, in the semiconductor memory device, the probability of a soft error can be greatly reduced.

Furthermore, in the present invention, when a memory cell is to be accessed, by selecting word and plate lines using different addresses, information can be extracted only from a memory cell connected to the selected word and plate lines to a corresponding bit line, and a rewrite operation is subsequently performed. That is, according to such an operating method, when a memory cell is to be accessed, the bit line pairs in all the columns need not be charged/discharged, unlike the semiconductor memory device having the memory cell array shown in FIG. 4. Therefore, variations in substrate potential caused upon charging/discharging of each bit line pair are suppressed, and the reliability of the semiconductor memory device can be greatly improved.

Moreover, in the semiconductor memory device of the present invention, if the switching transistor of a memory cell is a CMOS transistor, a peripheral circuit is formed in a well different from a well in which the memory cell is formed, and an electric field of a reverse bias is applied between the well in which such a peripheral circuit is formed and a diffusion layer so as to reduce the parasitic capacitance in the peripheral circuit, thus realizing a high-speed operation.

According to the present invention, on the basis of an improvement in reliability, a ferroelectric capacitor having a smaller capacity than a ferroelectric capacitor which has been used can be used for a memory cell. In addition, if a switching transistor is a MOS transistor, the thickness of a depletion layer can be decreased, and a short channel can be realized. This allows a reduction in size of a switching transistor. Therefore, the packing density of the semiconductor memory device can be further increased, and various advantages can be provided in terms of industrial applications.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A and 1B are graphs showing a relationship between a voltage applied to a ferroelectric capacitor and the amount of charge stored therein;

FIGS. 10A to 10I are plan views showing a process of forming a memory cell array according to the present invention;

FIGS. 11A to 11J are longitudinal sectional views showing the process of forming the memory cell array according to the present invention;

FIGS. 12A to 12G are plan views showing another process of forming a memory cell array according to the present invention;

FIG. 17 is a circuit diagram showing an arrangement of a dummy cell used in the present invention;

FIG. 22 is a circuit diagram showing an arrangement of a sense amplifier used in the present invention;

FIG. 28 is a timing chart showing the timing of each operation when information is written in the semiconductor memory device in FIG. 18;

FIG. 31 is a timing chart showing the timing of each operation when a read operation is performed while the potential of a bit line is set at $V_{CC}$ in a precharge state;

FIG. 32 is a block diagram showing a semiconductor memory device according to another embodiment of the present invention;

FIG. 33 is a circuit diagram showing an arrangement of a differential amplifier used in the present invention;

FIG. 34 is a timing chart showing the timing of each operation when information is read out from the semiconductor memory device in FIG. 32;

FIG. 39 is a circuit diagram showing an arrangement of an I/O connecting circuit used in the semiconductor memory device in FIG. 36;

FIG. 40 is a circuit diagram showing the arrangement of the I/O connecting circuit in FIG. 39 in more detail;

FIG. 41 is a circuit diagram showing an arrangement of a precharge circuit used in the semiconductor memory device in FIG. 36;

FIG. 42 is a circuit diagram showing the arrangement of the precharge circuit in FIG. 41 in more detail;

FIG. 43 is a circuit diagram showing an arrangement of an equalizing circuit used in the semiconductor memory device in FIG. 36;

FIG. 44 is a circuit diagram showing the arrangement of the equalizing circuit in FIG. 43 in more detail;

FIG. 45 is a circuit diagram showing an arrangement of a precharge circuit and an equalizing circuit which share a precharge circuit driving line;

FIG. 46 is a circuit diagram showing an arrangement of a precharge circuit and an equalizing circuit which share a NAND circuit;

FIG. 48 is a timing chart showing the timing of each 65 operation when information is written in a semiconductor memory device having the memory cell shown in FIG. 6 by performing multiple selection of word lines;

FIG. 51 is a circuit diagram showing a memory cell array according to the present invention;

FIG. 56 is a circuit diagram showing an arrangement of a precharge circuit used in the present invention;

FIGS. 57 and 58 are circuit diagrams showing arrangements of equalizing circuit and a plate line driver, respectively;

FIG. 59 is a timing chart showing the timing of each operation in a write mode according to the present invention.

DETAILED DESCRIPTION OF THE PREFERRED EMBODIMENTS

Figure 6:
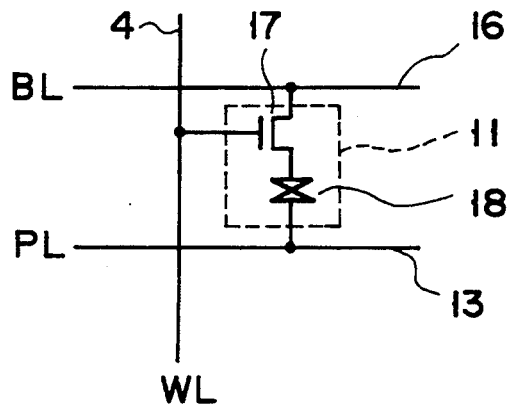
FIG. 6 is a circuit diagram showing an arrangement of a memory cell according to the present invention.
Figure 7:
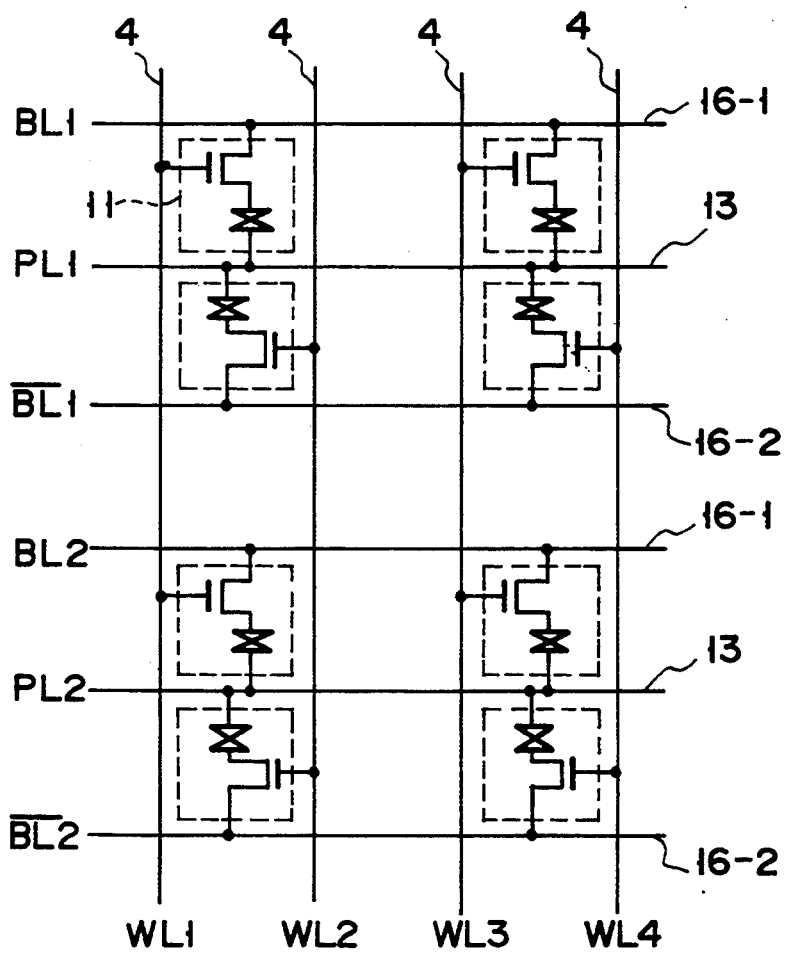
FIG. 7 is a circuit diagram showing a memory array according to the present invention.

Embodiments of the present invention will be described in detail below. In the drawings, a reference number/letter with $\phi$ as a prefix indicates a signal whereas a reference number/letter without a $\phi$ as a prefix indicates either a line or the signal thereon. Referring now to the drawings, wherein like reference numerals designate identical or corresponding parts throughout the several views, and more particularly to FIG. 6 thereof, there is illustrated a circuit diagram showing an arrangement of a memory cell in a semiconductor memory device according to the present invention. FIG. 7 shows a circuit arrangement of a memory cell array constituted by memory cells arranged in the form of a matrix. As shown in FIG. 6, a memory cell 11 according to the present invention is constituted by one MOS transistor 17 and one ferroelectric capacitor 18. The gate electrode of the MOS transistor 17 is connected to a first driving line, i.e., a word line (WL) 4. In addition, one of the source and drain of the MOS transistor 17 is connected to a read/write line, i.e., a bit line (BL) 16, and the other is connected to one electrode of the ferroelectric capacitor 18. The other electrode of the ferroelectric capacitor 18 is connected to a second driving line, i.e., a plate line (PL) 13.

Memory cells, each having the above-described arrangement, are arranged in the form of a matrix shown in FIG. 7, so that the word lines 4 cross bit lines (BL, $\overline{BL}$) 16-1 and 16-2 at right angles, and the plate lines 13 are parallel with the bit lines 16-1 and 16-2. That is, in the arrangement shown in FIG. 7, the word lines 4 and the plate lines 13 are formed to cross each other at right angles. At the intersection of each word line 4 and a corresponding plate line 13, one memory cell 11 is formed to be connected to the corresponding word and plate lines 4 and 13.

Referring to FIG. 7, each bit line 16-1 and a corresponding bit line 16-2 constitute a bit line pair, which are formed on both sides of the plate line 13. The memory cell 11 is connected to one bit line of the bit line pair. That is, the memory cells 11 connected to the bit lines 16-1 and the bit lines 16-2 are equal in number. If, therefore, the memory cells 11 connected to the bit lines 16-1 are classified into a first memory cell group, and those connected to the bit lines 16-2 are classified into a second memory cell group, the first half of the word lines 4 is connected to the memory cells 11 included in the first memory cell group, and the second half is connected to the memory cells 11 included in the second memory cell group.

In the semiconductor memory device of the present invention, the bit lines and the plate lines are formed to be parallel with each other. In this embodiment, a plate line is shared between bit lines BL and $\overline{BL}$. Furthermore, in this embodiment, in the circuit described above, the number of memory cells connected to one of two bit lines constituting a bit line pair are set to be equal to that of memory cells connected to the other bit line. Such an arrangement is made for the following reason.

A coupling capacitance is present between the bit and plate lines which are arranged to be parallel with each other. When the potential of the plate line is changed in the read mode while the bit line is kept in a floating state, the potential of the bit line is changed due to such a coupling capacitance. In order to minimize an unbalanced change in potential between two bit lines at this time, the number of memory cells connected to one of the two bit lines is set to be equal to that of memory cells connected to the other bit line. In the present invention, however, the number of memory cells connected to one bit cell may be set to be different from that of memory cells connected to the other bit line, as needed.

In the present invention, memory cell patterns are preferably formed in such a manner that the pattern of the first memory cell group and the pattern of the second memory cell group are caused to overlap each other by performing a proper symmetrical operation or translation in the bit line direction.

Figure 8:
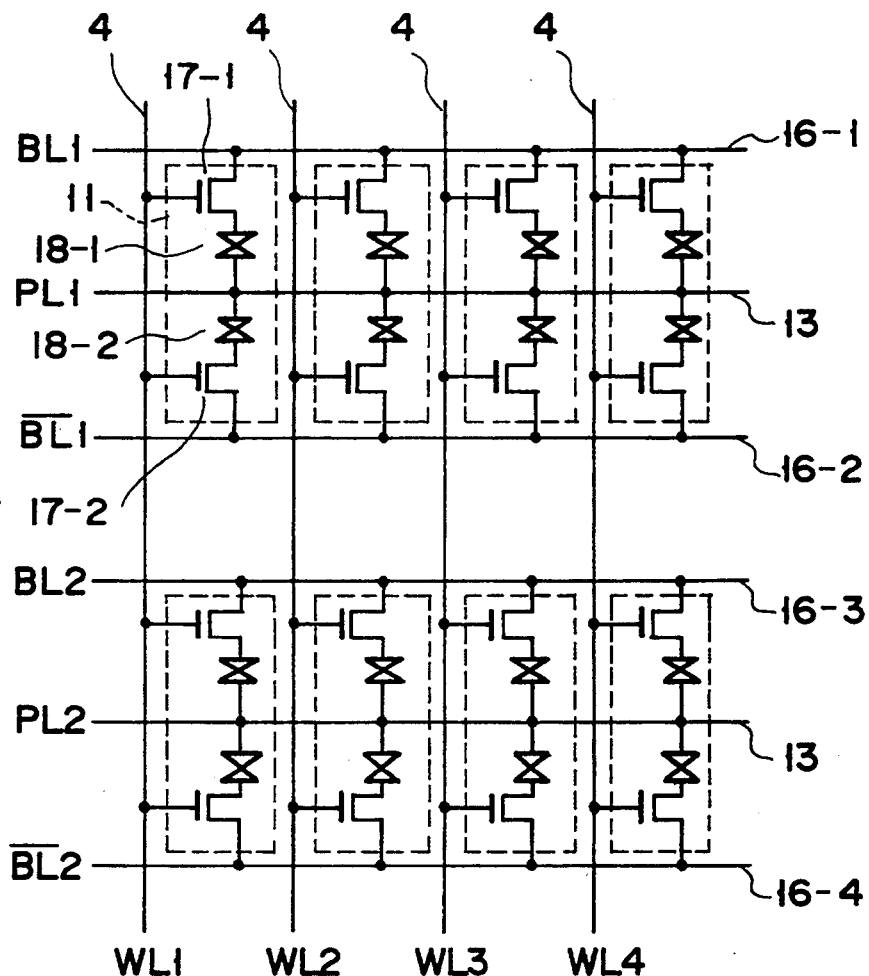
FIG. 8 is a circuit diagram showing another memory array according to the present invention.

Furthermore, in the present invention, when two bit lines constituting a bit line pair are to be formed on both sides of a plate line to be parallel with each other as described above, a memory cell array may be arranged as shown in FIG. 8. In such a memory cell array, a memory cell array 11 is constituted by two MOS transistors, i.e., first and second MOS transistors 17-1 and 17-2, and two ferroelectric capacitors, i.e., first and second ferroelectric capacitors 18-1 and 18-2. The first MOS transistor 17-1 and the second MOS transistor 17-2, and the first ferroelectric capacitor 18-1 and the second ferroelectric capacitor 18-2 are arranged to be symmetrical about a plate line 13. The source or drain of the first MOS transistor 17-1 and the source or drain of the second MOS transistor 17-2 are respectively connected to bit lines 16-1 and 16-2. With this arrangement, in a semiconductor memory device obtained by adding proper peripheral circuits to the memory cell array shown in FIG. 8, the two ferroelectric capacitors 18-1 and 18-2 in the same memory cell 11 always have polarization states complementary to each other.

Figure 9:
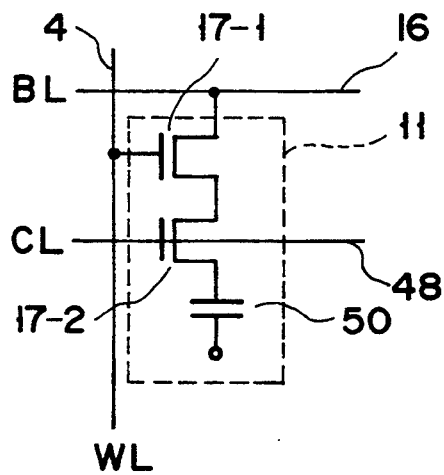
FIG. 9 is a circuit diagram showing an arrangement of another memory cell according to the present invention.

FIG. 9 shows another memory cell in the semiconductor memory device according to the present invention. A memory cell 11 shown in FIG. 9 is constituted by two MOS transistors 17-1 and 17-2 and one capacitor 50. The gate electrode of the first MOS transistor 17-1 is connected to a first driving line, i.e., a word line 4, and the gate electrode of the second MOS transistor 17-2 is connected to a second driving line, i.e., a column line (CL) 48. In addition, the source or drain of the first MOS transistor 17-1 is connected to the drain or source of the second MOS transistor 17-2. The source or drain, of the first MOS transistor 17-1, which is not connected to the drain or source of the second MOS transistor 17-2 is connected to a read/write line, i.e., a bit line 16. The drain or source, of the second MOS transistor 17-2, which is not connected to the source or drain of the first MOS transistor 17-1 is connected to a capacitor 50.

When a memory cell array according to the present invention is to be formed by using such a memory cell, memory cells, each having the above-described arrangement, may be arranged in the form of a matrix in the same manner as in the memory cell array shown in FIG. 7, so that the word lines 4 are caused to cross the bit lines 16 at right angles, and the column lines 46 are arranged to be parallel with the bit lines 16.

In this memory cell, a ferroelectric material need not be used as a capacitor material, but a normal dielectric material such as $SiO_2$ may be used. This is because in such a memory cell, similar to a DRAM, the presence and absence of charge stored in a capacitor are made to correspond to "0" and "1", respectively, thereby storing information.

In the semiconductor memory device of the present invention, however, it is preferable that the memory cell shown in FIG. 6 is constituted by a ferroelectric capacitor. This is because the memory cell shown in FIG. 6 can be constituted by one MOS transistor and one ferroelectric capacitor. With this arrangement, the memory cell can be formed with a smaller area than that of the memory cell shown in FIG. 9. Therefore, the memory cell array shown in FIG. 7 can be formed at a high packing density. This contributes to an increase in packing density of a semiconductor memory device.

A process of forming the memory cell array shown in FIG. 7 will be described below. FIGS. 10A to 10I are plan views showing the process of forming the memory cell array. FIGS. 11A to 11J are longitudinal sectional views showing the process of forming the memory cell array. Note that reference symbols (a), (b), (c), and (d) in each of FIGS. 11A to 11I respectively denote longitudinal sectional views taken along lines $X_1$-$X_1$, $X_2$-$X_2$, $Y_1$-$Y_1$, and $Y_2$-$Y_2$ in each of FIGS. 10A to 10I. FIG. 11J corresponds to FIG. 11I and shows the steps after the steps shown in FIG. 11I.

As shown in 10A and 11A, the upper surface of a p-type silicon substrate 1 is selectively processed by thermal oxidation to form a field oxide film 2 in an element isolation region.

Figure 10A:
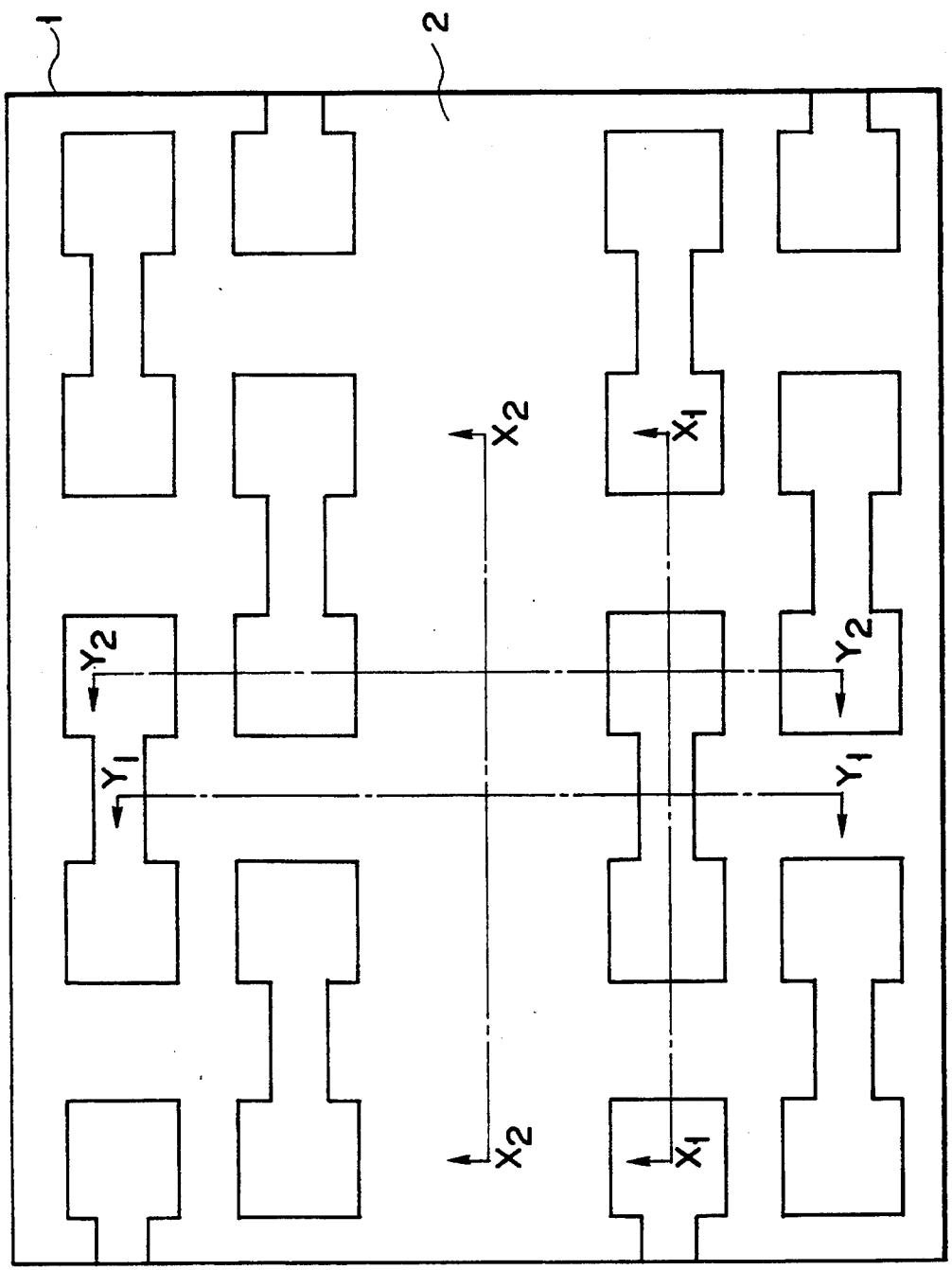
Figure 10B:
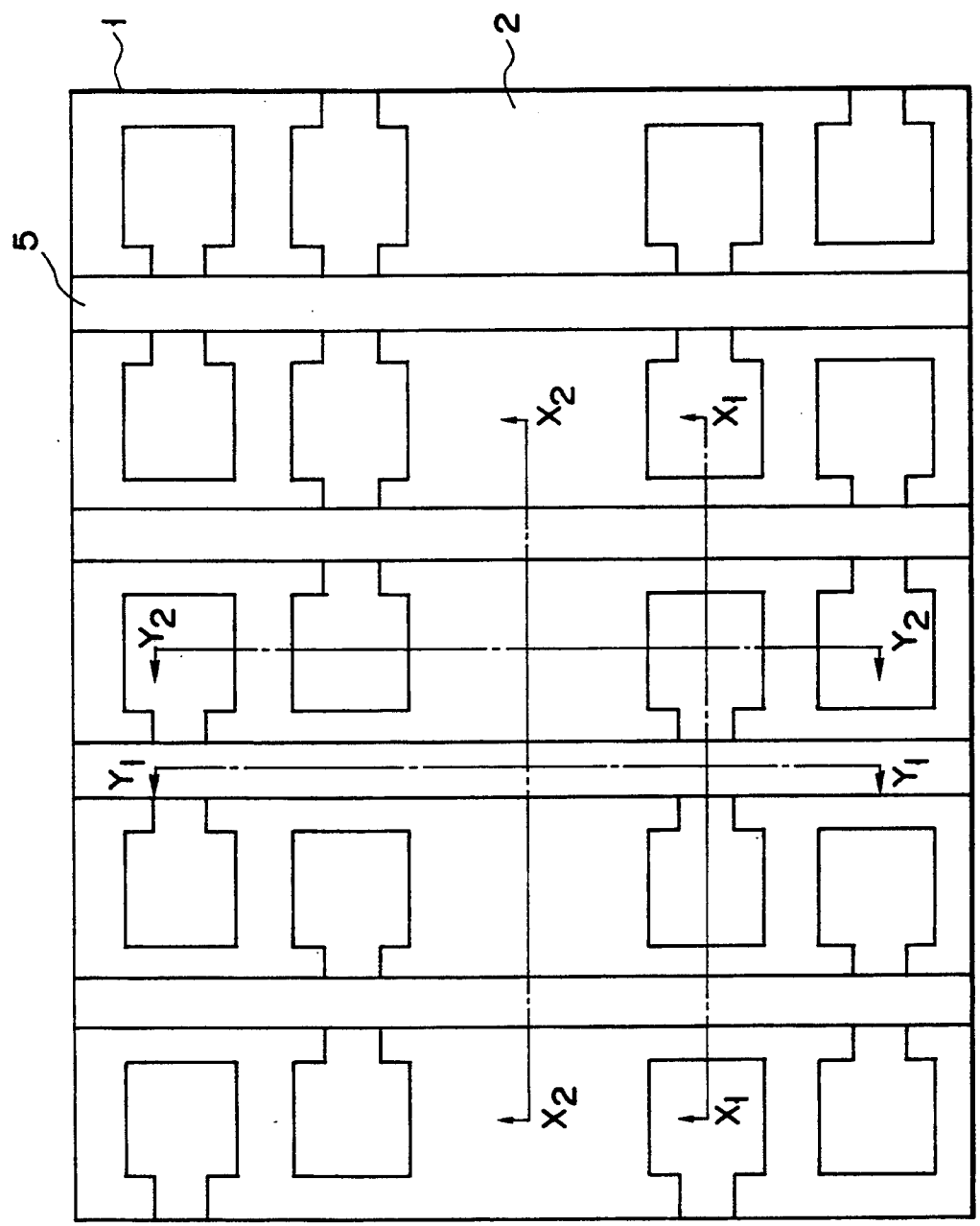
Figures 1, 11A:
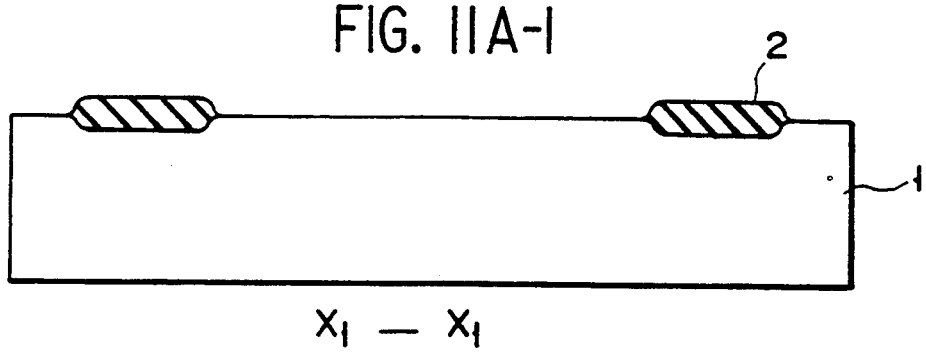
Figures 2, 11A:
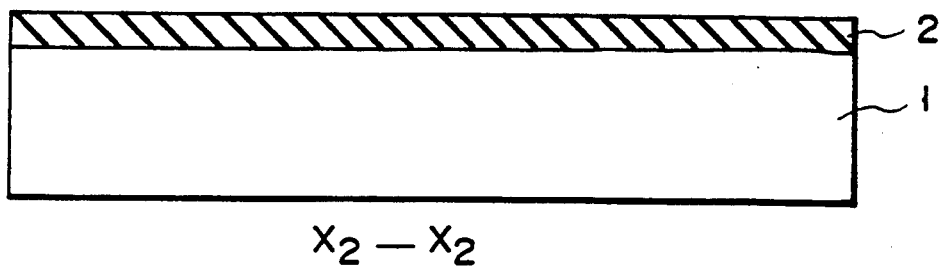
Figures 3, 11A:
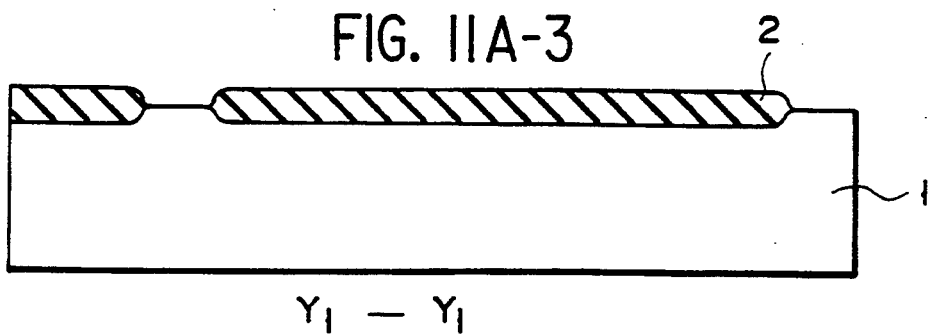
Figures 4, 11A:
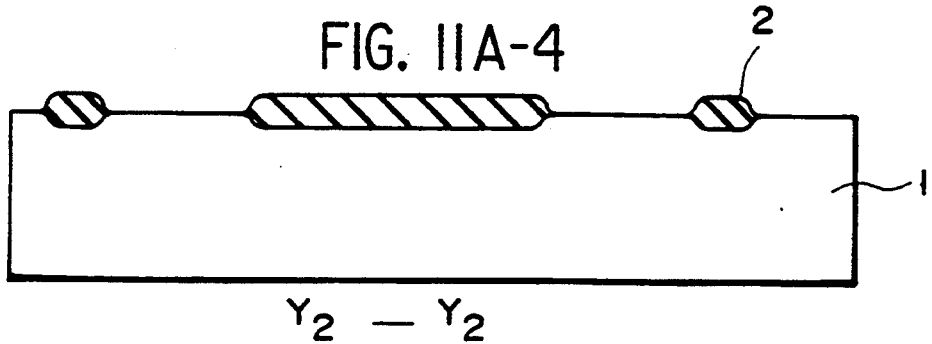
Figures 1, 11B:
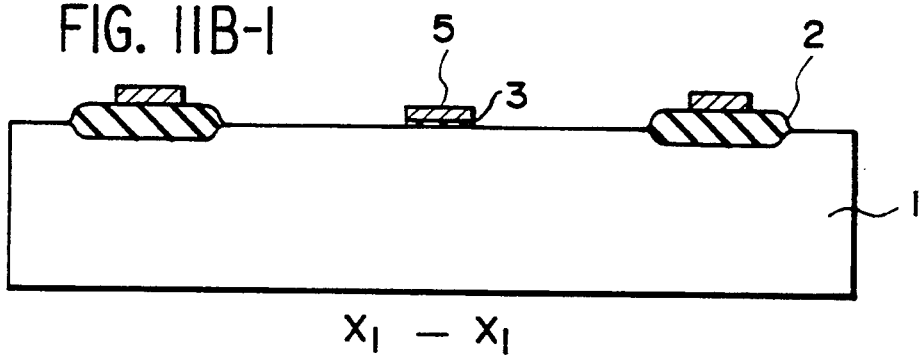
Figures 2, 11B:
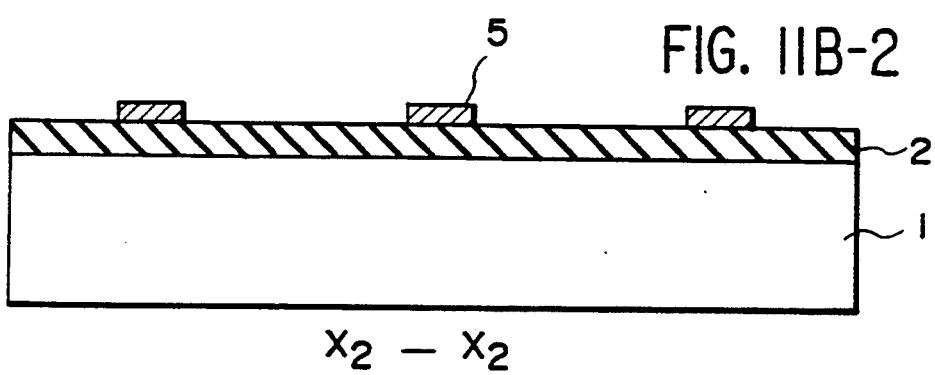
Figures 3, 11B:
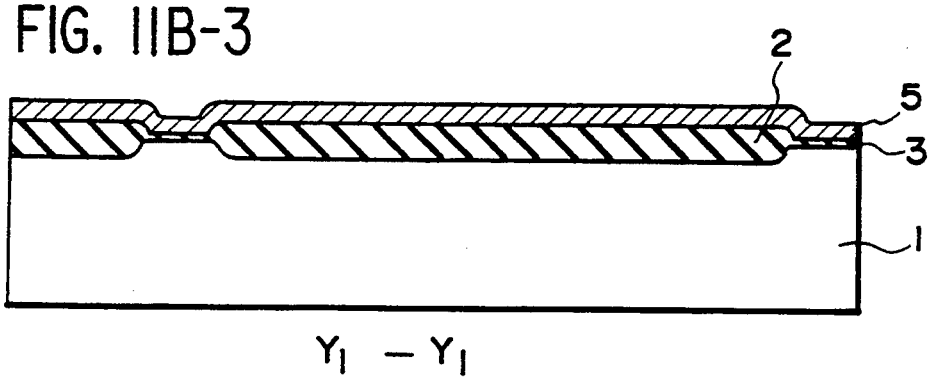
Figures 4, 11B:
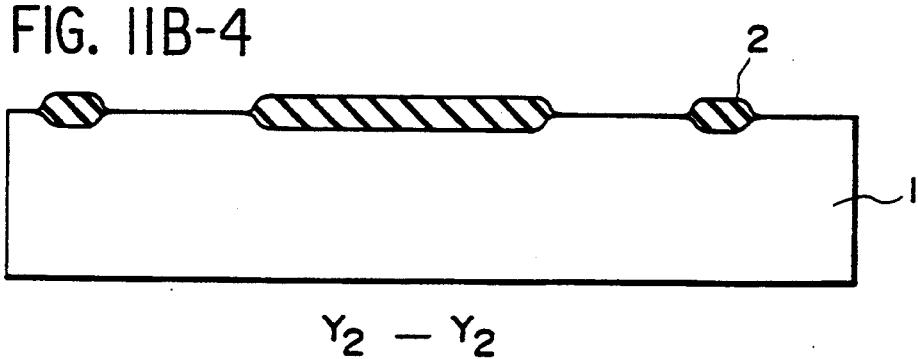

As shown in FIGS. 10B and 11B, an oxide film is formed on an element region and a conductive layer such as a polysilicon layer is deposited on the oxide film. Thereafter, the resultant structure is patterned by photolithography to form gate oxide films 3 (see FIG. 11B) and gate electrodes 5. Note that these gate electrodes 5 also serve as word lines of the memory cell array.

Figure 10C:
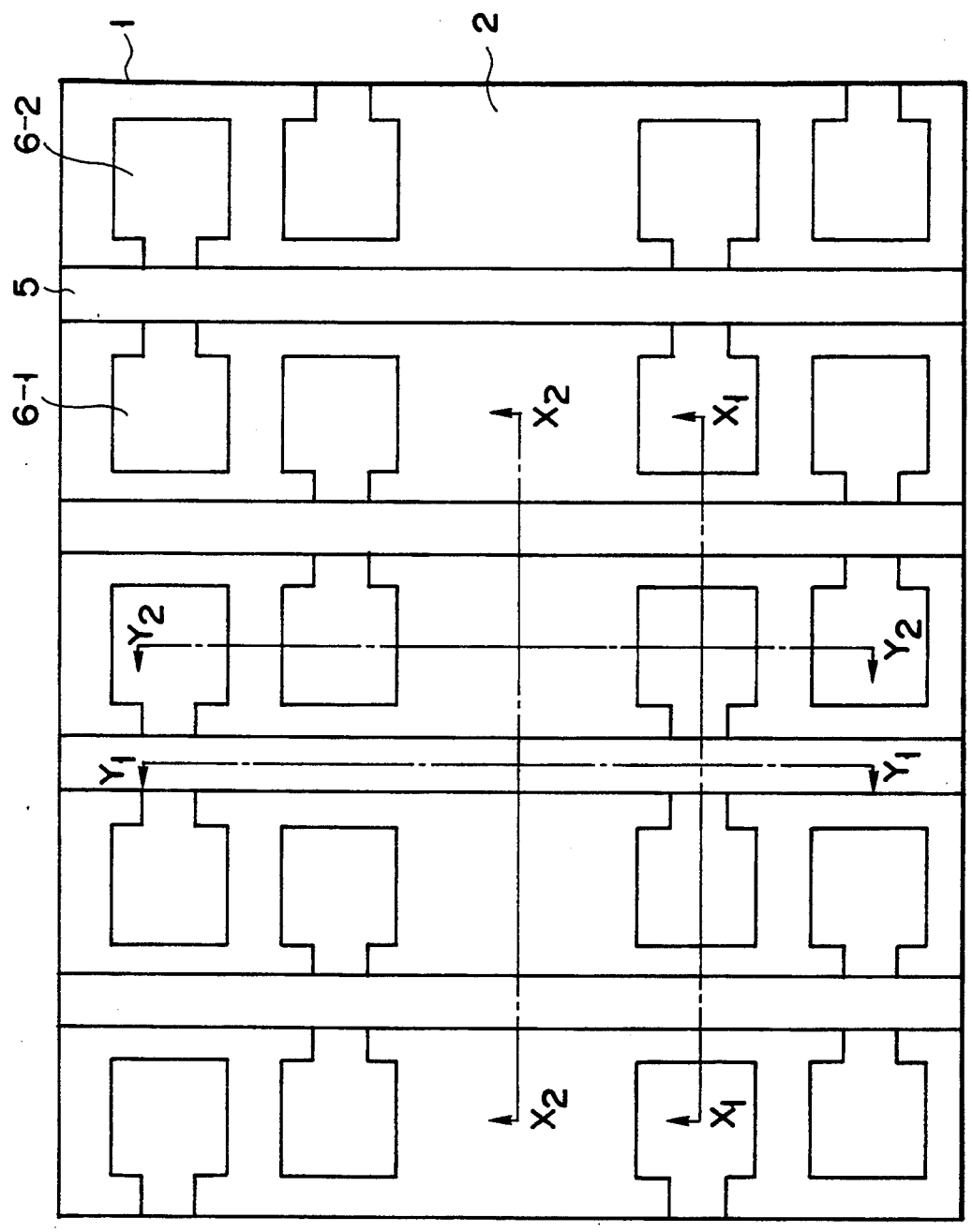

As shown in FIGS. 10C and 11C, for example, As ions are implanted in the element regions by using the gate electrodes 5 as masks to form n-type sources 6-1 and n-type drains 6-2.

Figure 10D:
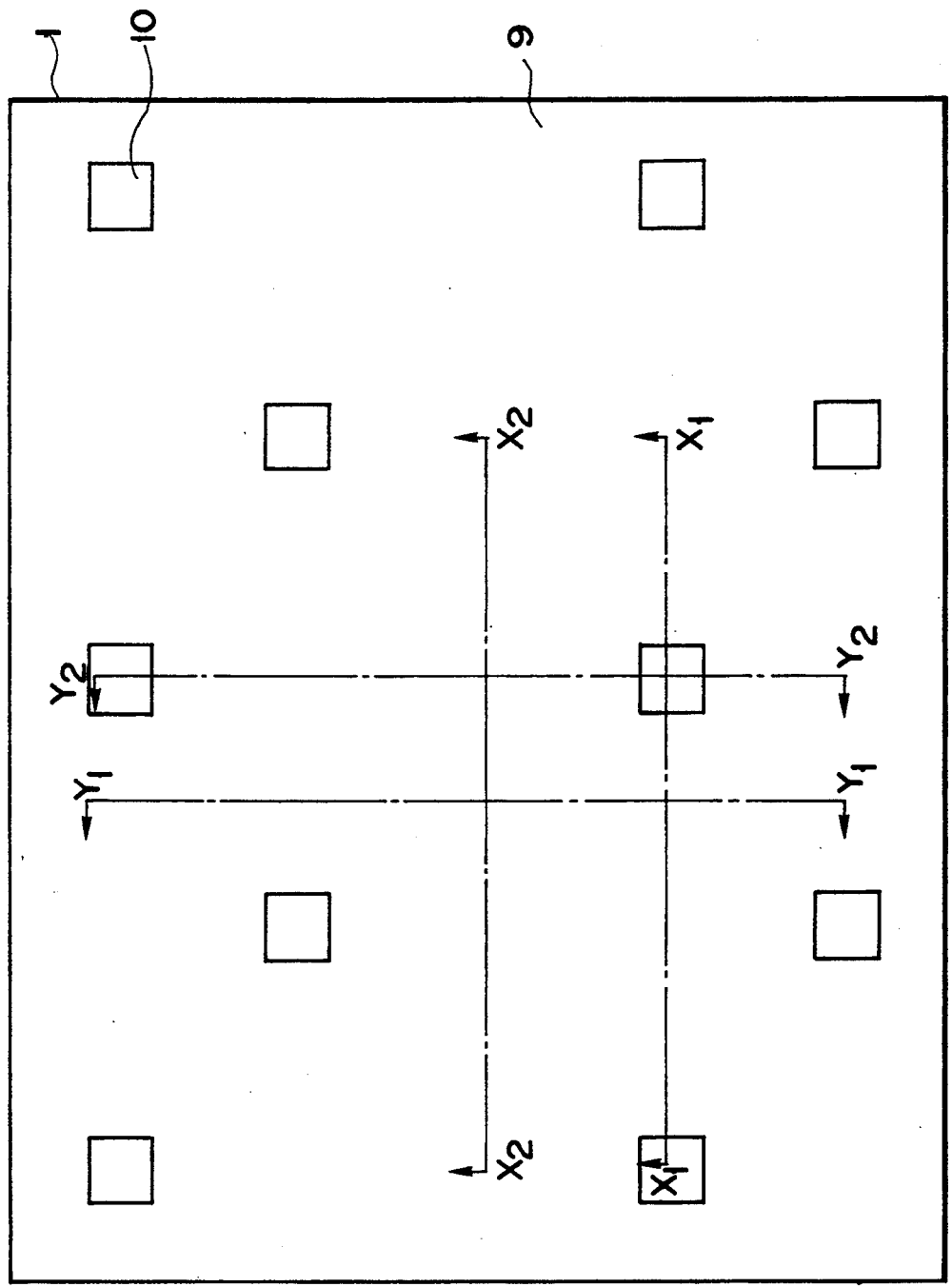

As shown in FIGS. 10D and 11D, a first insulating interlayer 9 consisting of SiO₂ or the like is formed on the entire upper surface of the resultant structure by CVD or the like. Thereafter, contact holes 10 are formed in regions on the drains 6-2 by lithography.

Figure 10E:
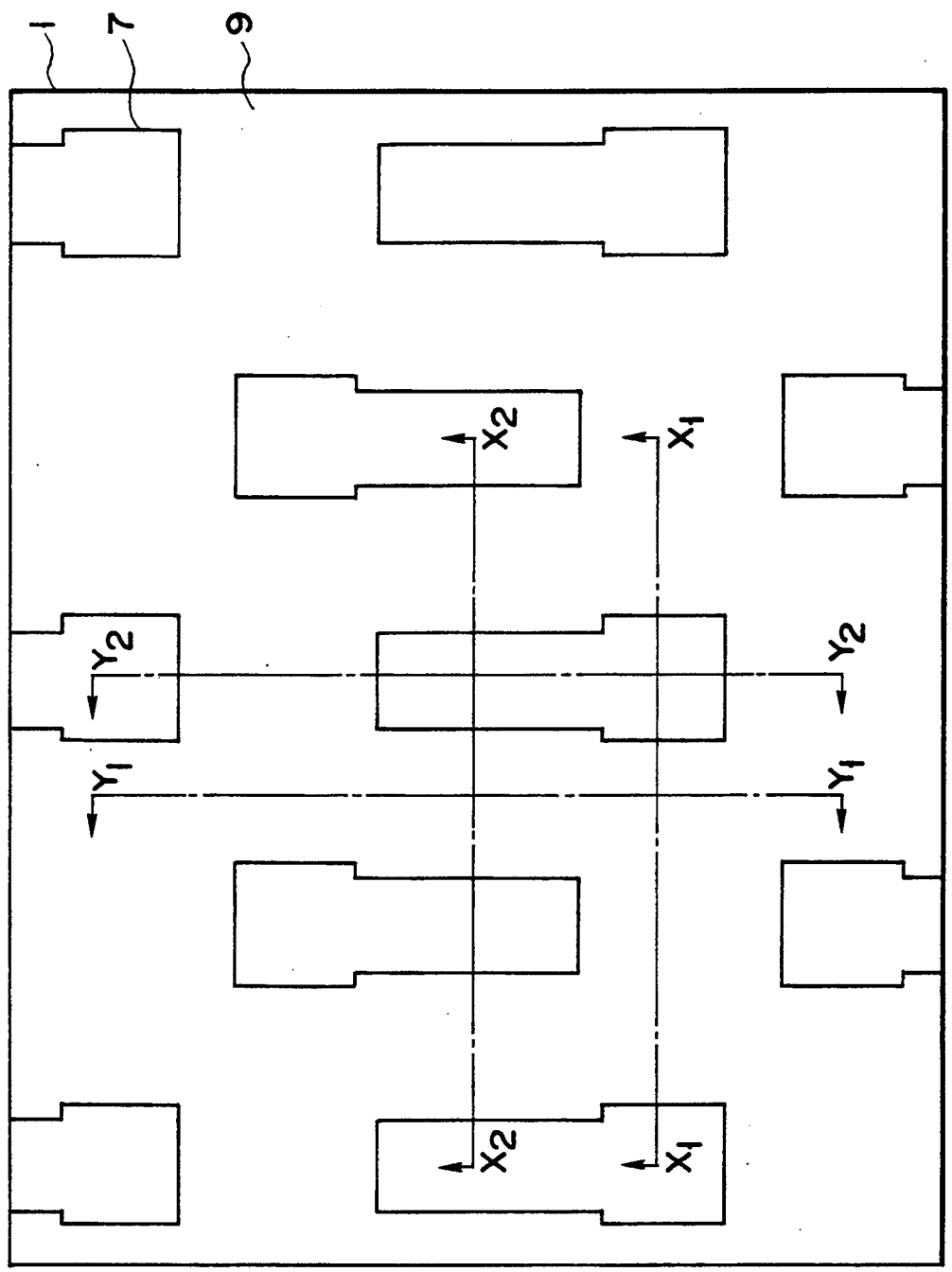
Figures 1, 11E:
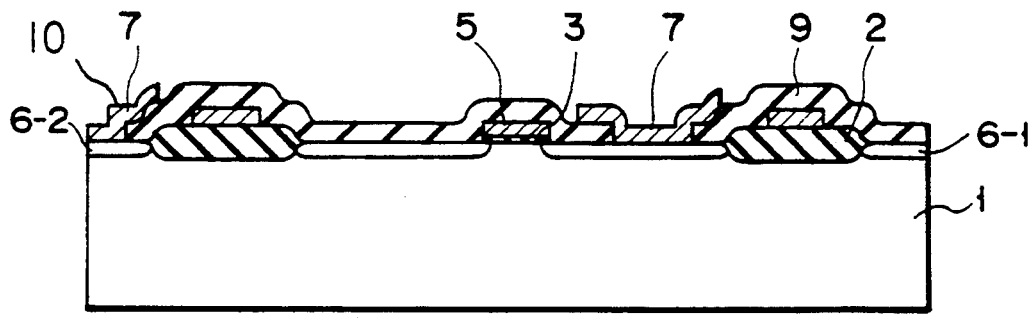
Figures 2, 11E:
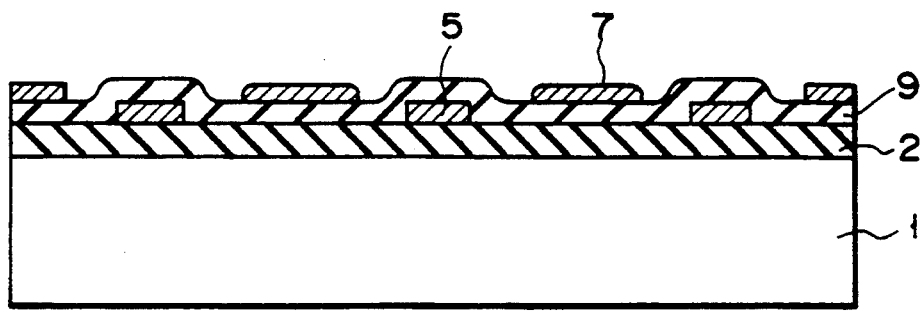
Figures 3, 11E:
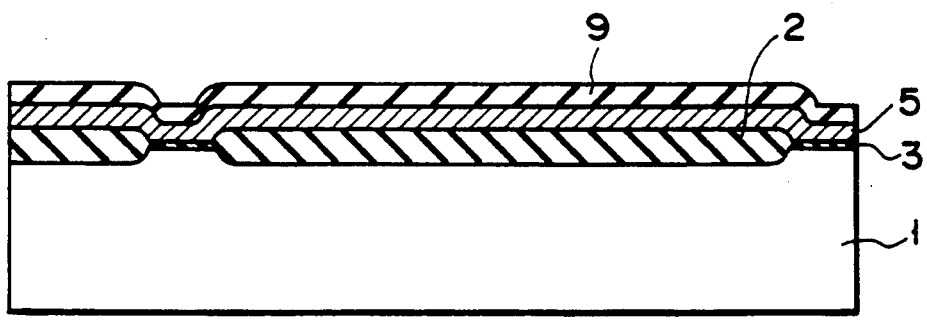
Figures 4, 11E:
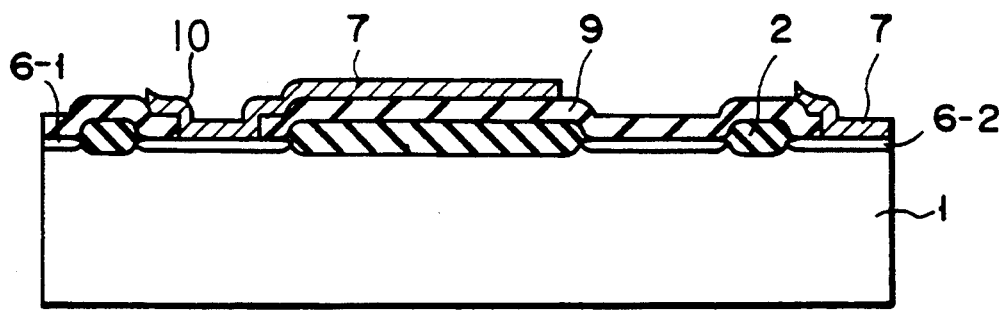

Subsequently, as shown in FIGS. 10E and 11E, one electrode of a ferroelectric capacitor and a first electrode 7 are formed on each predetermined region on the first insulating interlayer including each contact hole 10 (see FIG. 11E).

Figure 10F:
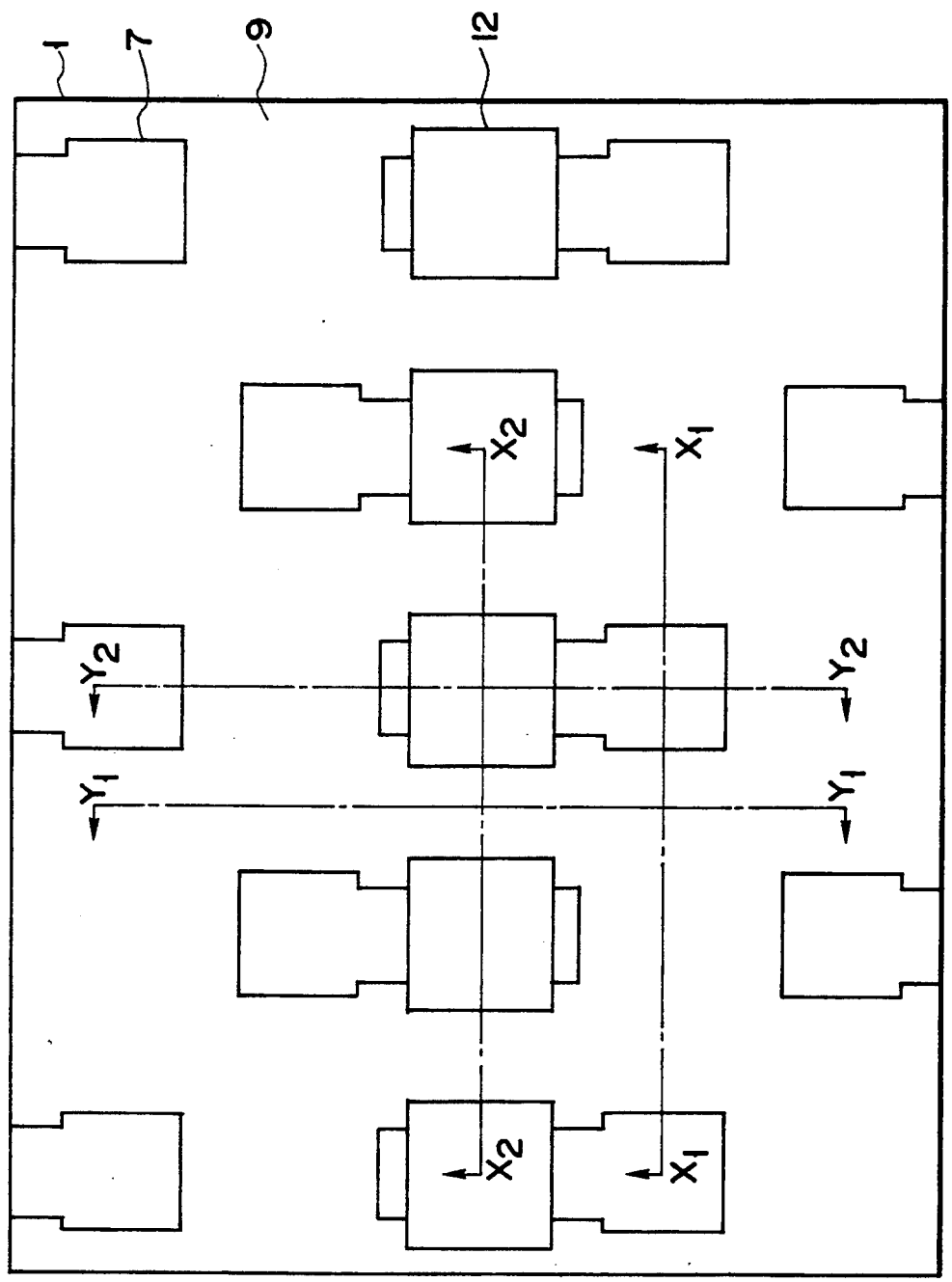

As shown in FIGS. 10F and 11F, a ferroelectric film 12 is formed on the first electrode 7 by sputtering.

Figure 10G:
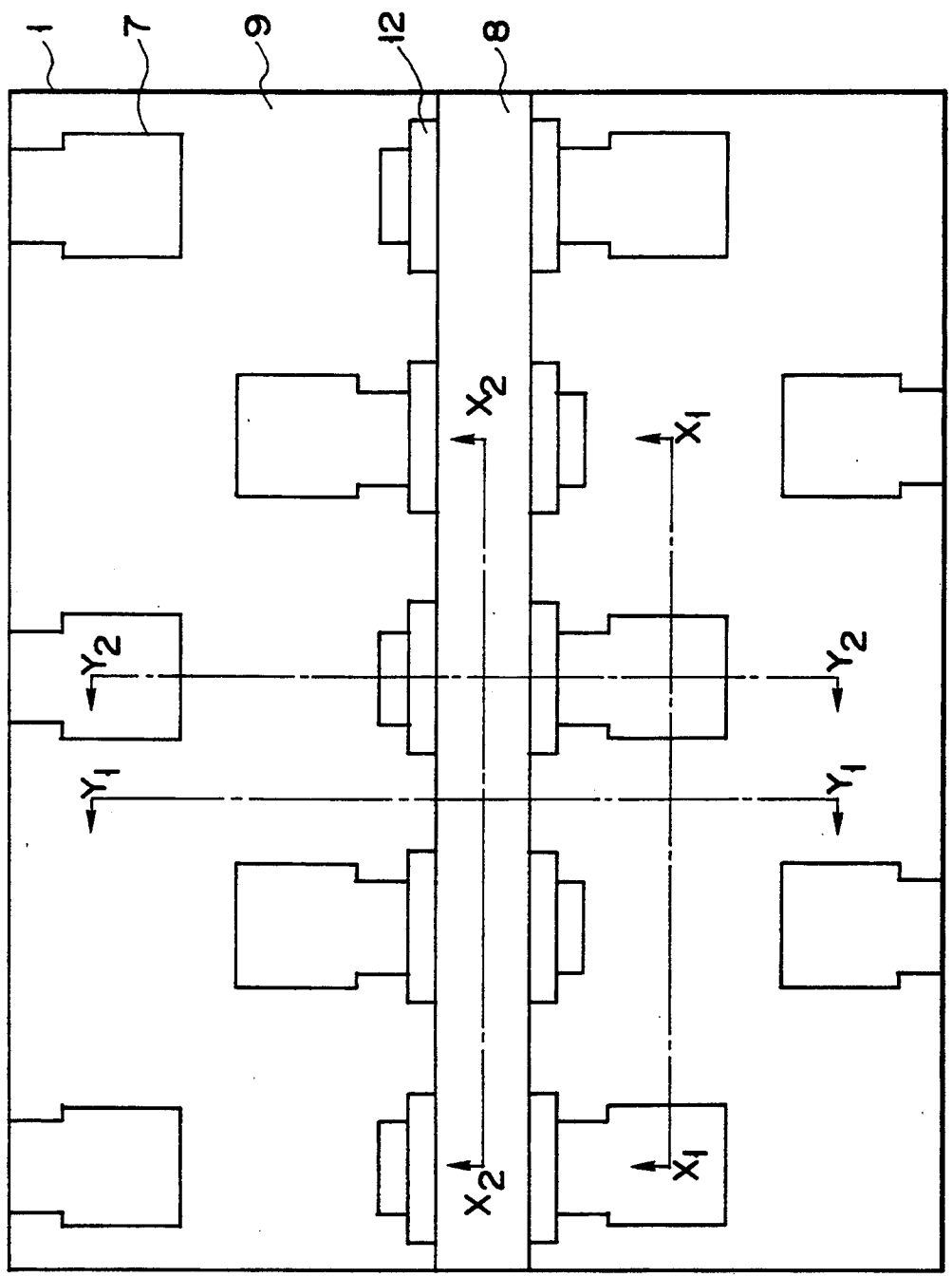

As shown in FIGS. 10G and 11G, each second electrode 8 serving as the other electrode of the ferroelectric capacitor is formed on the corresponding ferroelectric film 12. The second electrodes 8 also serve as plate lines of the memory cell array and are formed to cross the gate electrodes 5 also serving as word lines at right angles, thus constituting the ferroelectric capacitors between the second electrodes 8 and the adjacent gate electrodes 5.

Figure 10H:
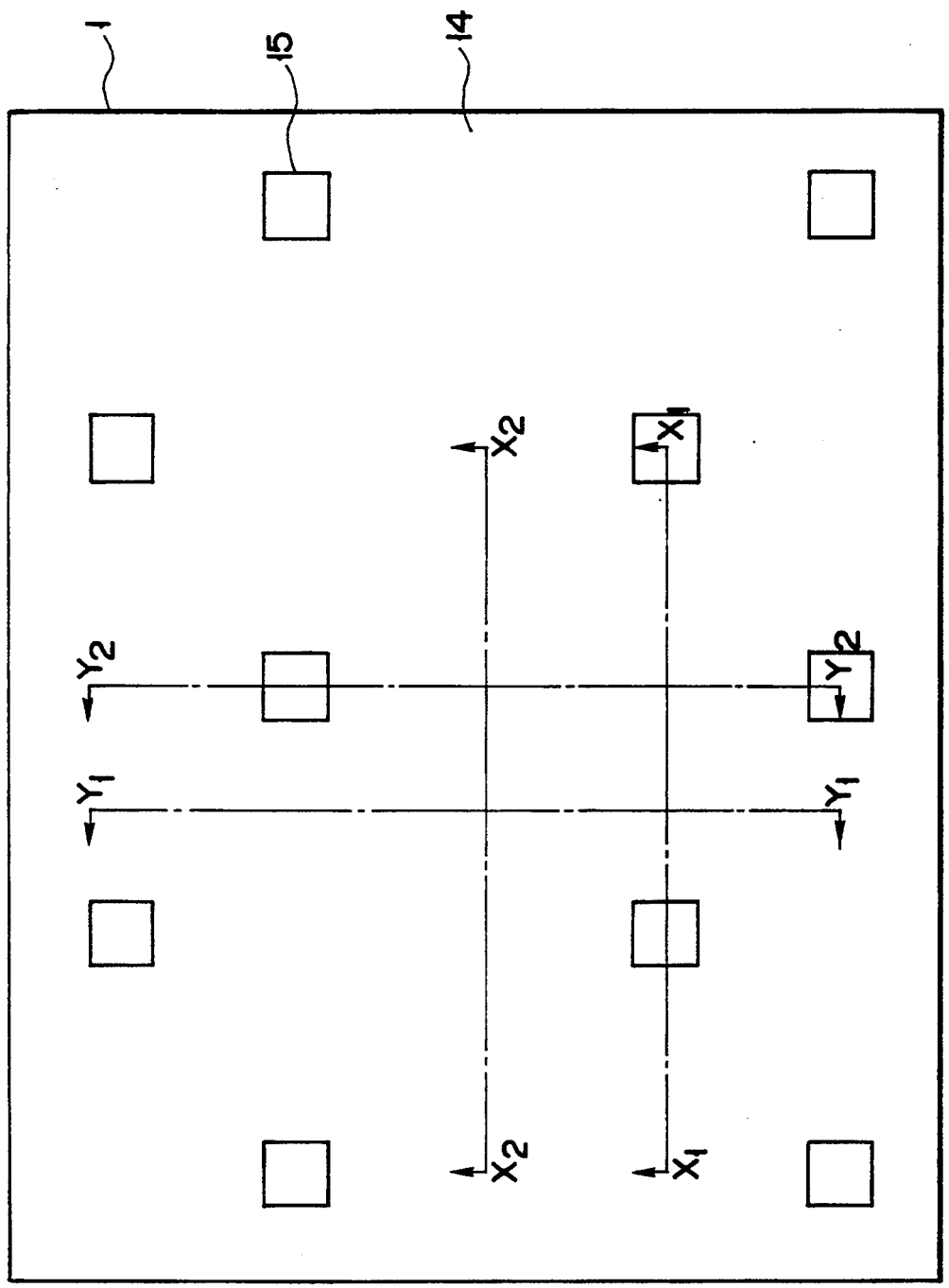
Figure 101:
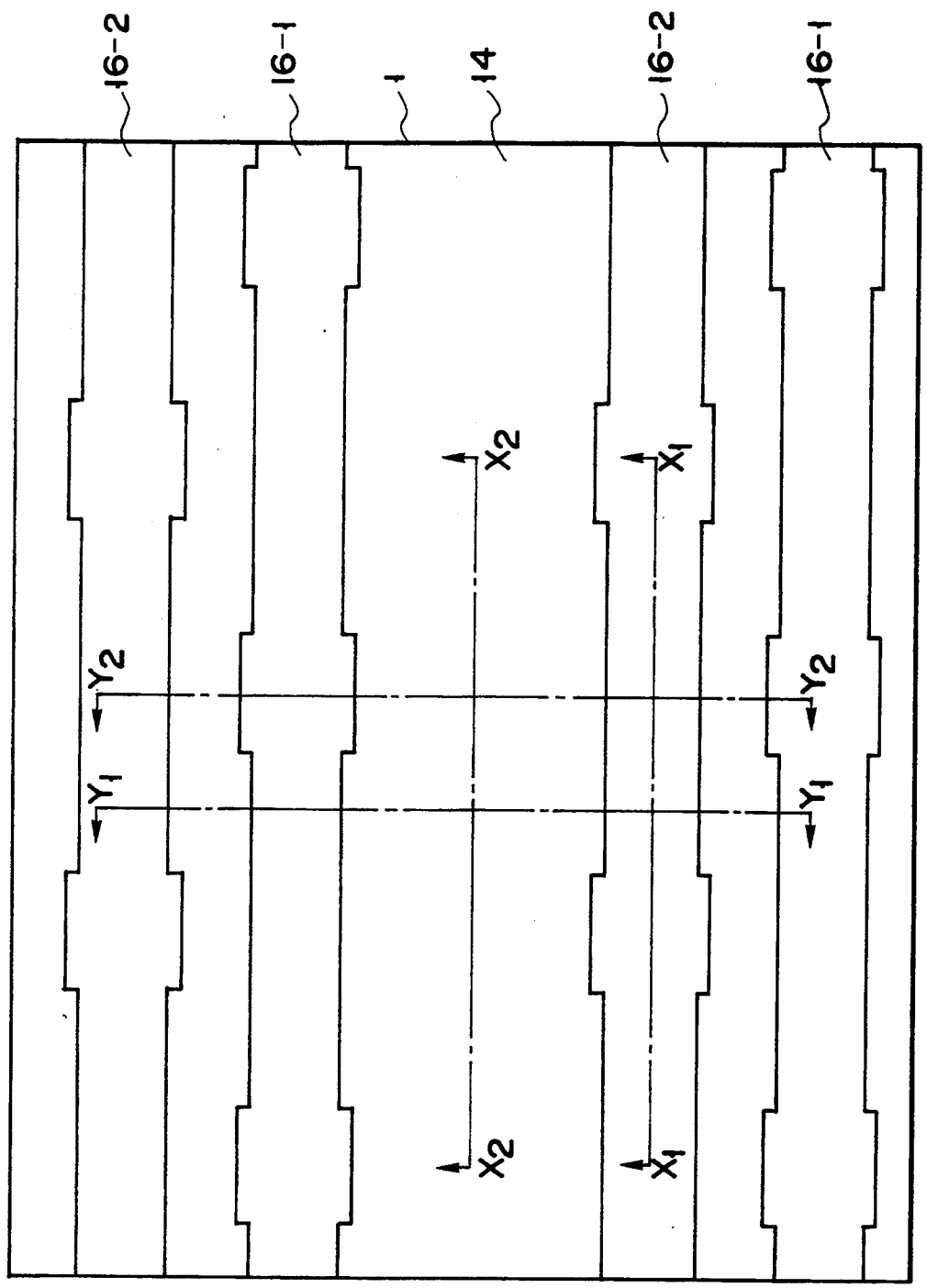

As shown in FIGS. 10H and 11H, after a second insulating interlayer 14 consisting of SiO₂ is formed on the entire upper surface of the resultant structure by CVD or the like, contact holes 15 are formed in regions on the sources 6-1 (see FIG. 11H) by lithography.

Subsequently, as shown in FIGS. 10I and 11I, bit lines 16-1 and 16-2 are formed in predetermined regions on the second insulating interlayer 14 including the contact holes 15, thus obtaining the pattern of the memory cell array according to the present invention. In this case, each pair of bit lines 16-1 and 16-2 are formed to cross the gate electrodes 5 also serving as word lines and to be parallel with the second electrode 8 also serving as a plate line, as shown in FIG. 11I. As is apparent from FIGS. 10G and 10I, the two bit lines 16-1 and 16-2 are symmetrically formed on both sides of the second electrode 8 also serving as a plate line. These two bit lines 16-1 and 16-2 constitute a bit line pair.

Note that such a memory cell array is used after a protective film 155 is formed on the entire upper surface of the memory cell array, as shown in FIG. 11J.

In the memory cell array according to the present invention, in place of the planar type ferroelectric capacitor described above, a vertical type capacitor may be used, which is obtained by forming a pair of vertical grooves in a ferroelectric film to be parallel with each other, and filing the grooves with a conductive material.

Figure 12B:
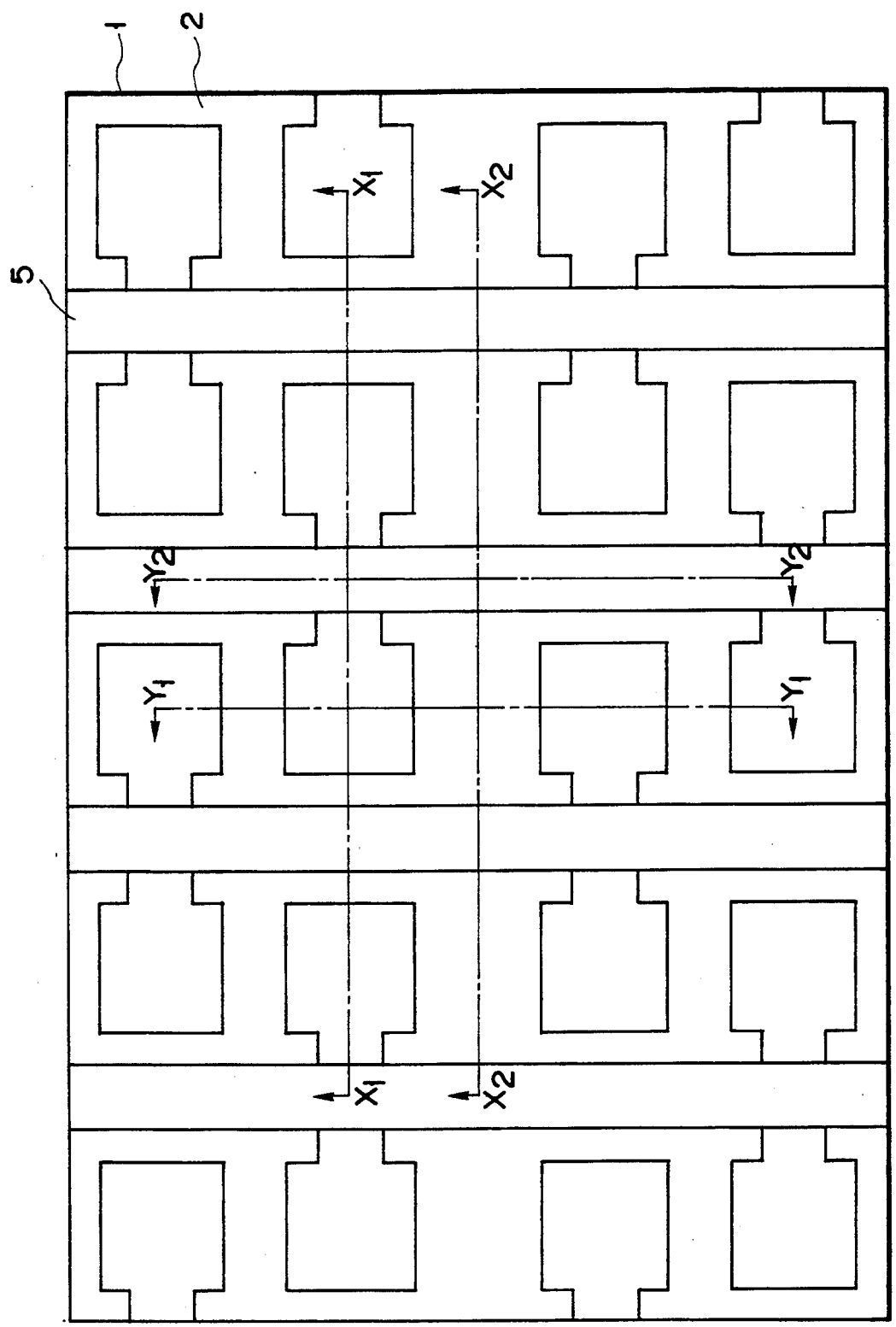

A process of forming a memory cell array having such vertical type capacitors will be described below with reference to FIGS. 12A to 13H. FIGS. 12A to 12G are plan views showing the process of forming the memory cell array. FIGS. 13A to 13H are longitudinal sectional views showing the process of forming the memory cell array. Note that reference symbols (a), (b), (c), and (d) in each of FIGS. 13A to 13G denote longitudinal sectional views taken along lines X₁-X₁, X₂-X₂, Y₁-Y₁, and Y₂-Y₂ in each of FIGS. 12A to 12G, respectively. FIG. 13H corresponds to FIG. 13G and shows the steps after the steps shown in FIG. 13G.

Figures 1, 13A:
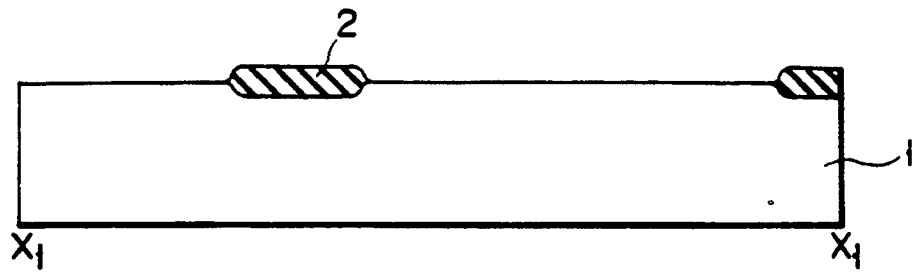
FIGS. 13A to 13H are longitudinal sectional views showing another process of forming the memory cell array according to the present invention.
Figures 2, 13A:
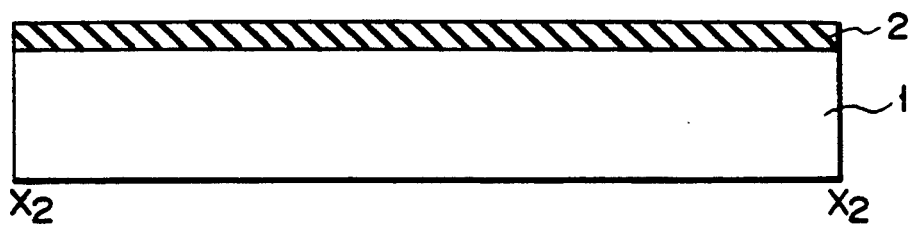
FIG. 2 is a circuit diagram showing an arrangement of a memory cell of a conventional semiconductor memory device.
Figures 3, 13A:
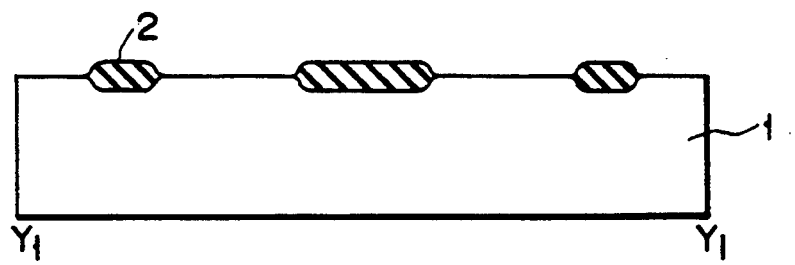
Figures 4, 13A:
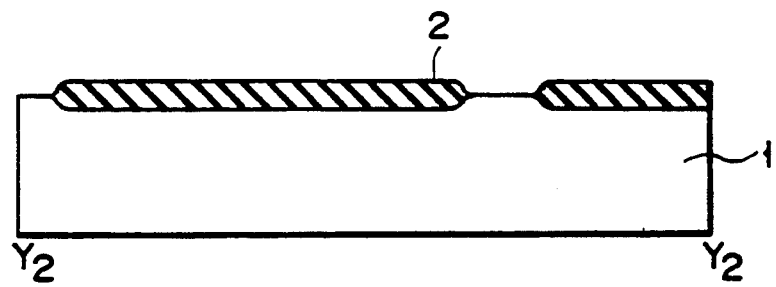

As shown in FIGS. 12A and 13A, an SiN film is formed on the upper surface of a p-type silicon substrate 1 as a semiconductor substrate. Patterning of the SiN film is then performed by photolithography and reactive ion etching to remove the SiN film other than a region corresponding to an element region. Thereafter, the upper surface of the p-type silicon substrate 1 is thermally oxidized at a temperature of about 1,000° C. to form a field oxide film 2 having a thickness of about 8.000 Å on each element region, and the SiN film is removed.

Figures 1, 13B:
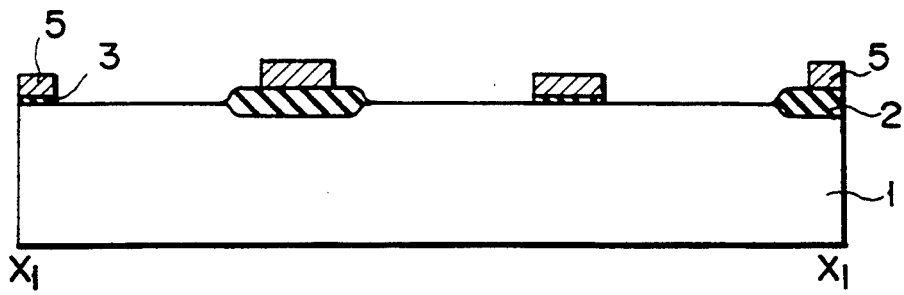
Figures 2, 13B:
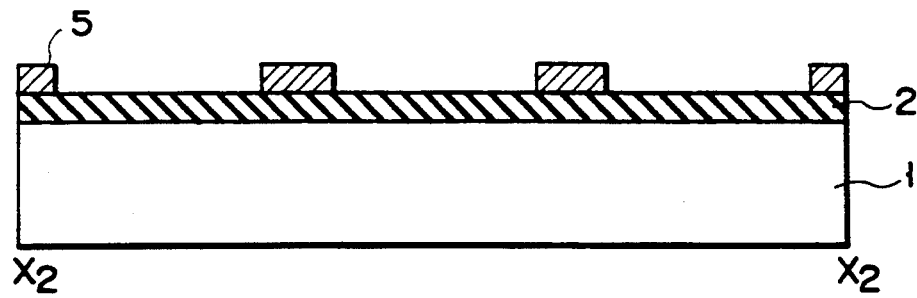
Figures 3, 13B:
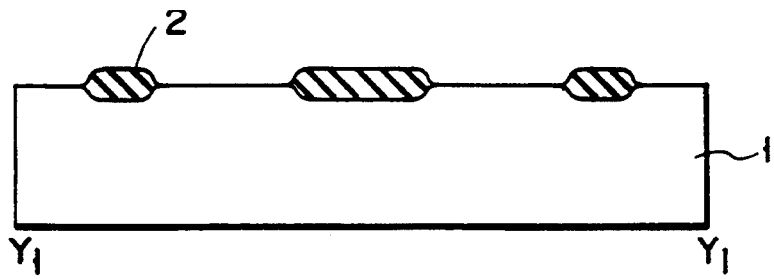
Figures 4, 13B:
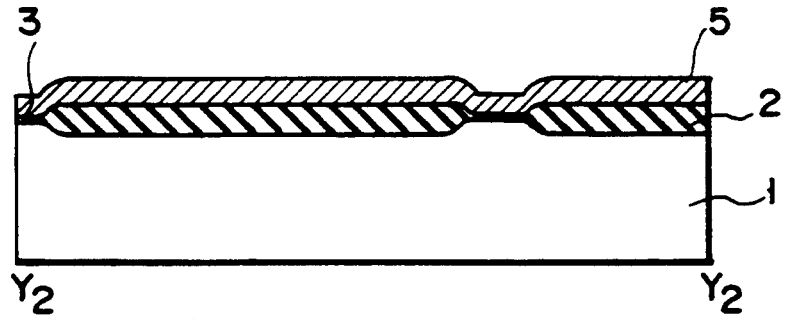

As shown in FIGS. 12B and 13B, an oxide film having a thickness of about 100 Å is formed on the element region, and a conductive layer, e.g., a polysilicon layer, having a thickness of about 3,000 Å is formed on the resultant structure by CVD. Thereafter, the resultant structure is patterned by photolithography and dry etching to form gate oxide films 3 (see FIG. 13B) and gate electrodes 5. Note that these gate electrodes 5 also serve as word lines of the memory cell array.

Figure 12C:
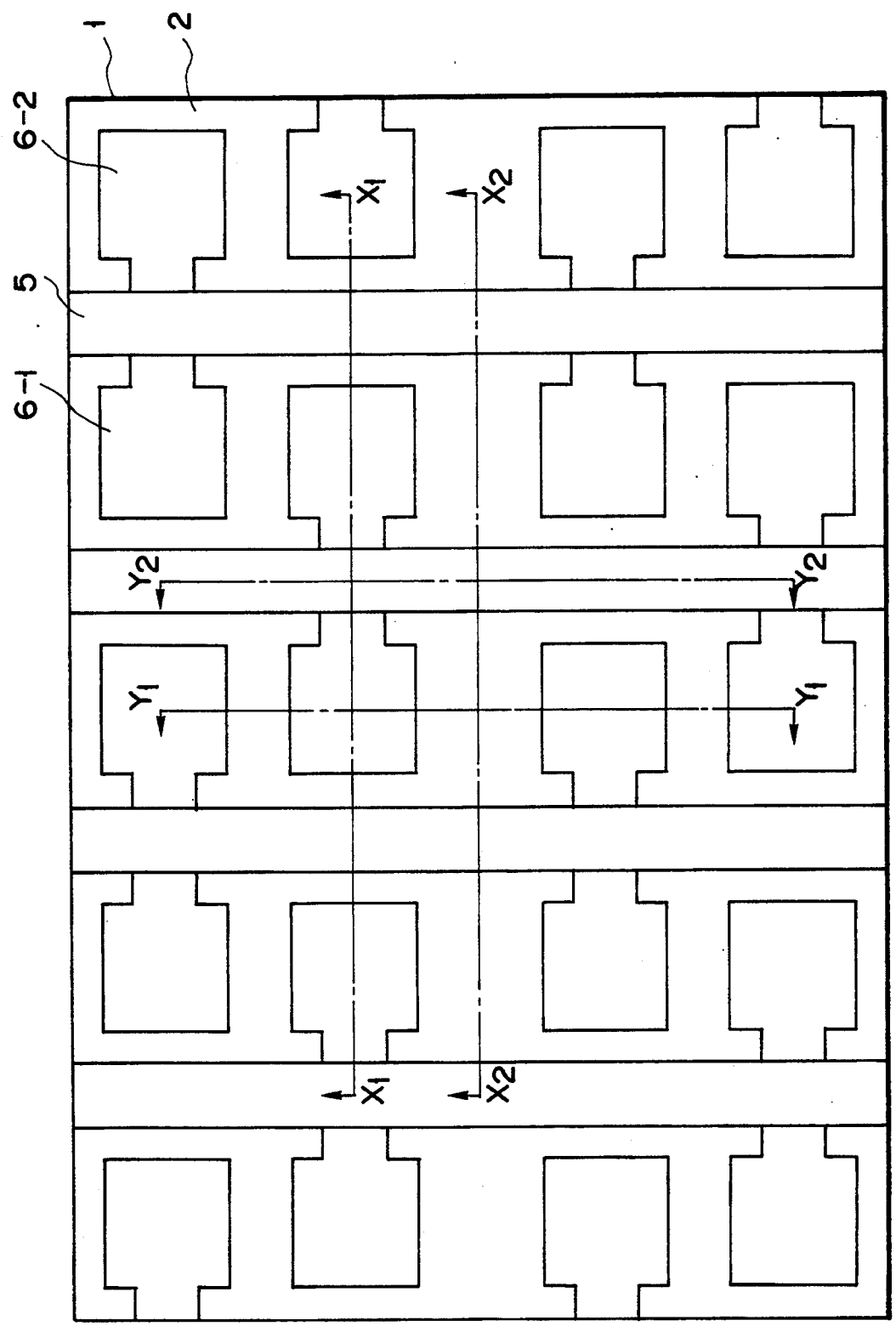
Figures 1, 13C:
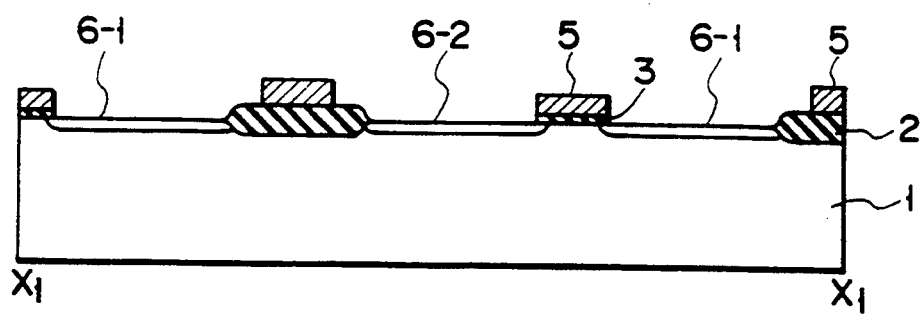
Figures 2, 13C:
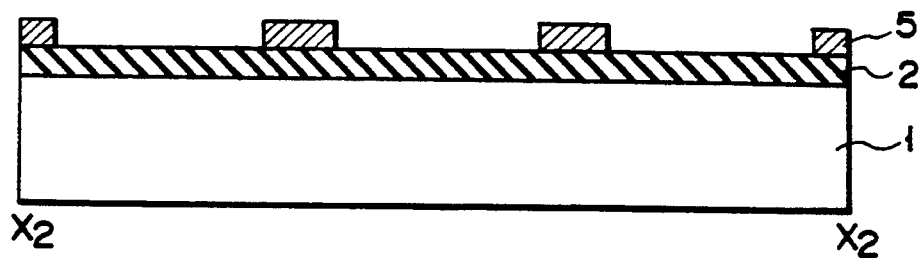
Figures 3, 13C:
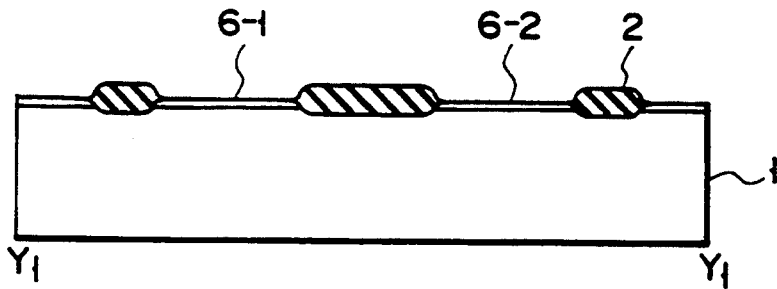
Figures 4, 13C:
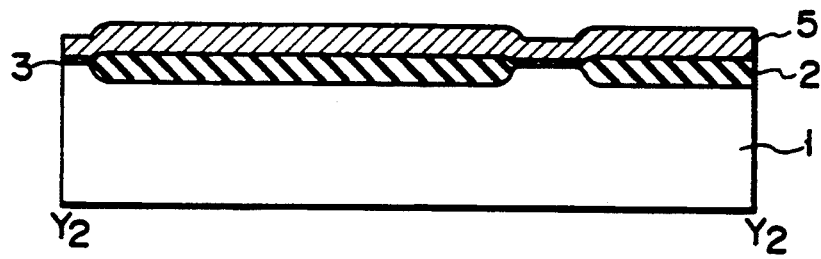

Subsequently, as shown in FIGS. 12C and 13C, As ions or the like is implanted in the element regions by using the gate electrodes 5 as masks to form n-type sources 6-1 and n-type drains 6-2.

Figures 1, 13D:
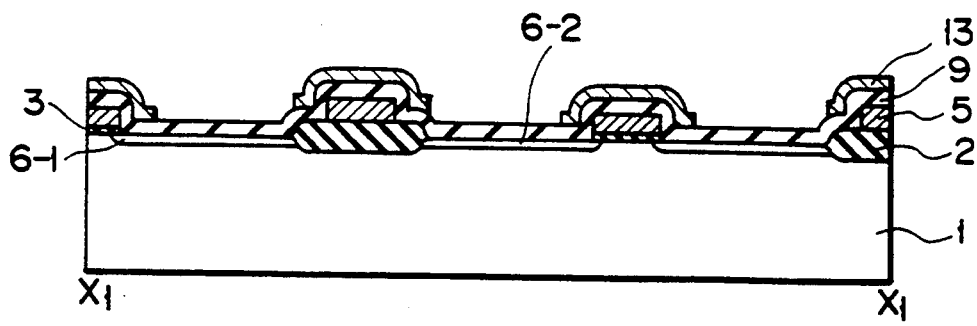
Figures 2, 13D:
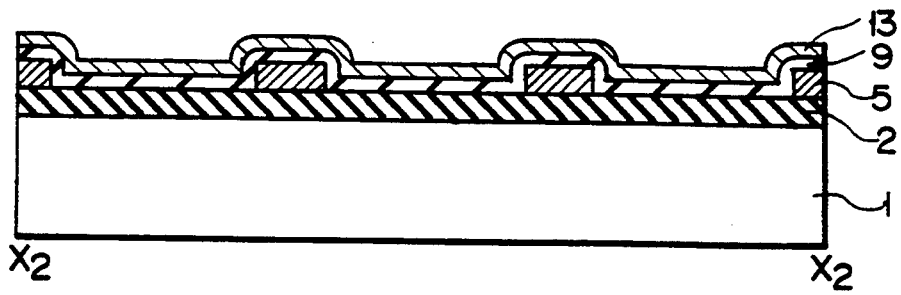
Figures 3, 13D:
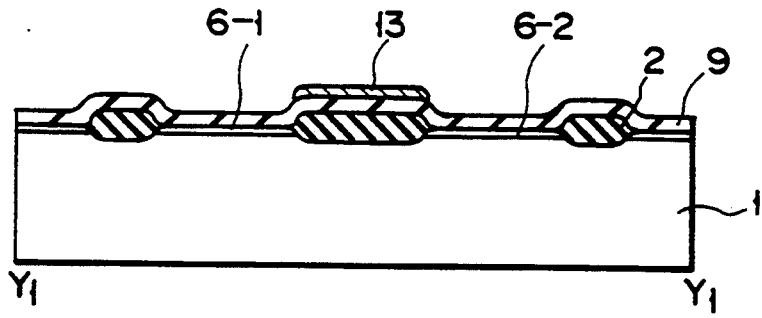
Figures 4, 13D:
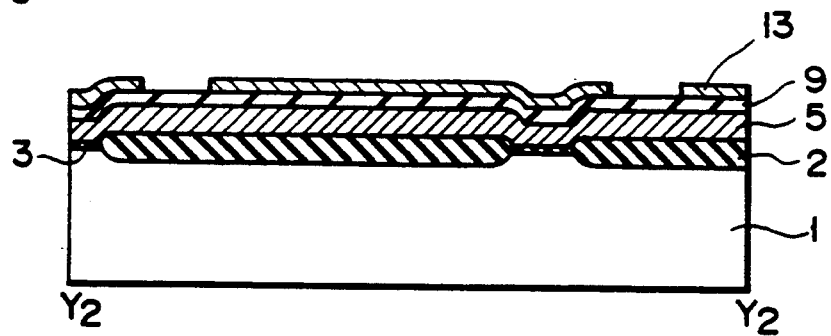

As shown in FIGS. 12D and 13D, after a first insulating interlayer 9 consisting of, e.g., SiO₂ and having a thickness of about 5,000 Å is formed on the entire upper surface of the resultant structure by CVD or the like, a plate line 13 consisting of, e.g., polysilicon is formed in a predetermined region on the first insulating interlayer 9 to cross the gate electrodes 5 (see FIG. 13D) also serving as word lines at right angles. For example, the plate line 13 is formed by sequentially forming a polysilicon film having a thickness of about 1,500 Å and a molybdenum silicide film having a thickness of about 4,000 Å on the first insulating interlayer 9, and subsequently patterning the resultant structure by photolithography and reactive ion etching.

Figure 12E:
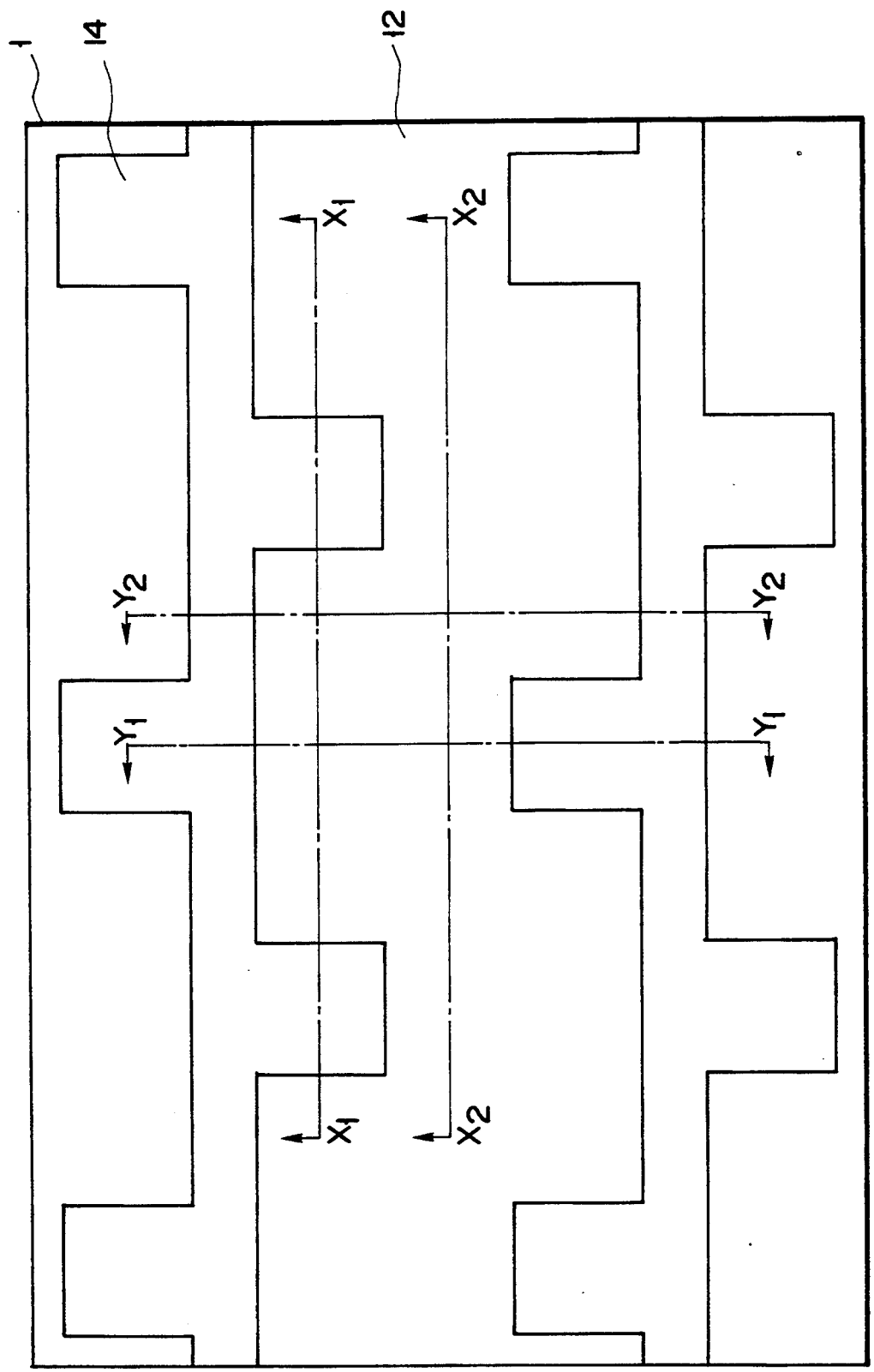
Figures 1, 13E:
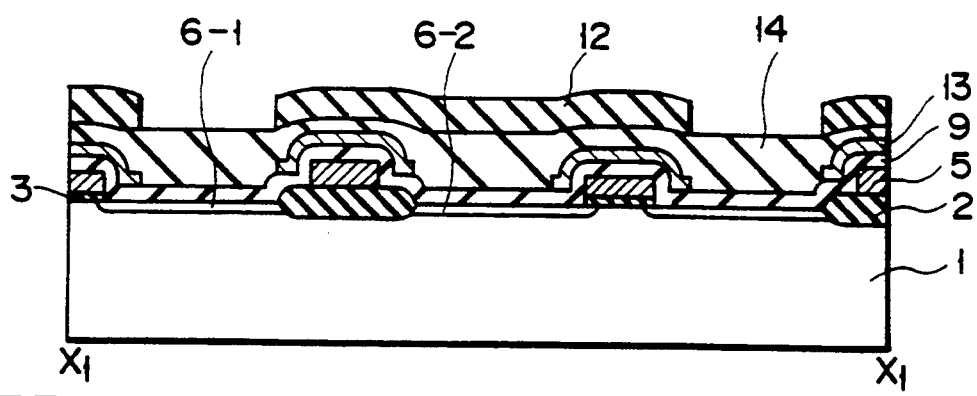
Figures 2, 13E:
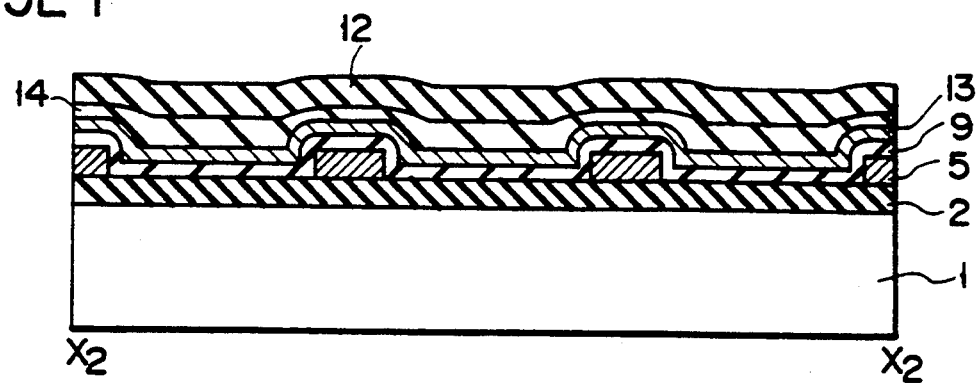
Figures 3, 13E:
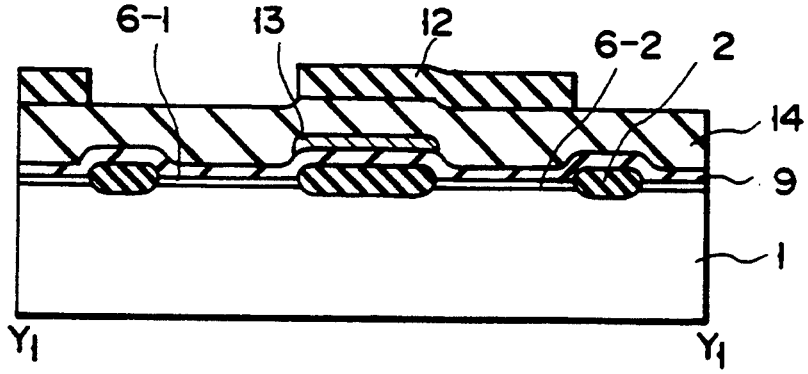
Figures 4, 13E:
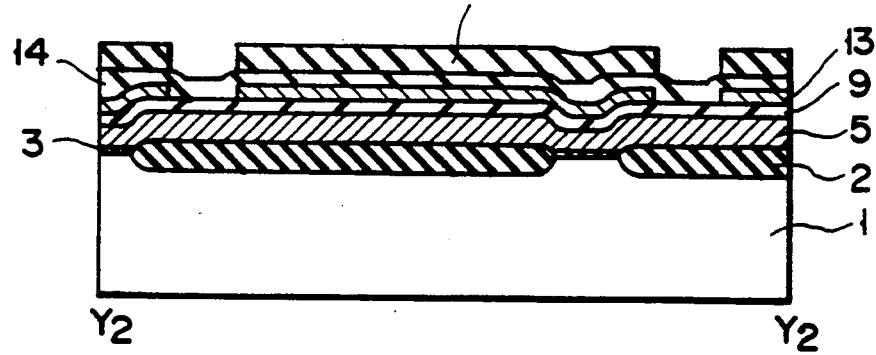

As shown in FIGS. 12E and 13E, a second insulating interlayer 14 consisting of, e.g., borophosphosilicate glass (BPSG) is formed on the entire upper surface of the resultant structure by CVD or the like. The resultant structure is then annealed to flatten its surface. Thereafter, a ferroelectric film 12 consisting of, e.g., PZT and having a thickness of about 5,000 Å is formed in a predetermined region on the second insulating interlayer 14 by RF sputtering or the like. Note that annealing of the second insulating interlayer 14 may be performed to effect phosphorus gettering as well as flattening of the film. In addition, a buffer layer or a barrier layer consisting of, e.g., SrTiO₃ and MgO may be formed between the second insulating interlayer 14 and the ferroelectric film 12. Furthermore, in the formation of the ferroelectric film 12, the p-type silicon substrate 1 is preferably heated to about 600° C. to prevent cracks.

Figure 12F:
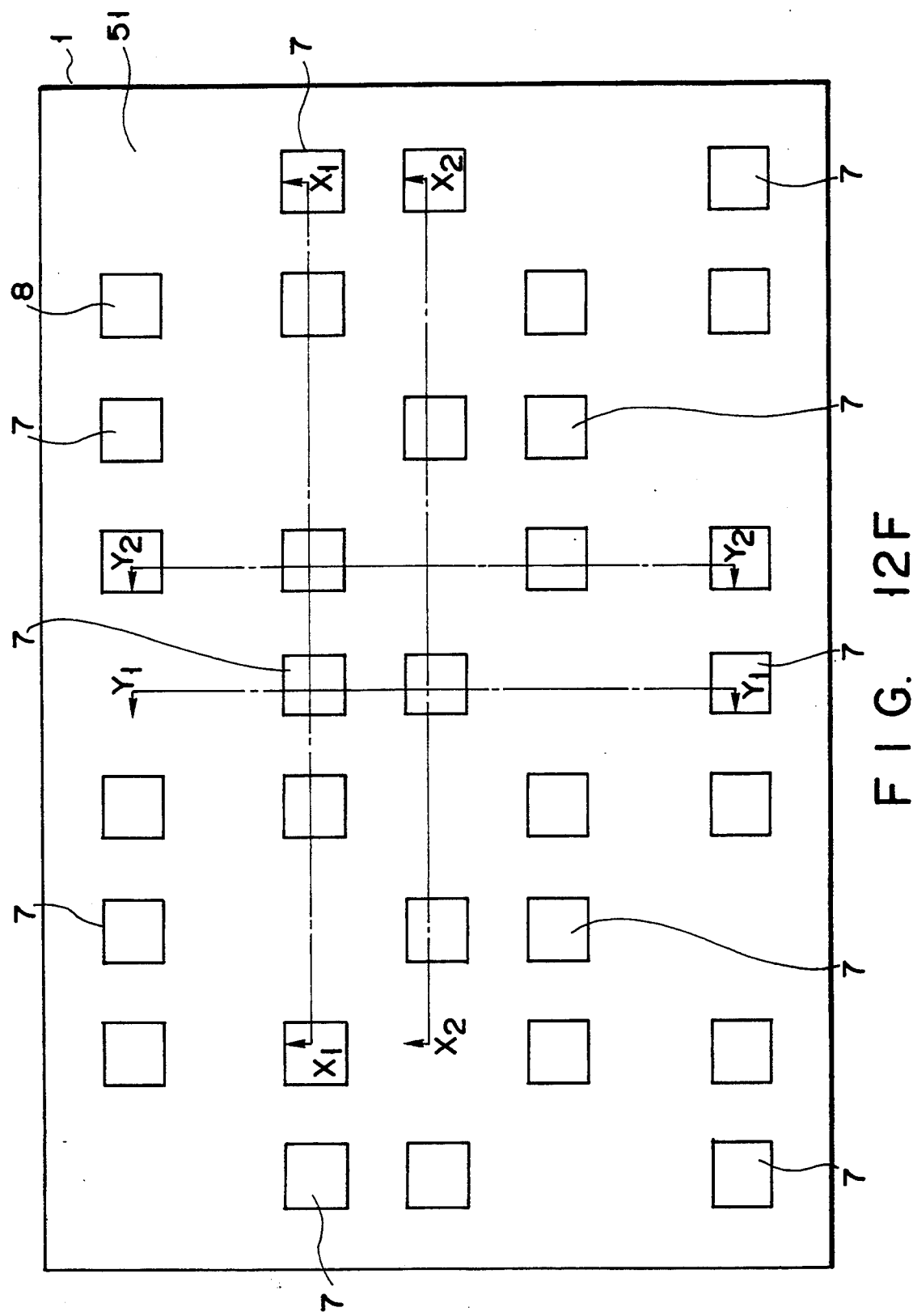
Figures 1, 13F:
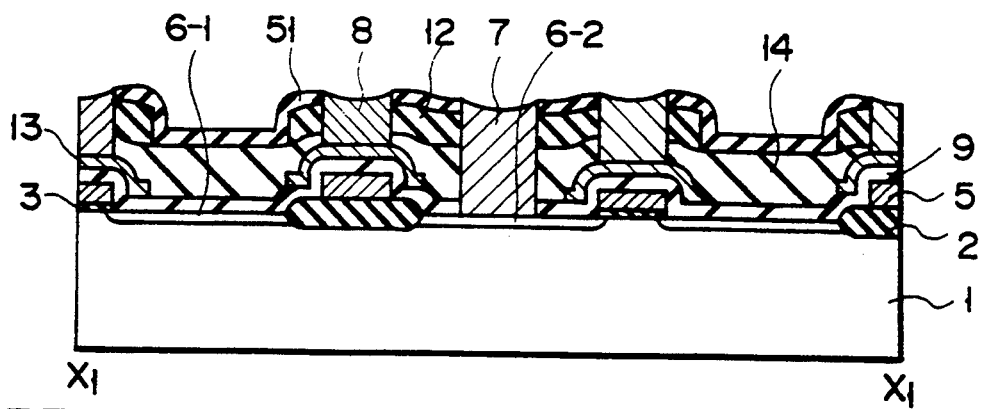
Figures 2, 13F:
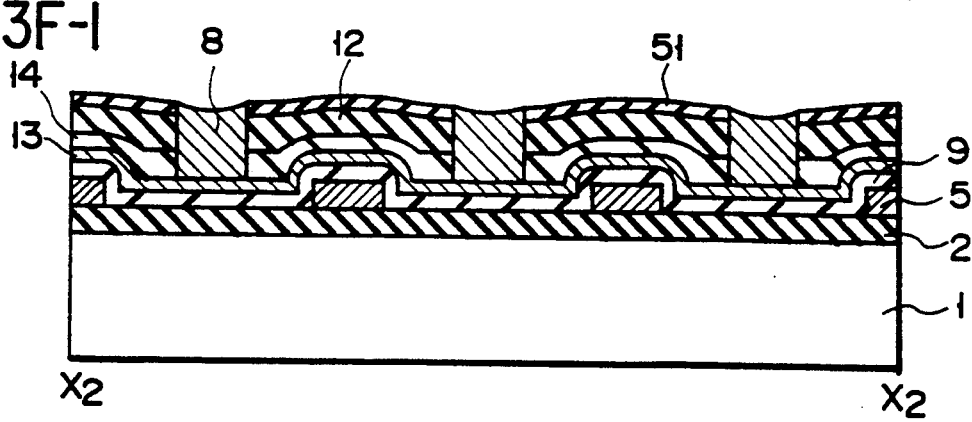
Figures 3, 13F:
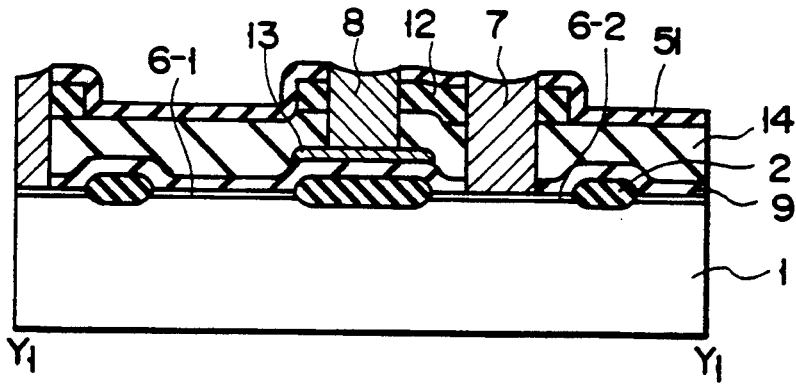
Figures 4, 13F:
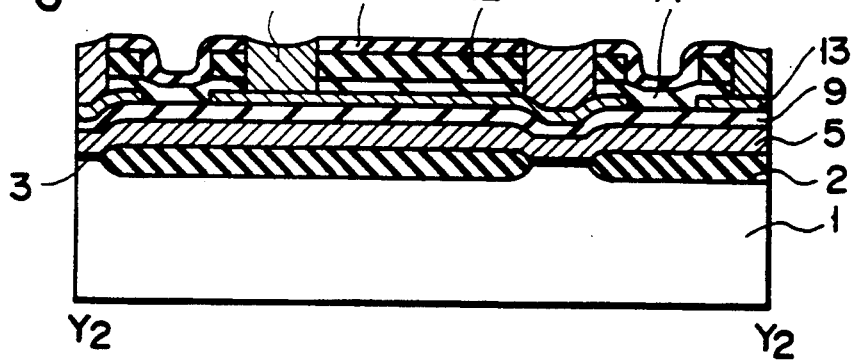

Subsequently, as shown in FIGS. 12F and 13F, a third insulating interlayer 51 consisting of phosphorus silicate is formed on the entire upper surface of the resultant structure. Similarly, in this case, a buffer layer or a barrier layer may be formed between the ferroelectric film 12 (see FIG. 13F) and the third insulating interlayer 51. Thereafter, holes for the electrodes of ferroelectric capacitors are formed at predetermined positions by reactive ion etching or the like. A conductive material such as tungsten is embeddied in these holes by tungsten CVD or the like based on silane reduction, thus forming first and second electrodes 7 and 8 which are respectively connected to the drain 6-2 and the plate line 13 (see FIG. 13F). In this case, the hole for the first electrode 7 is formed to be deeper than the hole for the second electrode 8. The first electrode 7 reaches the source 6-1 or the drain 6-2, whereas the second electrode 8 reaches the plate line 13 (see FIG. 13F). In the formation of the electrode holes, if an etchant exhibiting different etching rates for the first insulating interlayer 9 and the plate line 13 is used, the holes for the first and second electrodes 7 and 8, which have different depths, can be formed at once, as shown in FIG. 13F.

Figure 12G:
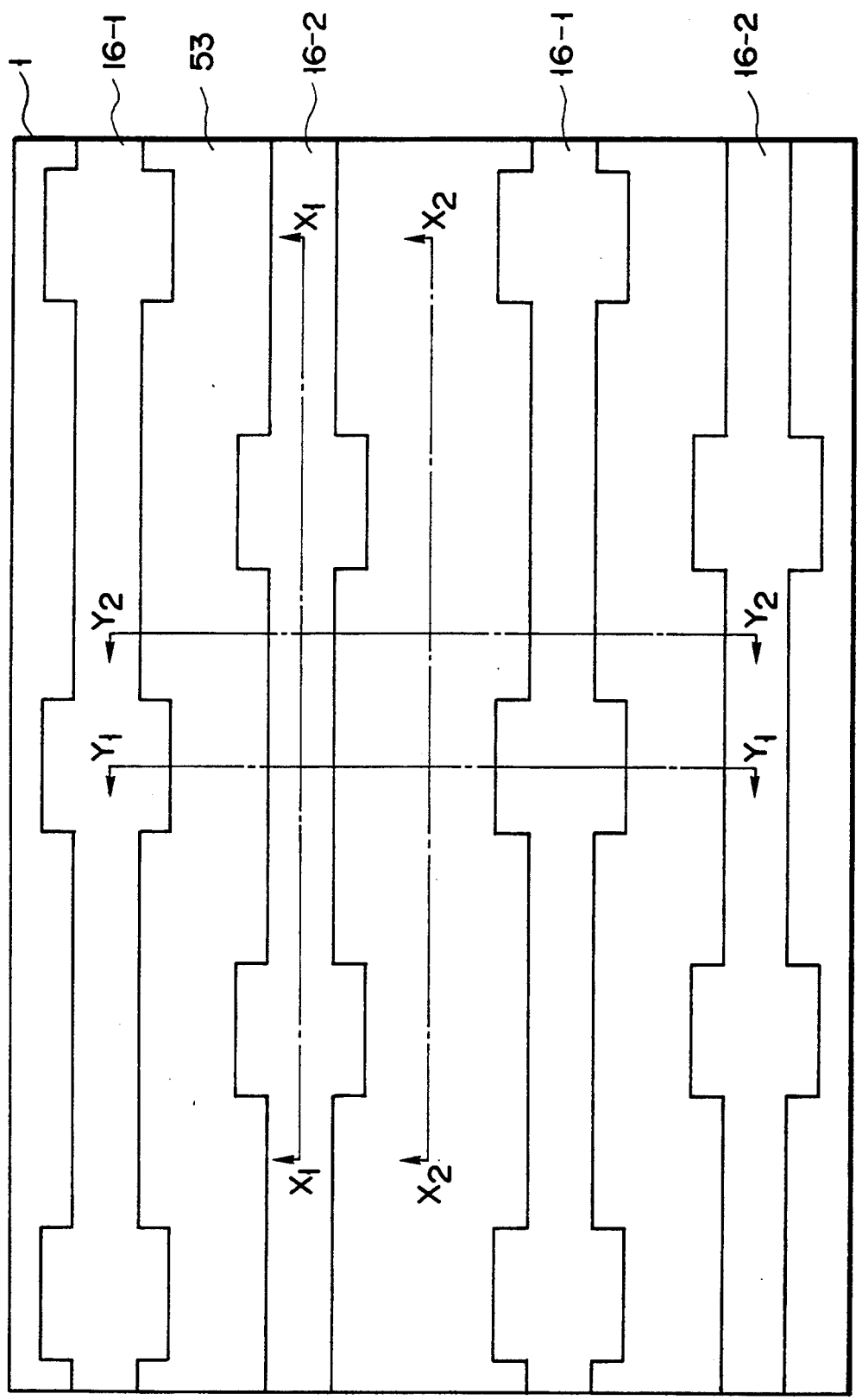
Figures 1, 13G:
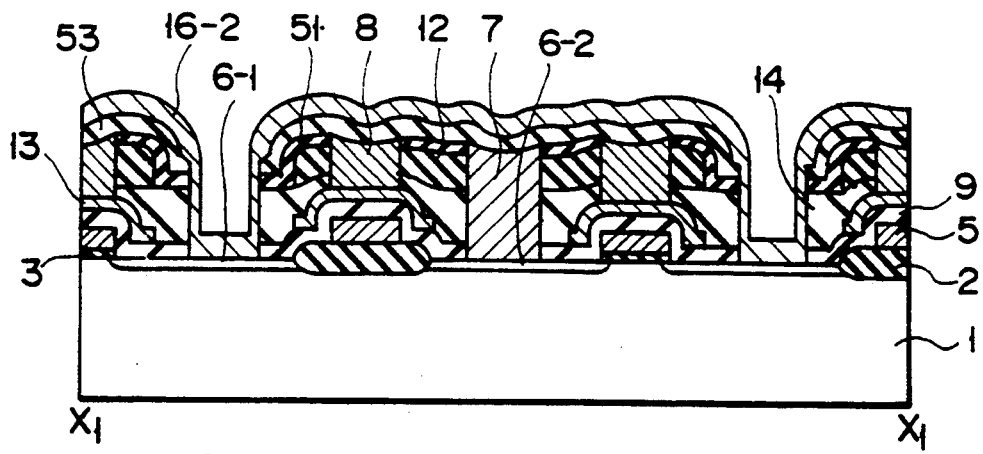
Figures 2, 13G:
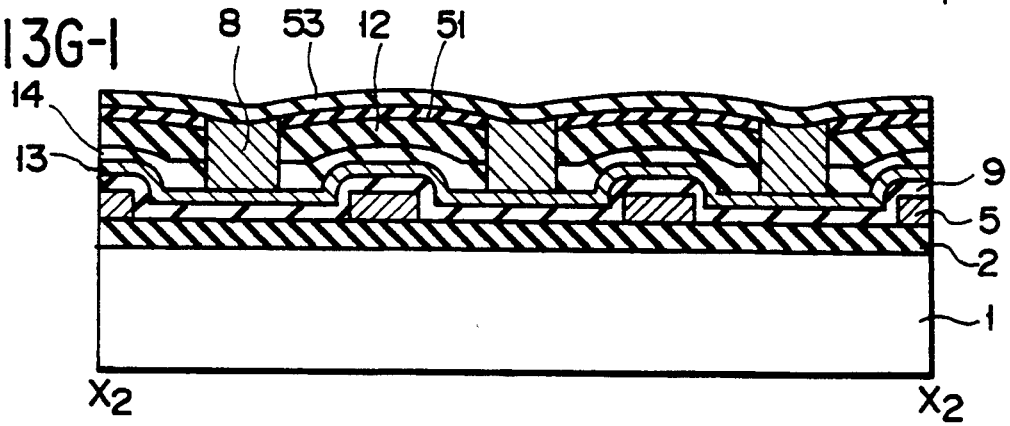
Figures 3, 13G:
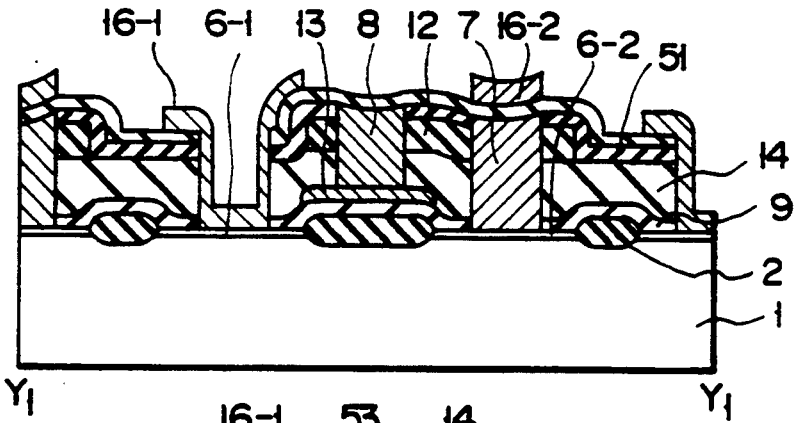
Figures 4, 13G:
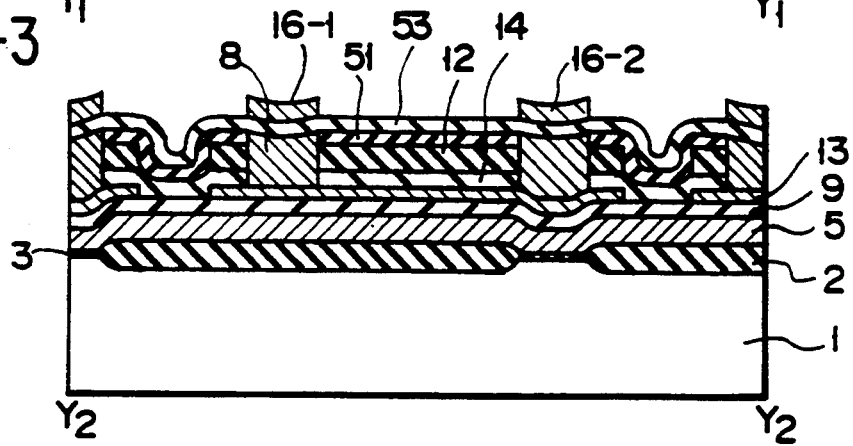
Figures 1, 13H:
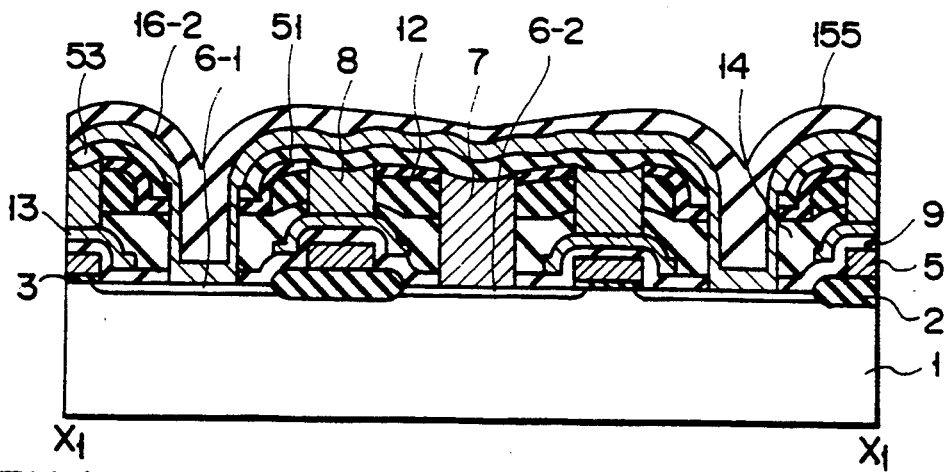
Figures 2, 13H:
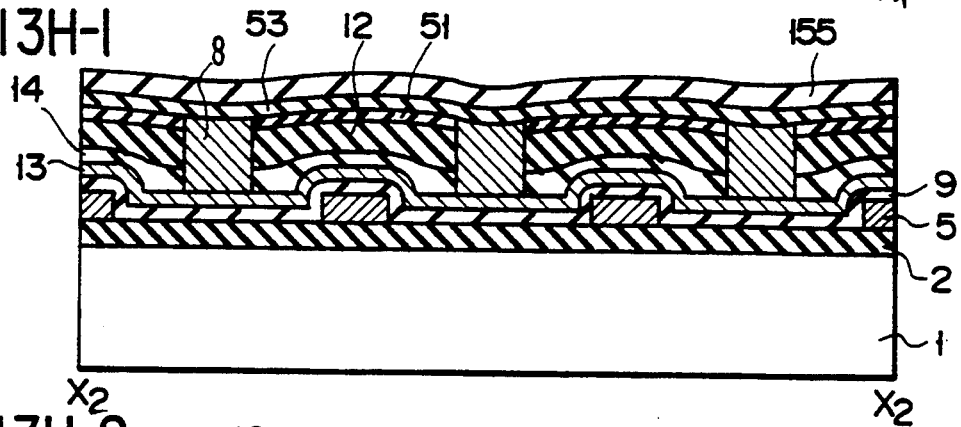
Figures 3, 13H:
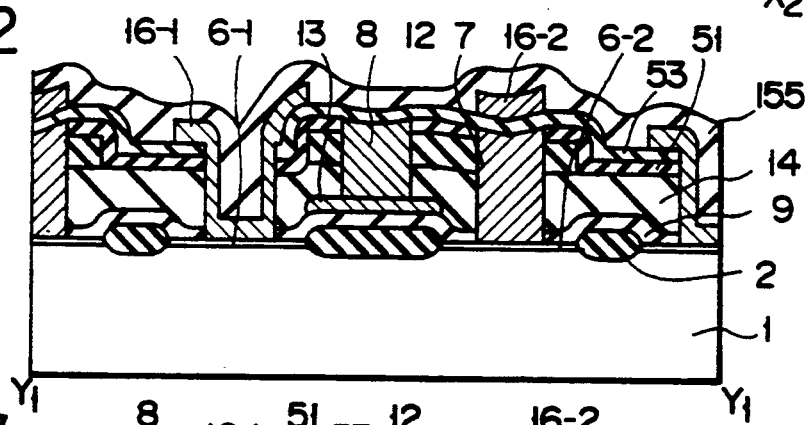
Figures 4, 13H:
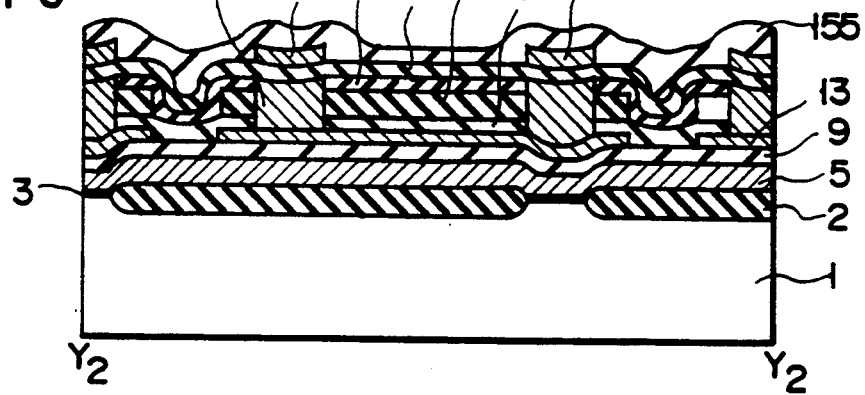

As shown in FIGS. 12G and 13G, a fourth insulating interlayer 53 consisting of, e.g., phosphorus silicate and having a thickness of about 10,000 Å is formed on the entire upper surface of the resultant structure by CVD or the like. Thereafter, a contact hole is formed in a region on each source 6-1 by reactive ion etching. Bit lines 16-1 and 16-2 (see FIG. 13G), each consisting of Al and having a thickness of about 6,000 Å, are formed in predetermined regions on the fourth insulating interlayer 53 including the contact holes to be parallel with the plate line 13 (see FIG. 13G).

In such a memory cell array, similar to the memory cell array shown in FIGS. 10A to 11I, the two bit lines 16-1 and 16-2 are formed to be symmetrical about each plate line 13, and these two bit lines 16-1 and 16-2 constitute a bit line pair.

Finally, as shown in FIG. 13H, a protective film 155 is formed on the entire upper surface of the resultant structure.

In the memory cell array using such vertical type ferroelectric capacitors, the area of a memory cell can be made smaller than that of a memory cell in the memory cell array using the planar type ferroelectric capacitor described above. Therefore, this memory cell array is advantageous to the realization of an increase in packing density.

More specifically, in a planar type ferroelectric capacitor, a reduction in area of a memory cell is theoretically limited by the need of the area required to hold charge stored in the capacitor. In contrast to this, in a vertical type ferroelectric capacitor, the area of an electrode of the capacitor can be increased by increasing the thickness of the ferroelectric film and increasing the depth of the hole formed therein without increasing a planar area. This indicates that even if a design rule of a minimm dimension is reduced, and the area of a memory cell is reduced, a means for theoretically holding a charge amount which can be stored by a capacitor can be provided.

In a planar type ferroelectric capacitor, a conductive layer is formed as the first electrode, and a ferroelectric film is formed thereon. In addition, a conductive layer is formed as the second electrode. When a voltage is applied between the first and second electrodes, an electric field is applied to the ferroelectric material. Conventionally, lead zirconate titanate is widely used as a ferroelectric material, and so is platinum as the first and second electrodes. This is because a conductive material other than platinum has not been found, which does not react with lead zirconate titanate at a lead zirconate titanate crystallization temperature, and on which a lead zirconate titanate crystal can be easily grown.

If, however, a perovskite crystal such as lead zirconate titanate is grown on platinum, since platinum and lead zirconate titanate have different lattice constants, innumerable dislocations and defects are caused at the interface. More specifically, a perovskite crystal structure has an oxygen octahedron as a constituent element. In this structure, oxygen octahedrons are three-dimensionally regularly arranged such that all the apexes of each oxygen octahedron are shared with adjacent oxygen octahedrons. There are innumerable types of crystal structures, similar to a perovskite crystal structure, which have an oxygen octahedron as a basic constituent element. For this reason, it is almost impossible to obtain stable crystal structures which are similar to a perovskite crystal structure but is different therefrom, in a condition in which innumerable dislocations and defects tend to occur at, e.g., an interface of crystals having different lattice constants.

In a planar ferroelectric capacitor, since an interface layer having a low dielectric constant, which is formed for the reason described above, is connected in series with a ferroelectric layer, the dielectric properties of the ferroelectric capacitor are deteriorated.

In contrast to this, in a vertical type ferroelectric capacitor, since the above-mentioned interface layer having a low dielectric constant is connected in parallel with a ferroelectric layer, a decrease in dielectric constant is not caused by the interface layer, and excellent dielectric properties can be obtained.

Figure 14:
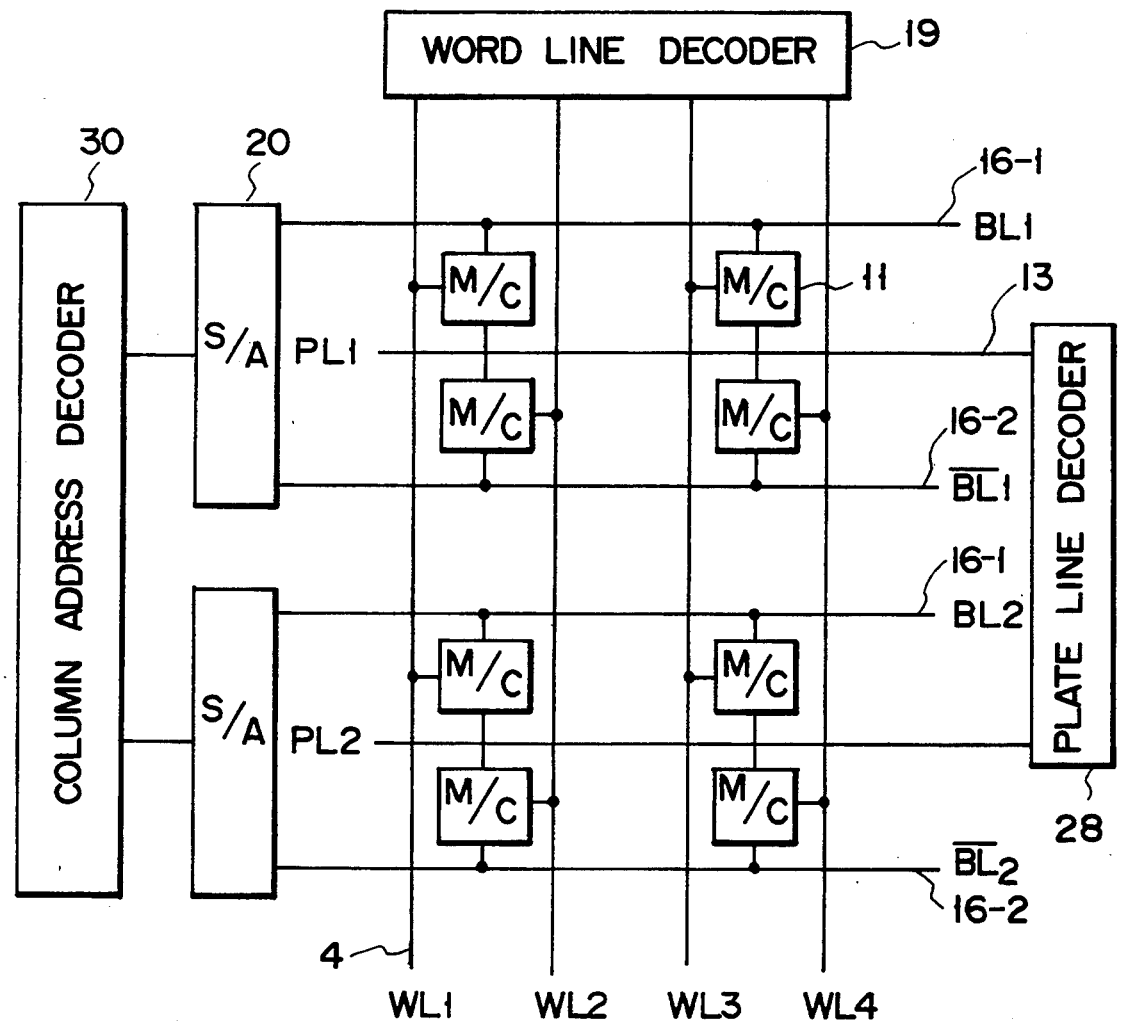
FIG. 14 is a block diagram showing an arrangement of memory cells and sense amplifiers according to the present invention.

Furthermore, in the present invention, the above-described memory cell is connected to a sense amplifier through a bit line. FIG. 14 shows a layout of memory cells and sense amplifiers according to the present invention. A semiconductor memory device having this layout will be described below.

In the semiconductor memory device having the layout shown in FIG. 14, two bit lines 16-1 and 16-2 formed on both sides of a plate line 13, i.e., a bit line pair, are connected to a sense amplifier 20. With this arrangement, memory cells (M/C) 11 in the same column are all connected to the same sense amplifier 20 through the bit line pair. This sense amplifier 20 amplifies a slight potential difference between the bit line pair which is caused upon driving of the memory cell 11 in a read operation, thus reading out information from the memory cell 11. In this case, in the semiconductor memory device, when one word line 4 and one plate line 13 are selected by row and column addresses, only the single memory cell 11 selected by the product of the row and column addresses is driven. Therefore, only the sense amplifier 20 in each column to which the memory cell 11 belongs is required to be activated, and other sense amplifiers 20 need not be activated.

More specifically, in the semiconductor memory device having the layout shown in FIG. 14, one word line 4 is selected by a word line decoder 19. At this time, although the MOS transistors of the two memory cells 11 connected to the selected word line 4 are turned on, since the potentials of the bit lines 16-1 and 16-2 and the plate line 13 are set to be the same in advance, no charge is transferred from the ferroelectric capacitor to the bit lines 16-1 and 16-2 by only this selection.

In the semiconductor memory device, one plate line 13 is selected by a plate line decoder 28. At this time, the potential of the selected plate line 13 is set such that the potential difference the plate line 13 and the bit line pair formed on both side thereof becomes a threshold voltage corresponding to a coercive field of ferroelectrics or more which is required to reverse the polarization of the ferroelectric capacitor of the memory cell 11. Therefore, of the memory cells 11 connected to the selected plate line 13, the memory cell 11 whose MOS transistor is turned on when the word line 4 is selected, i.e., the single memory cell 11 connected to both the selected word line 4 and the selected plate line 13, causes the charge in the ferroelectric capacitor to be transferred to the bit lines 16-1 and 16-2.

At this time, only the sense amplifier 20 connected to these bit lines 16-1 and 16-.2 is activated by a sense amplifier selector 30 to amplify a slight potential difference between the bit line pair connected to the sense amplifier 20, thereby reading out information from the selected memory cell 11.

As shown in FIG. 14, in the semiconductor memory device according to the present invention, when one word line and one plate line are selected, only a single memory cell connected to the selected lines is driven, and only a sense amplifier in the column to which the selected memory cell belongs is activated, but other sense amplifiers are not activated. This contributes to a decrease in power consumption, an increase in operation speed, and prolongation of the service life of the semiconductor memory device.

Figure 15:
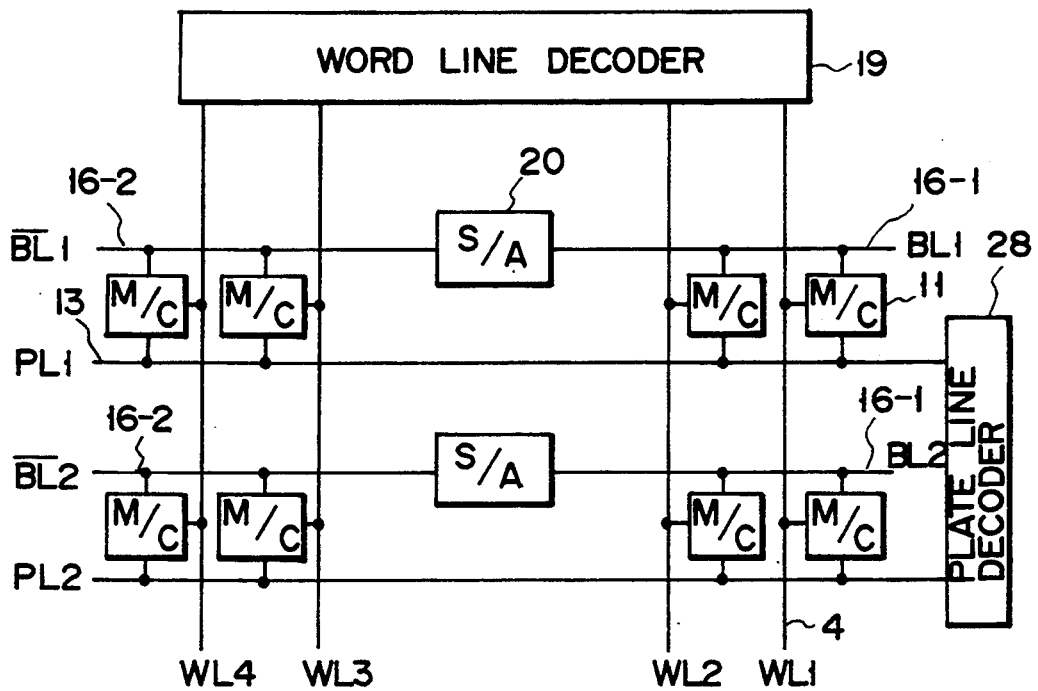
FIG. 15 is a block diagram showing another arrangement of memory cells and sense amplifiers according to the present invention.

Furthermore, in the present invention, a bit line pair connected to one sense amplifier may be formed on both sides of this sense amplifier. FIG. 15 is a block diagram showing such a semiconductor memory device. In this semiconductor memory device, for a reason similar to the reason described above, it is also preferable that the number of memory cells connected to one of the two bit lines constituting the bit line pair is the same as that of memory cells connected to the other. In addition, in this case, the first memory group connected to one of the two bit lines and the second memory cell group connected to the other are preferably formed to be symmetrical about the sense amplifier.

Figure 16:
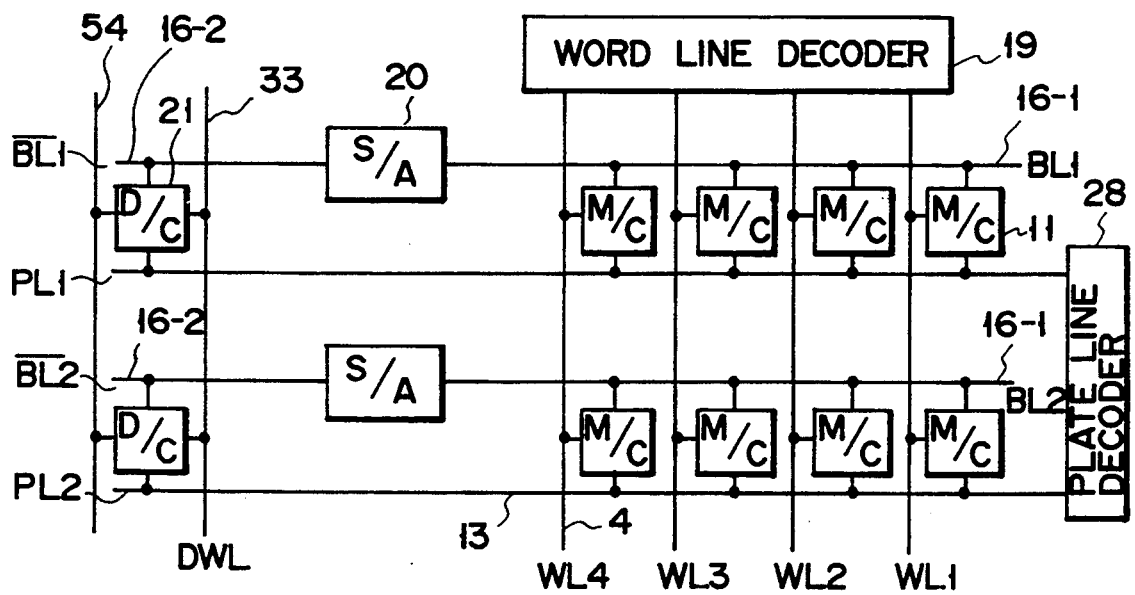
FIG. 16 is a block diagram showing still another arrangement of memory cells and sense amplifiers according to the present invention.

FIG. 16 is a block diagram showing a semiconductor memory device in which all the memory cells are connected to one bit line 16-1 of two bit lines constituting a bit line pair. Referring to FIG. 16, each dummy cell (D/C) 21 is connected to the other bit line 16-2 to which no memory cells are connected. The dummy cell 21 serves to set the bit line 16-2 at a reference potential.

FIG. 17 is a circuit diagram of the dummy cell 21. As shown in FIG. 17, the dummy cell 21 has one MOS transistor 17 and one capacitor 50. Similar to a memory cell, the dummy cell 21 has a bit line 16 and a plate line 13 connected to each other. The gate electrode of the MOS transistor 17 is connected to a dummy word line (DWL) 33 which is formed to cross the bit line 16 and the plate line 13 at right angles. In the dummy cell 21, a potential $V_{DC}$ can be written in a capacitor 50 in response to a signal input from a dummy write power source line 54, as needed. In such a semiconductor memory device, a means other than a dummy cell may be used to set one bit line not connected to memory cells at a reference potential.

As described above, according to the present invention, a bit line pair connected to one sense amplifier may be formed on both sides thereof. Such a semiconductor memory device, however, is susceptible to the influences of noise due to a signal line, e.g., a word line, crossing bit lines at right angles, in comparison with a semiconductor memory device in which a bit line pair is formed on both sides of a plate line. When, for example, a signal is input to one word line, the potential of a bit line crossing the word line is changed due to the influences of a parasitic capacitance between the word line and the bit line. At this time, if the bit line pair are formed on both sides of the sense amplifier as shown in FIG. 15, the potential of one of the two bit lines constituting the bit line pair is changed, but the potential of the other bit line is not changed. That is, in the semiconductor memory device having such a layout, when a signal is input to a word line, a potential difference is caused between the corresponding bit line pair, and an erroneous operation may be caused.

In contrast to this, in the semiconductor memory device in which a bit line pair are formed on both sides of a plate line as shown in FIG. 14, since the two bit lines constituting the bit line pair cross all the word lines, even if a signal is input to a word line, the potential difference between the corresponding bit line pair is small, and the possibility of an erroneous operation is low. In the semiconductor memory device of the present invention, therefore, it is preferable that a bit line pair are formed on both sides of a plate line, because such a structure is not easily influenced by noise from a signal line such as a word line.

Figure 18:
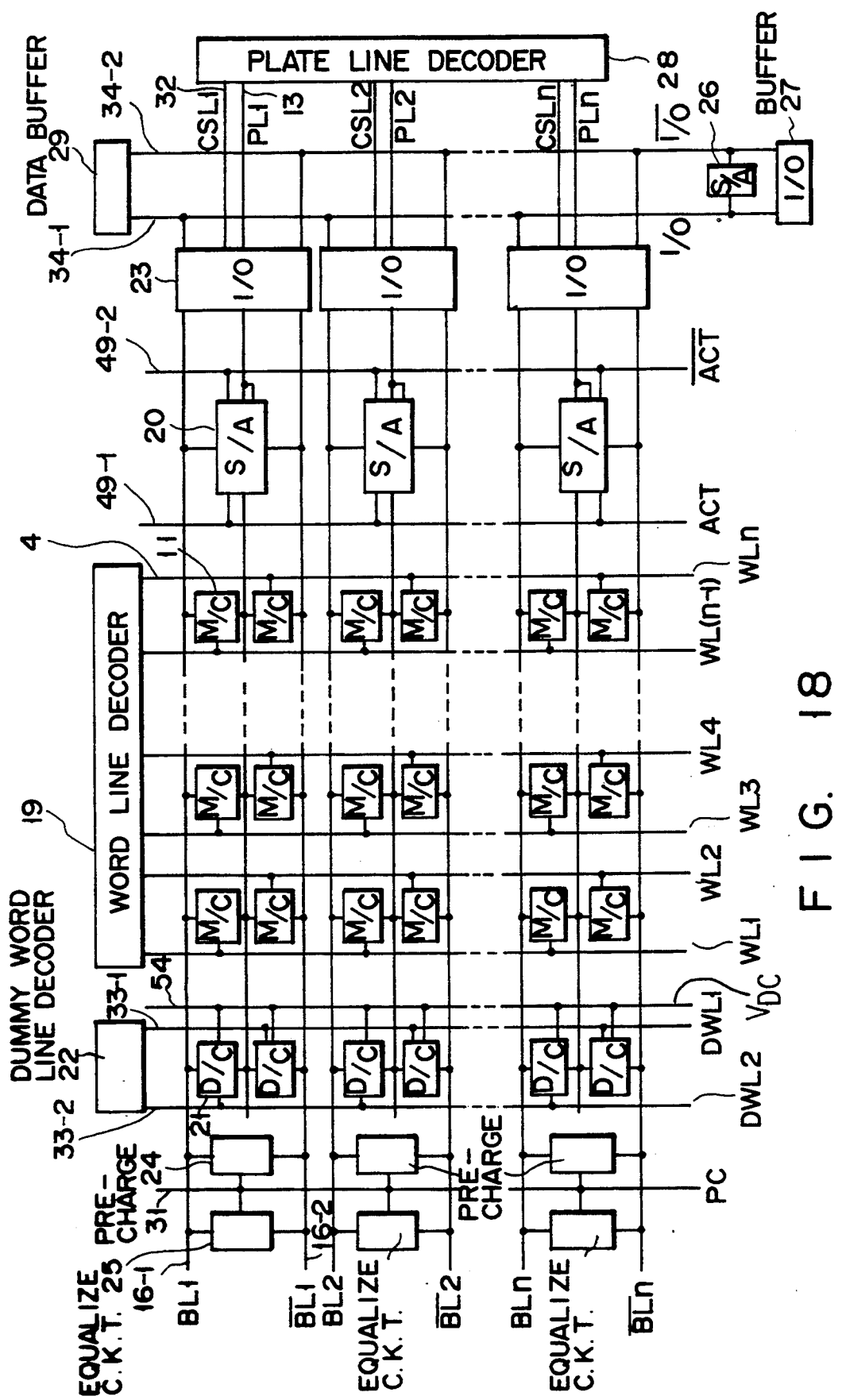
FIG. 18 is a block diagram showing a semiconductor memory device according to an embodiment of the present invention.

According to the present invention, proper peripheral circuits are added to the above-described memory cell array to constitute a semiconductor memory device capable of writing, retaining, and reading out digital information in and from an arbitrary memory cell. FIG. 18 is a block diagram showing a semiconductor memory device according to an embodiment of the present invention.

The semiconductor memory device shown in FIG. 18 is formed by adding the following components to the memory cell array shown in FIG. 7: a word line decoder 19, sense amplifiers 20, dummy cells 21, a dummy word line decoder 22, I/O connecting circuits 23, precharge circuits 24, equalizing circuits 25, an I/O line sense amplifier 26, a data output buffer circuit 27, a plate line decoder 28, and a data input buffer circuit 29.

In this semiconductor memory device, the sense amplifiers 20, the I/O connecting circuits 23, the precharge circuits 24, and the equalizing circuits 25 are arranged in units of columns, and the sense amplifiers 20 and the I/O connecting circuits 23 are connected to the plate line decoder 28 through plate lines 13 and column address select line (CSL) 32, respectively, so as to be selected by a column address. The precharge circuit 24 and the equalizing circuits 25 receive signals through precharge circuit driving lines 31.

In the semiconductor memory device shown in FIG. 18, the column address select lines 32 are activated by the plate line decoder 28. That is, the plate line decoder 28 also serves as a column address select line decoder. In the present invention, however, a column address select line decoder may be arranged independently of the plate line decoder 28.

The dummy cells 21 are connected to bit line 16-1 or 16-2 and the plate lines 13., and each of the bit lines 16-1 and 16-2 is connected to one dummy cell 21. In addition, the dummy cells 21 are connected to the dummy word line decoder 22 through dummy word lines (DWLs) 33. In this case, a pair of dummy cells 21 connected to the two bit lines 16-1 and 16-2 constituting a bit line pair is connected to dummy word lines in such a manner that one dummy cell is connected to a dummy word line (DWL1) 33-1, and the other dummy cell is connected to a dummy word line (DWL2) 33-2.

I/O lines 34-1 and 34-2 connected to the bit line pairs through the I/0 connecting circuits 23 are connected to the I/O line sense amplifier 26, the data output buffer circuit 27, and the data input buffer circuit 29.

Such peripheral circuits will be described in detail below.

Figure 19:
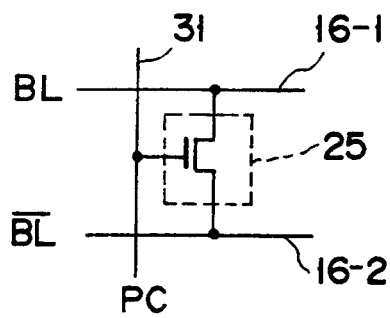
FIG. 19 is a circuit diagram showing an arrangement of an equalizing circuit used in the present invention.
Figure 20:
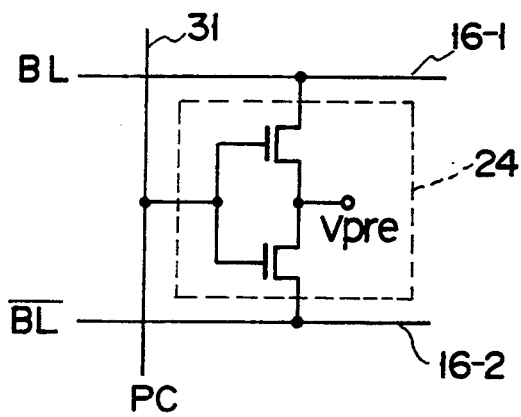
FIG. 20 is a circuit diagram showing an arrangement of a precharge circuit used in the present invention.

FIG. 19 is a circuit diagram showing an equalizing circuit used in the semiconductor memory device described above. FIG. 20 is a circuit diagram showing a precharge circuit.

The equalizing circuit 25 (see FIG. 19) serves to equalize the potentials of a bit line pair. When a signal on the precharge circuit driving line (PC) 31 is set at a high (H) level, the potentials of the bit lines 16-1 and 16-2 are set to be equal to each other. The precharge circuit 24 (see FIG. 20) serves to precharge the bit lines 16-1 and 16-2. When a signal from the precharge circuit driving circuit 31 is set at H level, the bit lines 16-1 and 16-2 are charged to $V_{pre}$. When a signal on the precharge circuit driving line 31 is set at a low (L) level, the bit line pair are disconnected from each other and from $V_{pre}$. As a result, the bit lines 16-1 and 16-2 are set in a floating state. Note that both the equalizing circuit and the precharge circuit described above are connected to the same signal line, i.e., the precharge circuit driving line 31. In the present invention, however, the equalizing circuit and the precharge circuit may be connected to different signal lines to be independently controlled.

Figure 21:
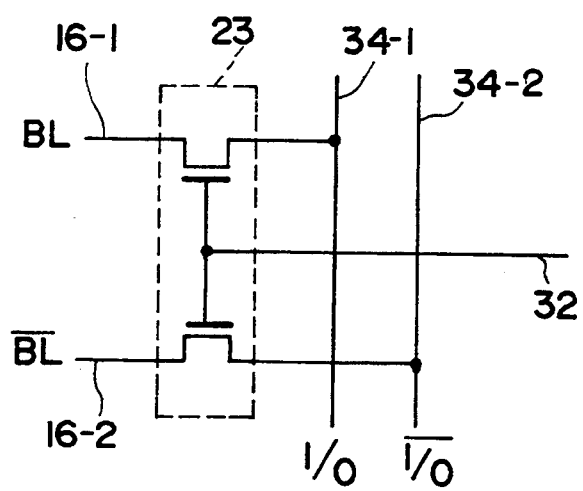
FIG. 21 is a circuit diagram showing an arrangement of an I/O connecting circuit used in the present invention.

FIG. 21 is a circuit diagram of the above-mentioned I/O connecting circuit 23. In the I/O connecting circuit 23, when a signal on the column address select line 32 is at H level, the two bit lines 16-1 and 16-2 constituting a bit line pair are respectively connected to two I/O lines (I/O) 34-1 and ($\overline{I/O}$) 34-2 constituting an I/O line pair. In the semiconductor memory device having the arrangement shown in FIG. 18, when one of the column address select lines 32 is selected by the plate line decoder 28, the I/O connecting circuit 23 in the corresponding column is driven to transfer information between the bit line pair 16-1 and 16-2 and the I/O line pair 34-1 and 34-2.

In addition, in the semiconductor memory device of the present invention, the flip-flop type sense amplifier shown in FIG. 22 can be used. A sense amplifier 20 having such an arrangement is activated upon reception of sense amplifier activating signals $\phi ACT$ and $\overline{\phi ACT}$ from sense amplifier activating lines ($\overline{ACT}$) 49-1 and ($\overline{ACT}$) 49-2.

A dummy cell having the arrangement shown in FIG. 17 may be used in the present invention.

A method of operating the semiconductor memory device of the present invention, which has the above-described arrangement, will be described below with reference to FIG. 23. Note that throughout the specification and Figures, a signal may be illustrated as a specific signal (e.g. BL1 indicated bit line 1). However, the corresponding description in the specification may generically refer to the signal (e.g. BL). This is because the specific signal illustrated can behave in the same manner for each memory cell within a memory array. This may apply to signals such as WL, DWL, PL, BL, and CSL, for example, which are fully explained below.

The semiconductor memory device of the present invention is set in a precharge state or an active state during an operation. Selection of such two states is performed by, e.g., a one-pin control signal $\overline{CE}$ (chip enable signal).

Figure 23:
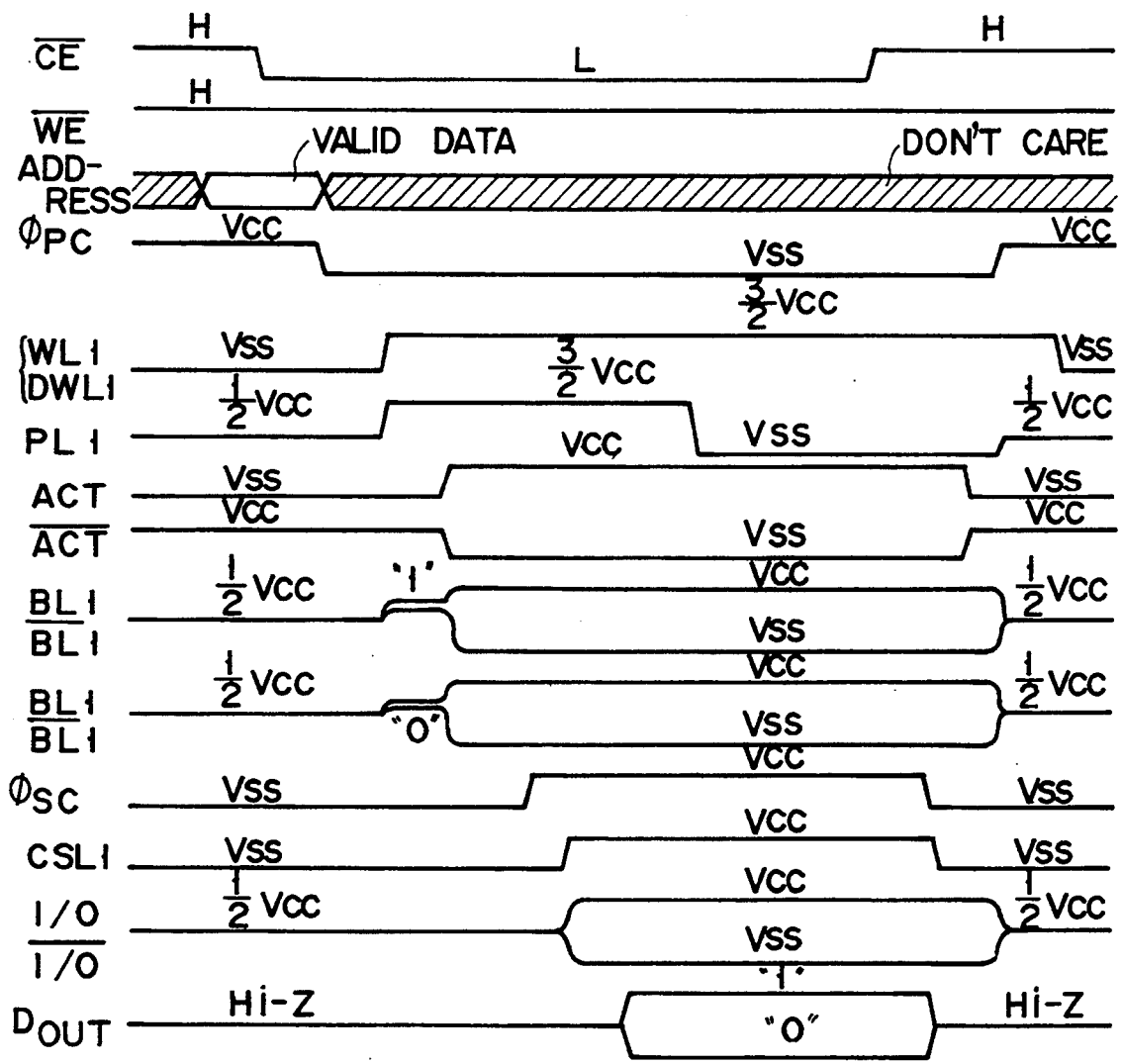
FIG. 23 is a timing chart showing the timing of each operation when information is read out from the semiconductor memory device in FIG. 18.

FIG. 23 is a timing chart showing the timing of each operation when information is read out from the semiconductor memory device. As information is being read, the write enable signal $\overline{WE}$ is high. FIG. 23 shows a case wherein a word line WL1 is selected as one of the word lines 4, and a plate line PL1 is selected as one of the plate lines 13.

In the semiconductor memory device, when the control signal $\overline{CE}$ is at H level, and the potential of a precharge signal $\phi_{pC}$ transferred from the precharge circuit driving line PC is set in a precharge state of $V_{CC}$, all the word line WL1 and dummy word lines DWL1 and DWL2 (see FIG. 18) are set in a non-selected state, and the bit lines (BL1) 16-1 and ($\overline{BL1}$) 16-2 are precharged to $\frac{1}{2} V_{CC}$ through a bit line charge power source line $V_{BC}$. The upper BL1 and $\overline{BL1}$ are signals for a "1" read and the lower BL1 and $\overline{BL1}$ are for a "0" read. Similarly, the I/O lines (I/O) 34-1 and ($\overline{I/O}$) 34-2 are precharged to $\frac{1}{2} V_{CC}$. At this time, the potential of the plate line (PL1) 13 is also $\frac{1}{2} V_{CC}$. In addition, a potential $V_{DC}$ (see FIG. 18) is written in the dummy (D/C) 21 through a dummy cell write power source line 54.

When the control signal $\overline{CE}$ goes to L level, and potential of the precharge signal $\phi_{pC}$ is changed from $V_{CC}$ to $V_{SS}$ so that an address is fetched, one word line (WL1) 4 and one dummy word line (DWL1) 33-1 are selected by a row address signal R/A. The potentials of the selected word line (WL1) 4 and the selected dummy word line (DWL1) 33-1 are boosted from $V_{SS}$ to $3/2$ $V_{CC}$, and the lines are activated. If, however, the word line (WL1) 4 connected to the memory cell (M/C) 11 connected to the bit line 16-1 is selected, the dummy word line (DWL1) 33-1 connected to the dummy cell 21 connected to the bit line 16-1 is selected. In contrast to this, if the word line (WL2) 4 connected to the memory cell 11 connected to the bit line 16-2 is selected, the dummy word line (DWL2) 33-2 connected to the dummy cell 21 connected to the bit line 16-2 is selected. The potentials of the selected word line (WL1) 4 and the selected dummy word line (DWL1) 33-1 may be set to $V_{CC}$, but are preferably set to $3/2$ $V_{CC}$, as described above.

At substantially the same time, one of the plate lines (PL1) 13 is selected by a column address signal C/A, and the potential of the selected plate line (PL1) 13 is boosted from $\frac{1}{2}$ $V_{CC}$ to $3/2$ $V_{CC}$. With this operation, information stored in the memory cell 11 connected to the selected word line (WL1) 4 and the selected plate line (PL1) 13 is transferred to the bit line 16-1 or 16-2 connected to the corresponding memory cell 11. For example, in the case shown in FIG. 23, information stored in the memory cell 11 is transferred to the bit line 16-1.

A case wherein the above-mentioned information is transferred to the bit line 16-1 will be described below. At this time, the potential of the bit line 16-1 is greatly increased, when the information stored in the memory cell 11 is "1" (see top "BL1" labeled "1"), and is slightly increased when the information is ∂0" (see bottom BL1 labeled "0"). In this case, the other bit line 16-2 which constitutes a bit line pair together with the bit line 16-1 has a potential between the potentials of the bit line 16-2 which are respectively set when the pieces of information are "1" and "0". In spite of the fact that charge is transferred from the dummy cell D/C to the bit line 16-2, the bit line 16-2 has the above potential because the capacity of the dummy cell 21 and the potential $V_{DC}$ to be written therein are designed such that the bit line 16-2 has such a potential.

In this case, since the bit lines 16-1 and 16-2 and the plate line 13, which are connected to the memory cell 11 connected to the selected word line (WL1) 4 and the non-selected plate line 13., are set at the same potential, i.e., $\frac{1}{2} V_{CC}$, there is no possibility that information stored in the memory cell 11 is extracted to the bit lines 16-1 and 16-2.

When the information stored in the memory cell (M/C) 11 is extracted to the bit line (BL1) 16-1, and a potential difference occurs between the bit line pair as described above, the sense amplifier activating signals $\phi_{ACT}$ and $\overline{\phi_{ACT}}$ are input to the sense amplifier (S/A) 20 to activate it. Since the sense amplifier 20 has the circuit shown in FIG. 22, only the sense amplifier in the same column as that of the memory cell 11 from which the information is extracted is activated. In this embodiment, the sense amplifiers 20 are selected by the plate lines (PL) 13. In the present invention, however, lines for selecting the sense amplifiers 20 are not limited to the plate lines 13, but the plate line 13 shown in FIG. 22 may be replaced with a control line exclusively used for selecting the sense amplifier 20.

When the potential difference between the bit line pair is amplified by the sense amplifier (S/A) 20, a column select signal $\phi_{SC}$ is input to the plate line decoder 28 to select the column address select line (CSL1) 32 in the same column as that of the plate line (PL1) 13 which is previously selected by the column address signal C/A. With this operation, the I/O connecting circuit 23 in the selected column is driven, and the information extracted to the bit lines 16-1 and 16-2 is transferred to the I/O lines (I/O) 34-1 and $(\overline{I/O})$ 34-2. As a result, a potential difference is caused between the two I/O lines 34-1 and 34-2, i.e., the I/O line pair. Thereafter, the potential difference between the I/O line pair is amplified by the I/O line sense amplifier 26, and information of logic "1" or "0" is read out as an output signal $D_{out}$ by the data output buffer circuit 27.

In such semiconductor memory device, when the information is extracted from the memory cell (M/C) 11 by the above-described operation, the information stored in the memory cell 11 is erased. Therefore, after the information is read out, identical information must be written in the memory cell 11. That is, in a read operation of such a semiconductor memory device, when the information in the memory cell 11 is externally output, an operation of rewriting information in the memory cell 11 is always performed. A rewrite operation of the semiconductor memory device of the present invention will be described below.

Figure 24:
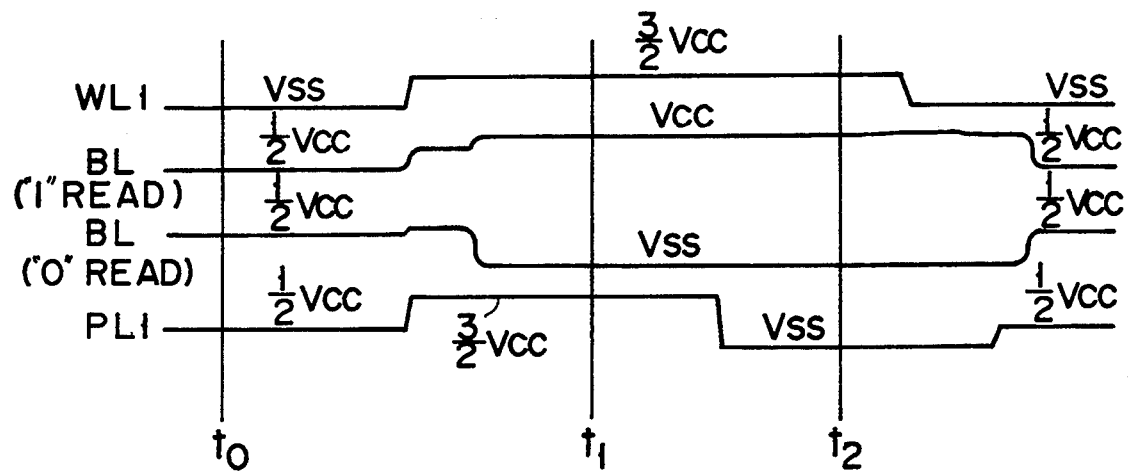
FIG. 24 is a timing chart showing the timing of each operation when information is rewritten in the semiconductor memory device in FIG. 18.
Figure 25:
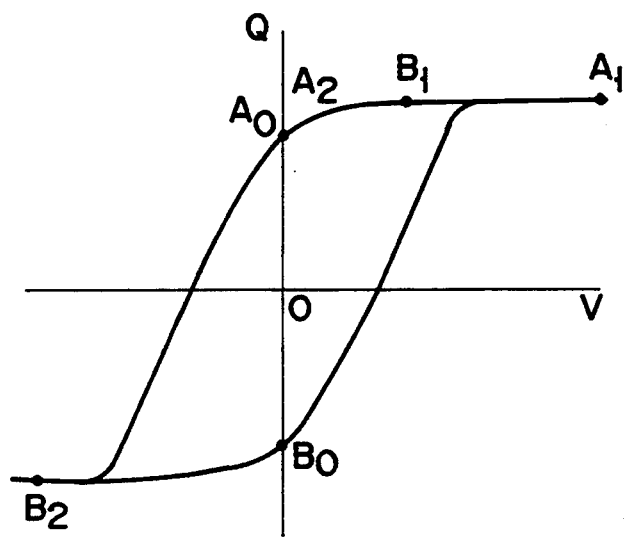
FIG. 25 is a graph showing a change in the amount of charge stored in a ferroelectric capacitor according to the present invention as a function of time in a rewrite operation.

FIG. 24 is a timing chart showing the timing of each operation when information is rewritten in the semiconductor memory device. FIG. 25 is a graph showing a change in the amount of charge stored in a ferroelectric capacitor constituting a memory cell of the semiconductor memory device, in a rewrite operation. Referring to FIG. 25, $A_0$, $A_1$, and $A_2$ indicate that the information stored in the memory cell is "0", and $B_0$, $B_1$, and $B_2$ indicate that the information stored in the memory cell is "1".

As shown in FIG. 24, if initial ($t_0$) information in the accessed memory cell (M/C) 11 is "0" ($A_0$ in FIG. 25), at the end of the above-described read operation ($t_1$), the potential of the bit line (BL) 16-1 is $V_{SS}$, and the potential of the plate line (PL1) 13 is 3/2 $V_{CC}$. Therefore, information of "0" is rewritten ($A_1$ in FIG. 25) in this memory cell (M/C) 11 at this time As in FIG. 23, WL1 is a word line. Note that throughout the timing diagrams, signal labels designate the same signal and a complete description of each signal in each timing diagram may have been omitted for clarity and brevity.

If the initial ($t_0$) information in the memory cell (M/C) 11 is "1" ($B_0$ in FIG. 25), at the end of the read operation ($t_1$), the potential of the bit line (BL) 16-1 is $V_{CC}$, and the potential of the plate line (PL1) 13 is 3/2 $V_{CC}$. At this time ($t_1$), no rewrite operation is performed ($B_1$ in FIG. 25). As shown in FIG. 24, when the potential of the plate line PL1 13 is lowered, information of "1" is rewritten in the memory cell (M/C) 11 ($B_2$ in FIG. 25) at a time point ($t_2$), since the potential of the bit line (BL) 16-1 is $V_{CC}$.

If the initial ($t_0$) information in the memory cell (M/C) 11 is "0", the potentials of the bit line (BL) 16-1 and the plate line PL1 13 are equalized to be $V_{SS}$ at the time point ($t_2$). In the semiconductor memory device shown in FIG. 18, however, since a ferroelectric capacitor is used for the memory cell (M/C) 11, even if the potentials of the two electrodes of the ferroelectric capacitor are equalized, the charge stored in the capacitor is retained. Therefore, at this point ($t_2$), information of "0" is stored ($A_2$ in FIG. 25) in the memory cell (M/C) 11.

When rewriting of the information in the accessed memory cell (M/C) 11 is completed with such an operation, the control signal $\overline{CE}$ goes from L level to H level, and the semiconductor memory device shown in FIG. 18 is set in a precharge state. More specifically, the potential of the precharge signal $\phi_{PC}$ is changed from $V_{SS}$ to $V_{CC}$, and the bit lines (BL) 16-1 and $(\overline{BL})$ 16-2 are precharged to $\frac{1}{2} V_{CC}$. Similarly, the potentials of the plate line (PL1) 13 and the I/O line (I/O) 34-1 and $(\overline{I/O})$ 34-2 are set to $\frac{1}{2} V_{CC}$. As a result, the input operation of the sense amplifier activating signals $\phi_{ACT}$ and $\overline{\phi_{ACT}}$ and of the column select signal $\phi_{SC}$ is stopped, and the potential $V_{DD}$ is written in the dummy cell (D/C) 21. Thereafter, the word line (WL1) 4 and the dummy word line (DWL1) 33-1 which have been selected are restored to the nonselected state, thus completing a read cycle.

Figure 26:
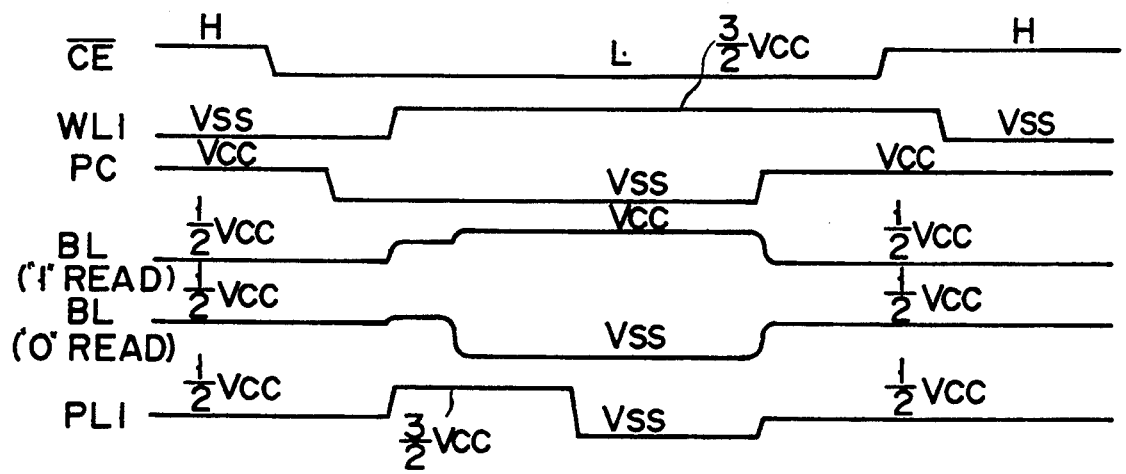
FIG. 26 is a timing chart showing another example of the timing of each operation when information is read out from the semiconductor memory device in FIG. 18.

An embodiment of a read operation of the semiconductor memory device of the present invention has been described above. In the present invention, the timing of each operation in the read mode is not limited to that described above. For example, upon completion of a rewrite operation, the bit lines (BL) 16-1 and $(\overline{BL})$ 16-2 may be precharged while the control signal $\overline{CE}$ is at L level, and after the potential of the plate line (PL) 13 is restored to $\frac{1}{2} V_{CC}$, and the control signal $\overline{CE}$ is restored to H level, the word line (WL1) 4 and the dummy word line (DWL1) 33-1 may be restored to the nonselected state. FIG. 26 shows the timing of each operation when a read operation is performed in the above-described manner.

Figure 27:
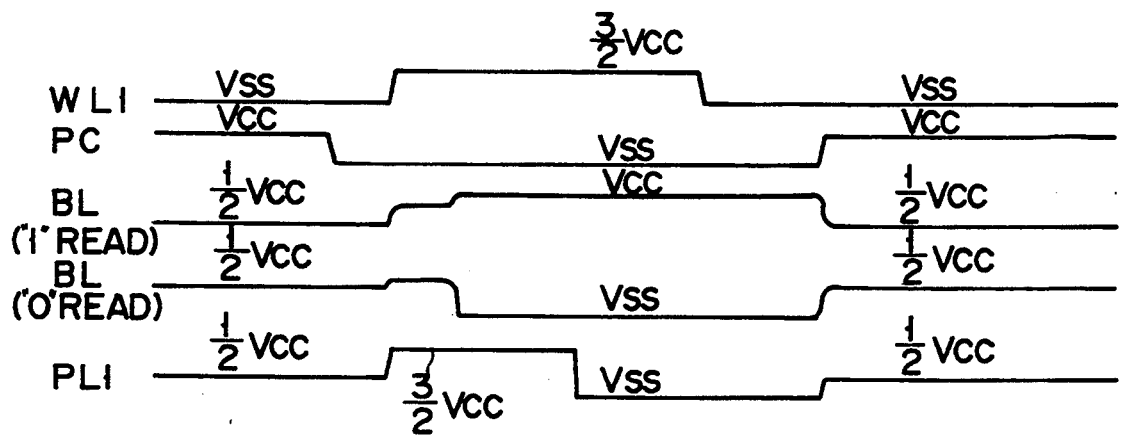
FIG. 27 is a timing chart showing still another example of the timing of each operation when information is read out from the semiconductor memory device in FIG. 18.

As shown in FIG. 27, in the present invention, after the word line (WL1) 4 and the dummy word line (DWL1) 33-1 are restored to the non-selected state, the bit line pair may be precharged, and the potential of the plate line (PL1) 13 may be restored to $\frac{1}{2} V_{CC}$.

A write operation (early write operation) of the semiconductor memory device shown in FIG. 18 will be described below.

FIG. 28 is a timing chart showing the timing of each operation when information is written in the semiconductor memory device. If a signal $\overline{WE}$ (write enable signal) is at L level when the control signal $\overline{CE}$ is changed from H level to L level, an input signal $D_{in}$ is fetched into the chip through the data input buffer circuit 29, and its information is transferred to the I/O lines (I/O) 34-1 and $(\overline{I/O})$ 34-2. Subsequently, when the column select signal $\phi_{SC}$ is input to the plate line decoder 28 to select the column address select line (CSL1) 32, the I/O connecting circuit 32 in the selected column is driven to transfer the information to the bit lines (BL1) 16-1 and $(\overline{BL1})$ 16-2. Thereafter, the word line (WL1) 4 is selected, and a write operation is performed in the same manner as in the above-described rewrite operation, thereby writing the information in the target memory cell (M/C) 11.

In this write operation, either of a boosting operation of the word line (WL1) 4 and the plate line (PL1) 13 and a connecting operation of the bit line pair and the corresponding I/O line pair may be performed first.

Referring to FIG. 28, the sense amplifier (S/A) 20 in the selected column is activated. In the present invention, however, a write operation can be performed without activating the sense amplifier (S/A) 20. In this case, the potential of the column address select line (CSL1) 32 is boosted to 3/2 $V_{CC}$ to operate a transfer gate of the I/O connecting circuit 23 as a triode.

FIG. 28 shows a case wherein the potential of the selected plate line (PL1) 13 is boosted first to 3/2 $V_{CC}$ in the same manner as in a read operation. In a write operation, however, the potential of the plate line (PL1) 13 may be boosted first to $V_{CC}$.

An operation of continuously performing a write operation after a read operation (read/modify/write operation) in the semiconductor memory device shown in FIG. 18 will be described below.

Figure 29:
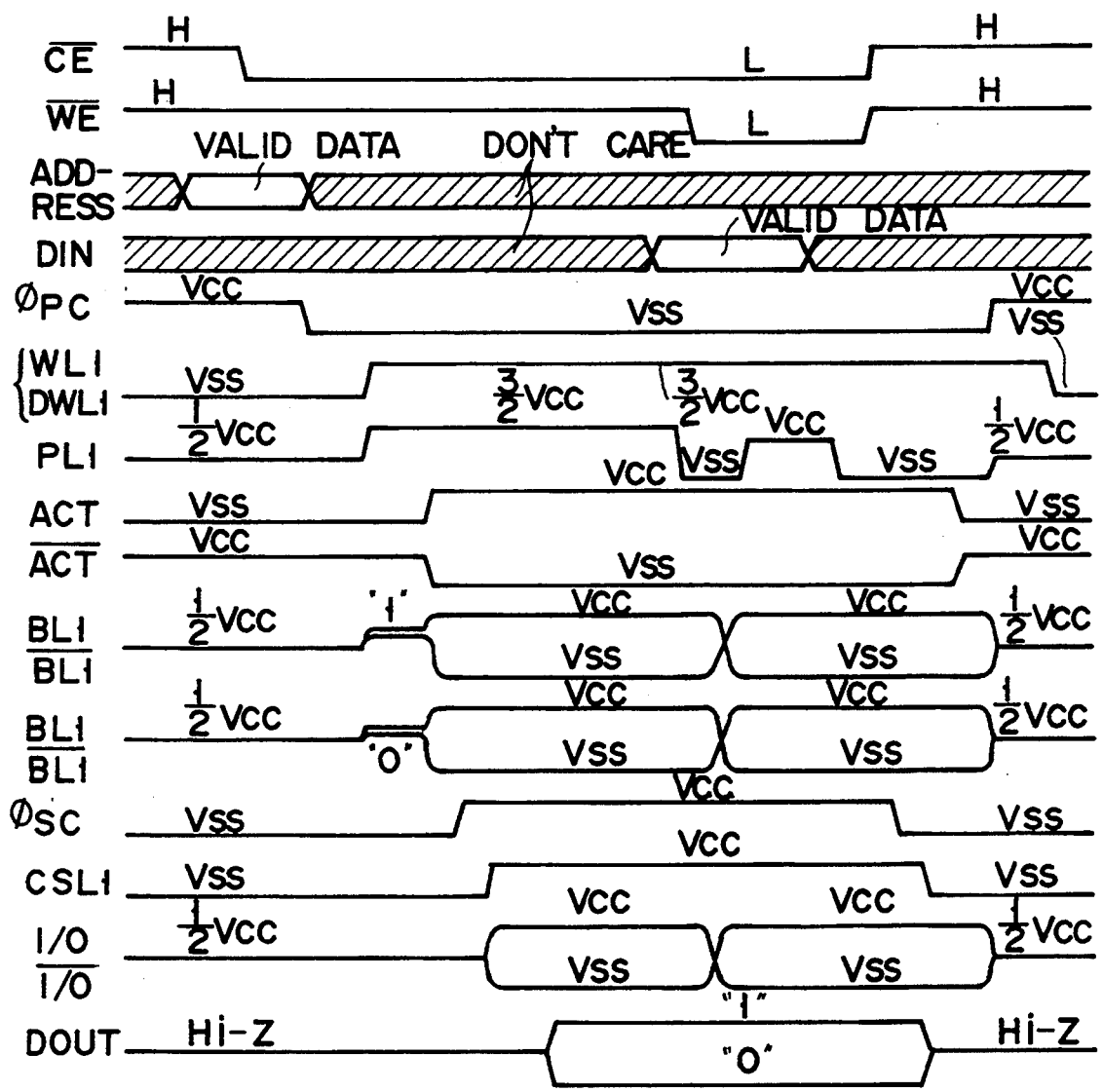
FIG. 29 is a timing chart showing the timing of each operation when a read/modify/write operation is performed with respect to the semiconductor memory device in FIG. 18.

FIG. 29 is a timing chart showing the timing of each operation in the read/modify/write mode of the semiconductor memory device. In the read/modify/write mode, a read operation is performed in the same manner as described above. After information is read out as the output signal $D_{out}$, the write enable signal $\overline{WE}$ is changed from H level to L level to start a write operation. Subsequently, a write operation is performed in the same manner as described above. With this operation, after a read operation is performed with respect to the memory cell (M/C) 11, a write operation can be performed with respect to the same memory cell (M/C) 11. Note that FIG. 29 shows a case wherein after information is read out from the memory cell (M/C) 11, information reverse to the information which has been stored in the memory cell (M/C) 11 is written therein. In the case shown in FIG. 29, the potential of the plate line (PL1) 13 is boosted to $V_{CC}$ after the read operation. However, similar to the above-described write operation, the potential of the plate line (PL1) 13 may be boosted to 3/2 $V_{CC}$.

In the above-described operating method, the potential of each of the bit lines (BL1) 16-1 and $(\overline{BL})$ 16-2 and the plate line (PL1) 13 in a precharge state is set to be ½ $V_{CC}$. However, the present invention is not limited to this, but the potential of each of the bit lines (BL1) 16-1 and $(\overline{BL1})$ 16-2 and the plate line (PL1) 13 in a precharge state may be set to be different from the above value. A case wherein the potential of each of the bit lines and the plate line (PL1) 13 is set to be a value other than ½ $V_{CC}$ will be described below.

Figure 30:
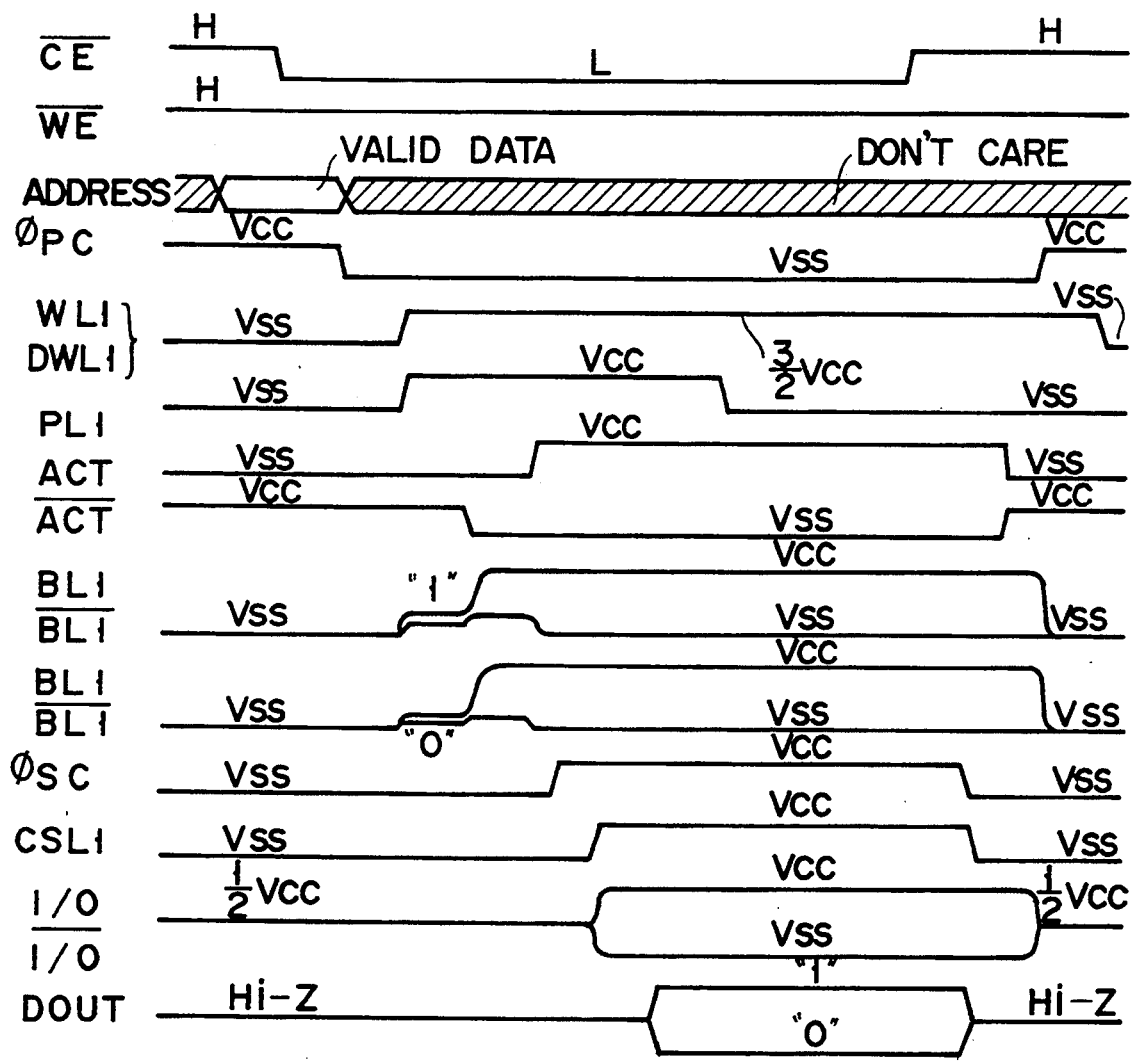
FIG. 30 is a timing chart showing the timing of each operation when a read operation is performed while the potential of a bit line is set at $V_{SS}$ in a precharge state.

FIG. 30 is a timing chart showing the timing of each operation when a read operation is performed while the above potential is set to be $V_{SS}$. When the control signal $\overline{CE}$ is at H level, and the potential of the precharge signal $\phi_{PC}$ is in a precharge state of $V_{CC}$, the bit line pair is precharged to $V_{SS}$, and the potential of the plate line (PL1) 13 is fixed to $V_{SS}$.

When the control signal $\overline{CE}$ is set at L level, and the precharge signal $\phi_{PC}$ is changed from $V_{CC}$ to $V_{SS}$ and an address is fetched, one word line (WL1) 4 and one dummy word line (DWL1) 33 are selected and activated. At substantially the same time, one of the plate lines (PL1) 13 is selected, and the potential of the selected plate line (PL1) 13 is boosted from $V_{SS}$ to $V_{CC}$.

With this operation, the information stored in the accessed memory cell (M/C) 11 is extracted to the bit line (BL1) 16-1. In this case, the potential of the bit line (BL1) 16-1 is greatly increased, when the information is "1", and is slightly increased when the information is "0", thus causing a potential difference between the bit line pair.

Subsequently, the sense amplifier activating Signals $\phi_{ACT}$ and $\overline{\phi_{ACT}}$ are input to the sense amplifier (S/A) 20 to activate it. At this time, of the sense amplifier activating signals $\phi_{ACT}$ and $\overline{\phi_{ACT}}$, the signal $\overline{\phi_{ACT}}$ for activating the PMOS type flip-flop circuit of the sense amplifier (S/A) 20 is input to the sense amplifier (S/A) 20 prior to the signal $\phi_{ACT}$ for activating the NMOS type flip-flop circuit of the amplifier 20. The reason for this operation is that since the bit line pair in a precharge state have a low potential of $V_{SS}$, the PMOS type flip-flop circuit is activated first to perform, a high-speed sensing operation.

Subsequently, the information extracted to the bit line pair is read out as the output signal $D_{out}$ by the data output buffer circuit 27 through the I/O line pair in the same manner as the operation described with reference to FIG. 23.

After this operation, a rewrite operation is performed in the same manner as the rewrite operation described with reference to FIG. 24. Assume that the initial information in the accessed memory cell (M/C) 11 is "0". In this case, at the end of the read operation, the potentials of the bit line (BL1) 16-1 and the plate line (PL1) 13 connected to the memory cell (M/C) 11 are respectively set to be $V_{SS}$ and $V_{CC}$. By this time, therefore, information of "0" has been rewritten. Subsequently, the potential of the plate line (PL1) 13 is lowered to $V_{SS}$. If the initial information in the accessed memory cell (M/C) 11 is "1", the potentials of the bit line (BL1) 16 and the plate line (PL1) 13 connected to the memory cell (M/C) 11 are respectively set to be $V_{CC}$ and $V_{SS}$, thus performing a rewrite operation.

When the potential of each of the bit line pair and the plate line (PL1) 13 in a precharge state is to be set to be $V_{SS}$ in this manner, the memory cell (M/C) 11 may be designed such that the polarization of the ferroelectric capacitor occurs at ½ $V_{CC}$ or less, so that the potential of the selected plate line (PL1) 13 can be boosted to ½ $V_{CC}$. In this case, since a rewrite operation is automatically performed with respect to the accessed memory cell (M/C) 11 at the end of a read operation, the potential of the plate line (PL1) 13 need not be changed in a write operation.

In such an operation, however, since the threshold value at which the polarization of the ferroelectric capacitor of the memory cell (M/C) 11 occurs is as small as ½ $V_{CC}$ or less, a deterioration in reliability is inevitable. It is, therefore, preferable in terms of reliability that the potential of the plate line (PL1) 13 selected in a read operation is boosted to $V_{CC}$ and is subsequently lowered to $V_{SS}$, as described above.

When a write operation (early write operation) is to be performed with respect to the semiconductor memory device, similar to the write operation described with reference to FIG. 28, the input signal $D_{in}$ is sequentially supplied to an I/O line pair and a bit line pair. Thereafter, the word line (WL1) 4 is selected, and an operation similar to the above-described rewrite operation is performed.

A case wherein the potential of each of the bit line pair and the plate line (PL1) 13 in a precharge state is set to be $V_{CC}$ will be described below.

FIG. 31 is a timing chart showing the timing of each operation when a read operation is performed in this case. In a precharge state in which the control signal $\overline{CE}$ is at H level, and the potential of the precharge signal $\phi_{PC}$ is 3/2 $V_{CC}$, the bit line pair are precharged to $V_{CC}$, and the potential of the plate line (PL1) 13 is also fixed to $V_{CC}$.

When the control signal $\overline{CE}$ is set at L level, and the potential of the precharge signal $\phi_{PC}$ is changed from 3/2 $V_{CC}$ to $V_{SS}$, and an address is fetched, one word line (WL1) 4 and one dummy word line (DWL1) 33 are selected and activated. At substantially the same time, one of the plate lines (PL1) 13 is selected, and the potential of the selected plate line (PL1) 13 is lowered from $V_{CC}$ to $V_{SS}$. with this operation, the information stored in the accessed memory cell (M/C) 11 is extracted to the bit line (BL1) 16-1. In this case, the potential of the bit line (BL1) 16-1 is slightly lowered, when the information is "1", and is greatly lowered when the information is "0", thus causing a potential difference between the bit line pair.

After this operation, the sense amplifier activating signals $\phi_{ACT}$ and $\overline{\phi_{ACT}}$ are input to the sense amplifier (S/A) 20 to activate it. At this time, of the sense amplifier activating signals $\phi_{ACT}$ and $\overline{\phi_{ACT}}$, the signal $\phi_{ACT}$ for activating the NMOS type flip-flop circuit of the sense amplifier (S/A) 20 is input to the sense amplifier (S/A) 20 prior to the signal $\overline{\phi_{ACT}}$ for activating the PMOS type flip-flop circuit of the amplifier 20. The reason for this operation is that since the bit line pair in a precharge state have a high potential of $V_{CC}$, the NMOS type flip-flop circuit is activated first to perform a high-speed sensing operation.

Subsequently, the information extracted to the bit line pair is read out as the output signal $D_{out}$ by the data output buffer circuit 27 through the I/O line pair in the same manner as the operation described with reference to FIG. 23.

In a rewrite operation after this operation, if the initial information in the accessed memory cell (M/C) 11 is "1", since the potentials of the bit line (BL1) 16-1 and the plate line (PL1) 13 connected to the memory cell (M/C) 11 are respectively set to be $V_{CC}$ and $V_{SS}$ at the end of the read operation, information of "1" has been written by this time. If the initial information of the memory cell (M/C) 11 is "0", the potential of the plate line (PL1) 13 is boosted to $V_{CC}$ to perform a rewrite operation, as shown in FIG. 311.

In this case, when a write operation (early write operation) is to be performed, similar to the write operation described with reference to FIG. 28, the input signal $D_{in}$ is sequentially supplied to an I/O line pair and a bit line pair. Thereafter, the word line (WL1) 4 is selected and activated, and an operation similar to the above-described rewrite operation is performed.

The above description is associated with the read, write, and read/modify/write operations of the semiconductor memory device shown in FIG. 18. According to the present invention, in each operation, sense amplifiers other than the sense amplifier in the same column as that of a selected memory cell need not be activated. In the semiconductor memory device of the present invention, therefore, the above-described operations can be performed within a short period of time and with small power consumption.

FIG. 32 shows a semiconductor memory device according to another embodiment of the present invention.

The semiconductor memory device of this embodiment is obtained by adding differential amplifiers (D/A) 39 to the semiconductor memory device shown in FIG. 18. More specifically, in such a semiconductor memory device, the differential amplifiers 39 are arranged in units of columns. In addition, input lines (I) 40-1 and ($\overline{I}$) 40-2 and output lines (O) 41-1 and ($\overline{O}$) 41-2 are independently formed in such a manner that the input lines 40-1 and 40-2 are respectively connected to bit lines (BL) 16-1 and ($\overline{BL}$) 16-2 through input line connecting circuits 45, and the output lines 41-1 and 41-2 are respectively connected to the bit lines 16-1 and 16-2 through the differential amplifiers 39. Note that each input line connecting circuit 45 has the same arrangement as that of each I/O connecting circuit 23 of the semiconductor memory device shown in FIG. 18. The input lines 40-1 and 40-2 are further connected to a data input buffer circuit 29, and the output lines 41-1 and 41-2 are connected to an output line sense amplifier 47 and a data output buffer circuit 27.

When a read operation of the semiconductor memory device is to be performed, information extracted from a memory cell (M/C) 11 to the bit lines 16-1 and 16-2 is transferred to the output lines 41-1 and 41-2. When the information is to be read out as an output signal $D_{out}$, a sense amplifier (S/A) 20 is used. When a rewrite operation is to be performed with respect to the semiconductor memory device after the information is read out from the memory cell 11, one of the differential amplifiers 39 is used. Each differential amplifier 39 used in the semiconductor memory device of this embodiment has the arrangement shown in FIG. 33. This current-mirror-type differential amplifier amplifies a voltage difference of a bit line pair in high rate to supply the output lines O (41-1) and O (41-2) with the amplified voltage.

A method of operating the semiconductor memory device of this embodiment will be described below with reference to FIG. 34.

FIG. 34 is a timing chart showing the timing of each operation when a read operation is performed with respect to the semiconductor memory device. In this read operation, similar to the above-described operation, a word line WL1 is selected as a word line 4, and a plate line PL1 is selected as a plate line 13.

In the semiconductor memory device in FIG. 32, the same operation as that of the semiconductor memory device shown in FIG. 18 is performed until the information stored in the accessed memory cell (M/C) 11 is extracted to the bit line (BL1) 16-1 or ($\overline{BL1}$) 16-2 connected to the memory cell (M/C) 11.

In the semiconductor memory device in FIG. 32, when the information is extracted to the bit line (BL1) 16-1 or ($\overline{BL1}$) 16-2, and a potential difference is caused between the bit line pair, the information extracted to the bit line pair is immediately amplified by the differential amplifier (D/A) 39 and is transferred to the output lines (O) 41-1 and ($\overline{O}$) 41-2. After this operation, the potential difference between the two output lines (O) 41-1 and ($\overline{O}$) 41-2, i.e., the output line pair, which is caused upon transfer of the information, is amplified by the output line sense amplifier 47. As a result, information of logic "1" or "0" is read out as an output signal $D_{out}$ by the data output buffer circuit 27.

A rewrite operation with respect to the semiconductor memory device in FIG. 32 is performed in the same manner as in the semiconductor memory device in FIG. 18 after the potential difference between the bit line pair is amplified by the sense amplifier (S/A) 20.

A write operation (early write operation) with respect to the semiconductor memory device shown in FIG. 32 will be described below.

Figure 35:
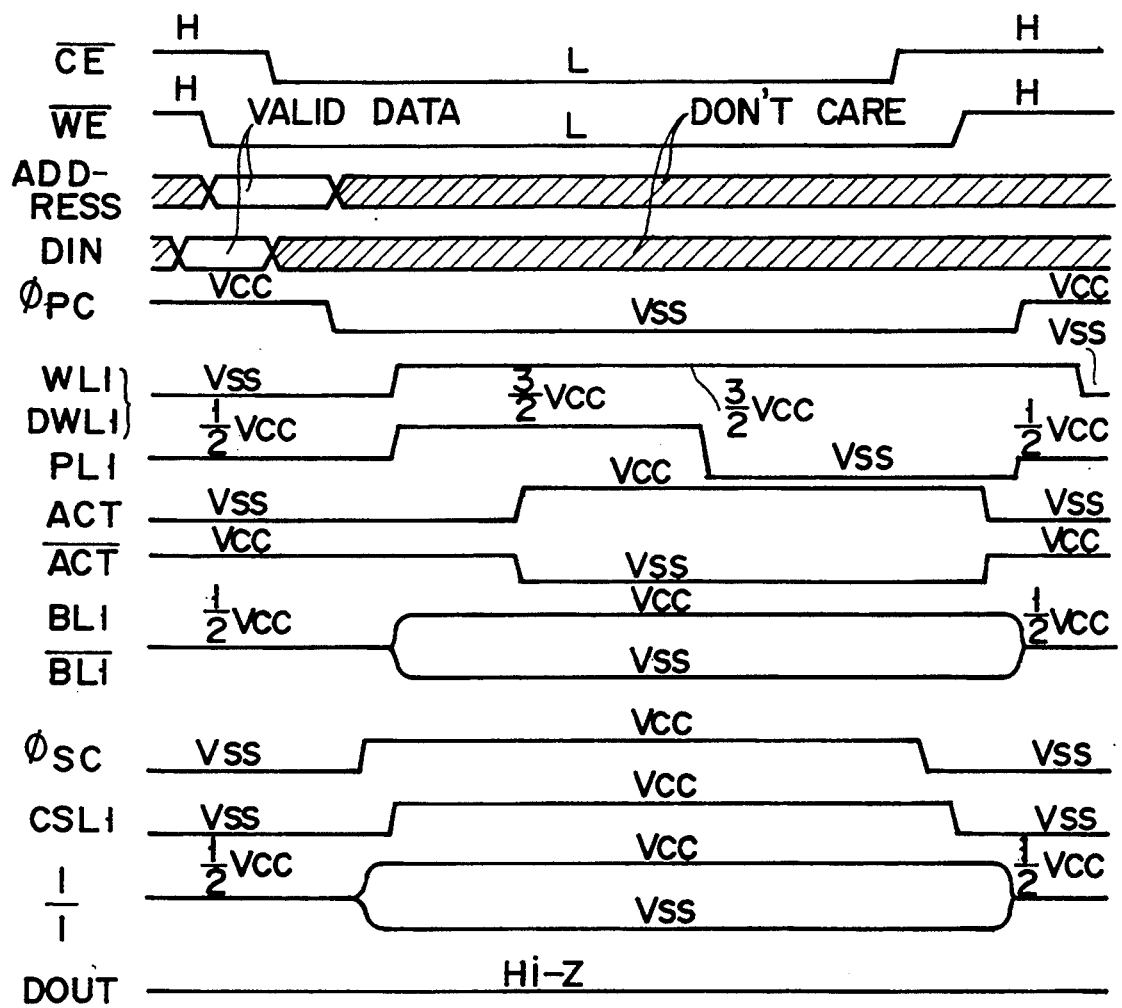
FIG. 35 is a timing chart showing the timing of each operation when information is rewritten in the semiconductor memory device in FIG. 32.

FIG. 35 is a timing chart showing the timing of each operation when a write operation is performed with respect to the semiconductor memory device. In the semiconductor memory device, if a write enable signal $\overline{WE}$ is at L level when a control signal $\overline{CE}$ is changed from H level to L level, an input signal Din is fetched into the chip through the data input buffer 29 and is transferred to the input lines (I) 40-1 and ($\overline{I}$) 40-2. Subsequently, a column select signal $\phi_{SC}$ is input to a plate line decoder 28 to select a column address select line (CSL1) 32, and the input line connecting circuit 45 in the selected column is driven. As a result, the above-mentioned information is transferred to the bit lines (BL1) 16-1 and ($\overline{BL1}$) 16-2. Thereafter, the information can be written in the target memory cell (M/C) 11 in the same manner as that described with to the semiconductor memory device shown in FIG. 18.

In the semiconductor memory device shown in FIG. 32, the sense amplifiers other than the sense amplifier in the same column as that of the memory cell selected in an access operation also need not be activated, thus increasing the speed of each operation and decreasing the power consumption.

Figure 36:
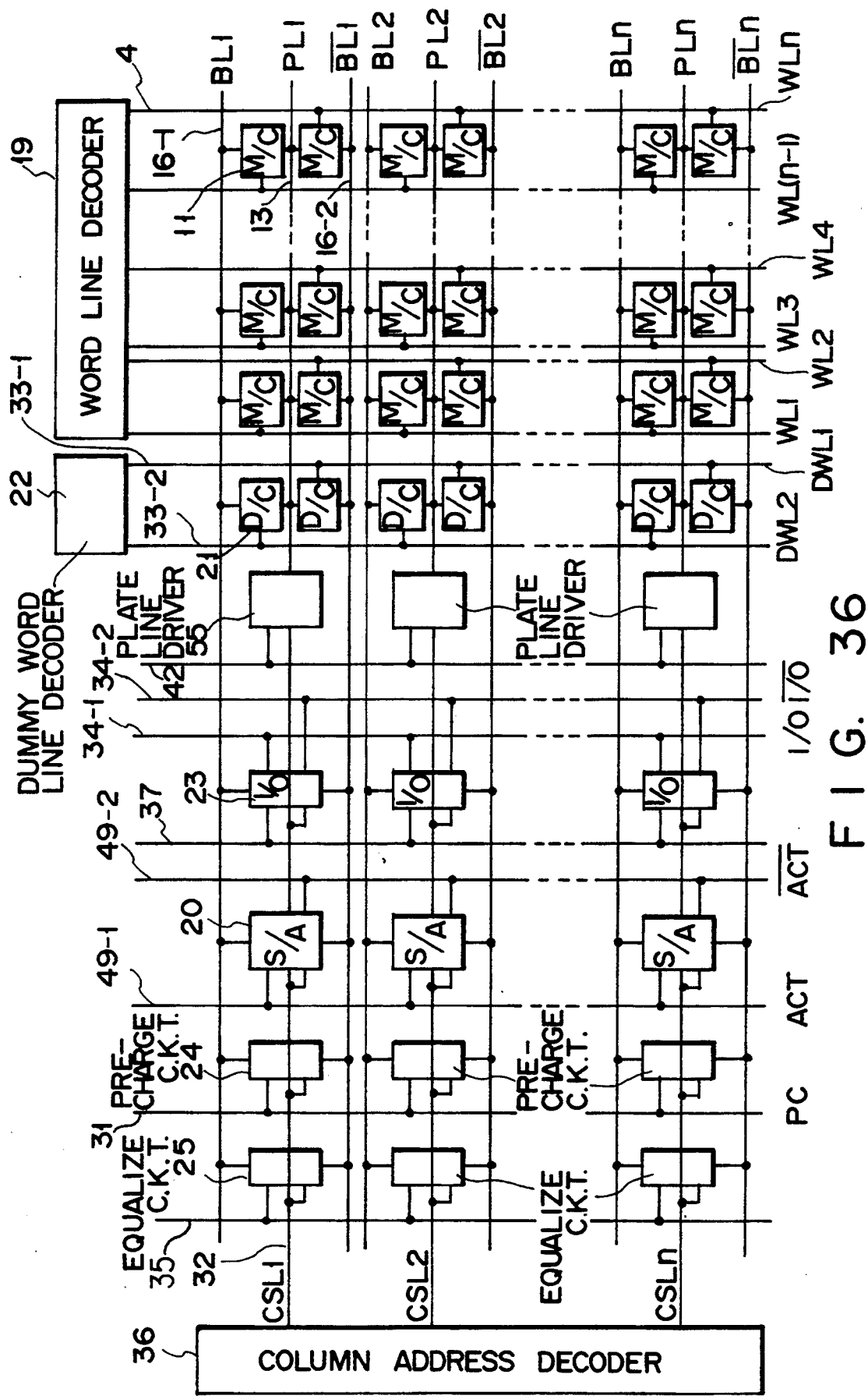
FIG. 36 is a block diagram showing a semiconductor memory device according to still another embodiment of the present invention.

FIG. 36 shows a semiconductor memory device according to still another embodiment of the present invention.

In this semiconductor memory device, sense amplifiers (S/A) 20, I/O connecting circuits 23, precharge circuits 24, equalizing circuits 25, and plate line drivers 55 arranged in units of columns are respectively connected to signal lines 49-1, 49-2, 37, 31, 35, and 42 for transmitting driving signals, and column address select lines (CSLs) 32. These components are controlled by these two types of signal lines.

In such a semiconductor memory device, signals for driving the plate line drivers 55 are transmitted to all the plate line drivers 55 arranged in units of columns through plate line driver driving lines 42. However, each plate line driver 55 is not driven when only the above-mentioned signal is input through a corresponding plate line driver driving line 42, but is driven when an H-level signal is also transmitted through a corresponding column address select lines 32. Therefore, one of the plate line drivers 55 to be driven can be selected by selecting one of the column address select lines 32 using a column address.

In the semiconductor memory device shown in FIG. 36, the column address select lines 32 are connected to a column address select line decoder 36. Selection of the column address select lines 32 is performed by the column address select line decoder 36.

Other peripheral circuits arranged in units of columns are controlled by signals transmitted through two types of signal lines including the column address select lines 32 and hence can be selectively driven by selecting the column address select lines 32 using column addresses.

Furthermore, in the semiconductor memory shown in FIG. 36, the sense amplifiers 20, the I/O connecting circuits 23, the precharge circuits 24, the equalizing circuits 25, and the plate drivers 55 are respectively connected common column address select lines 32. If, therefore, one of the column address select lines 32 is selected by a column address, and the signal lines for driving the above-mentioned peripheral circuits are activated, only the peripheral circuits in the same column can be sequentially driven., thereby greatly saving the access time and the power consumption. The operation timings of activating these signals lines are respectively controlled by clocks.

Note that in such a semiconductor memory device, even if the peripheral circuits are not connected to the address select line 32 of the same column, the peripheral circuits in the same column can be selected if the same signal is input through the column address select lines 32 to which the peripheral circuits are respectively connected.

In the semiconductor memory device shown in FIG. 36, each precharge circuit 24 and each equalizing circuit 25 are connected to different signal lines. More specifically, a signal is transmitted from the precharge circuit driving line (PC) 31 to the precharge circuit 24, whereas a signal is transmitted from the equalizing circuit driving line 35 to the equalizing circuit 25, thereby performing independent control operations. In the semiconductor memory device of this embodiment, however, similar to the semiconductor memory device shown in FIG. 18, both the precharge circuit and the equalizing circuit may be connected to the precharge circuit driving line 35 to be simultaneously driven.

The peripheral circuits for the semiconductor memory device shown in FIG. 36 will be described in detail below.

Figure 37:
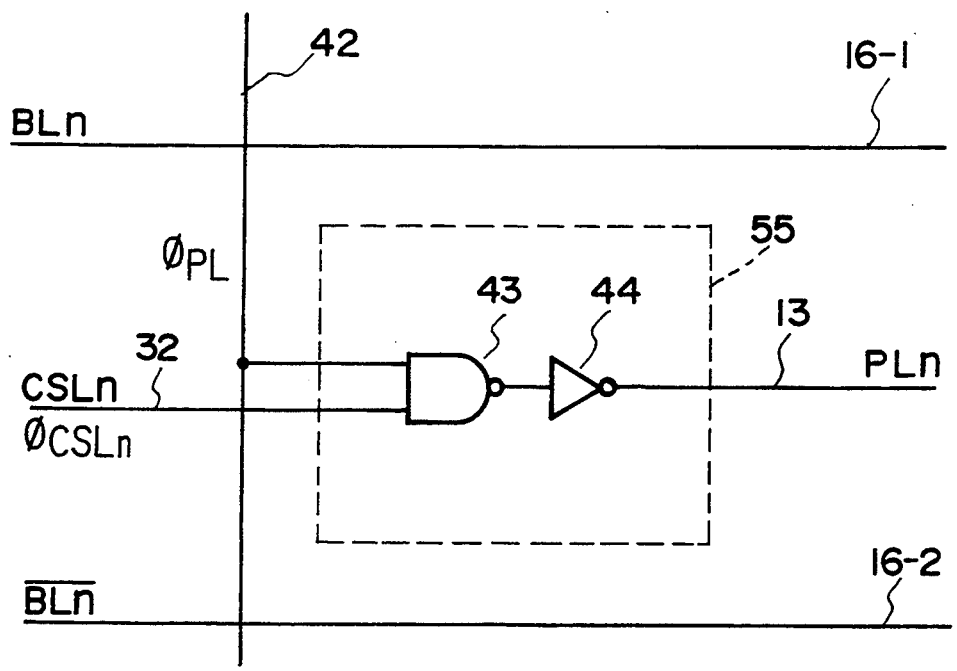
FIG. 37 is a circuit diagram showing an arrangement of a plate line driver used in the semiconductor memory device in FIG. 36.
Figure 38:
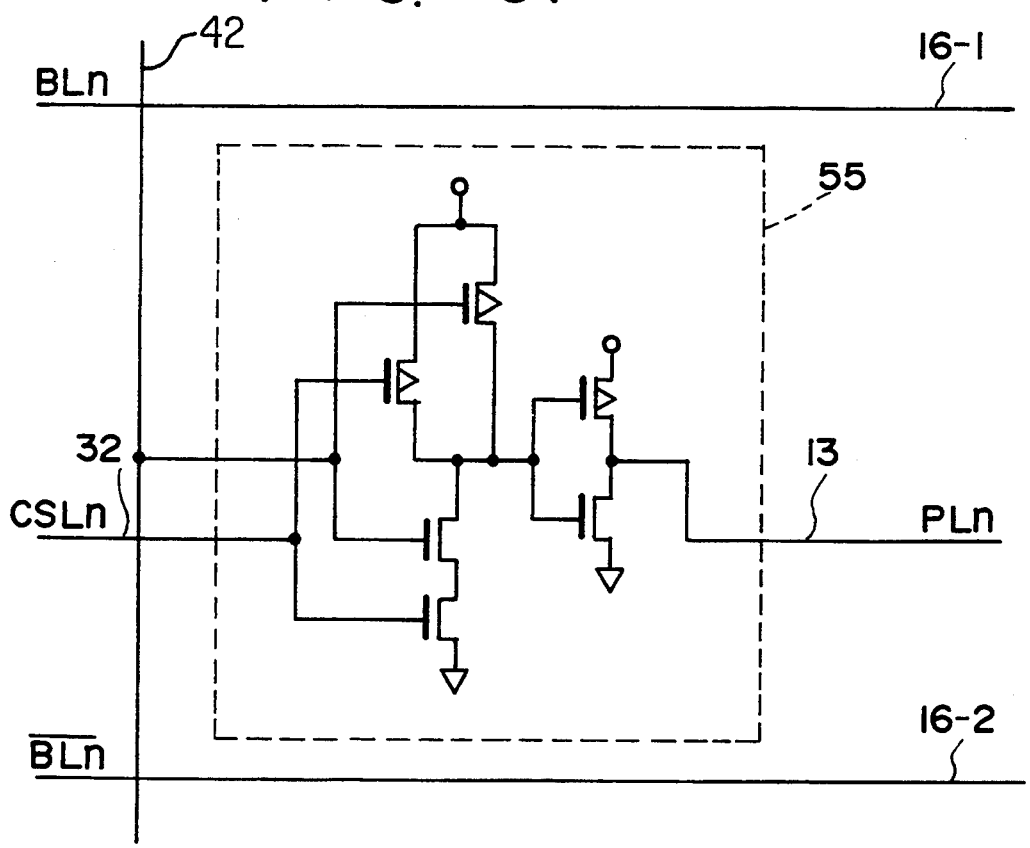
FIG. 38 is a circuit diagram showing the arrangement of the plate line driver in FIG. 38 in more detail.

FIG. 37 is a circuit diagram showing the plate line driver 55 used in the semiconductor memory device. The plate line driver 55 is controlled by a column address select signal $\phi_{CSLn}$ transmitted through the column address select line (CSL) 32, and a plate line driver driving signal $\phi_{PL}$ transmitted from the plate line driver driving line 42, and outputs a plate line potential $PL_n$ to the plate line (PL) 13. For this purpose, the plate line driver 55 is constituted by a NAND circuit 43 and an inverter 44. The plate line driver 55 in FIG. 37 may be realized by using CMOS transistors as shown in FIG. 38. The arrangement in FIG. 38, except for the plate line driver 55, is identical to the arrangement in FIG. 37.

Table 1 is a truth table showing an input/output relationship in the plate line driver 55. As indicated by Table 1, the plate line driver 55 is driven only when the column address select signal $\phi_{CSLn}$ and the plate line driver driving signal $\phi_{PL}$ are true.

TABLE 1

| $\phi_{PL}$ | $\phi_{CSLn}$ | $PL_n$ |
| --- | --- | --- |
| 0 | 0 | 0 |
| 0 | 1 | 0 |
| 1 | 0 | 0 |
| 1 | 1 | 1 |

That is, in the plate line driver 55, even if the plate line driver driving line 42 is activated and the plate line driver driving signal $\phi_{PL}$ is input, the corresponding plate line is not activated unless the corresponding column address select line is selected. Therefore, only the plate of the selected column can be activated.

FIG. 39 is a circuit diagram showing the I/O connecting circuit 23 used in the semiconductor memory device shown in FIG. 36. The I/O connecting circuit 23 is controlled by the column address select signal $\phi_{CSLn}$ transmitted through the column address select line (CSL) 32 and an I/O line connecting signal $\phi_{I/O}$ transmitted through the I/O line connecting line 37, and serves to connect the bit line (BL) 16-1 to an I/O line (I/O) 34-1, and the bit line $\overline{(BL)}$ 16-2 to an I/O line $\overline{(I/O)}$ 34-2. For this purpose, the I/O connecting circuit 23 is constituted by the NAND circuit 43, the inverter 44, and transfer gates 46-1 and 46-2. Logic circuits such as the NAND circuit 43 and the inverter 44 can be realized in practice by using, e.g., CMOS transistors to constitute the circuit shown in FIG. 40.

Table 2 is a truth table showing a relationship between two types of input signal to the I/O connecting circuit 23 and a signal $\phi_{I/On}$ input to the transfer gates. As indicated in Table 2, the I/O connecting circuit 23 is driven only when the column select signal $\phi_{CSLn}$ and the I/O line connecting signal $\phi_{I/O}$ are true and the transfer gates are closed.

TABLE 2

| $\phi_{I/O}$ | $\phi_{CSLn}$ | $\phi_{I/On}$ |
|---|---|---|
| 0 | 0 | 0 |
| 0 | 1 | 0 |
| 1 | 0 | 0 |
| 1 | 1 | 1 |

That is, in the I/O connecting circuit 23, even if the I/O connecting signal line 37 is activated and the I/O line connecting signal $\phi_{I/O}$ is input, the corresponding I/O line and bit line are not connected to each other unless the column address select line 32 is selected. Therefore, an I/O line and a bit line in only a selected column can be electrically connected to each other.

As for the sense amplifier 20, a sense amplifier having the arrangement shown in FIG. 22 may be used. In the semiconductor memory device shown in FIG. 36, however, selection of the sense amplifier 20 by means of a column address is performed by a signal transmitted through the column address select line 32. That is, such a sense amplifier is controlled by the column address select signal $\phi_{CSLn}$ transmitted through the column address select line (CSL) 32 and sense amplifier activating signals $\phi_{ACT}$ and $\overline{\phi_{ACT}}$ transmitted through the sense amplifier activating lines (ACT) 49-1 and $\overline{(ATC)}$ 49-2, and amplifies a small potential difference between a bit line pair. Note that the signals $\phi_{ACT}$ and $\overline{\phi_{ACT}}$ are basically complementary signals but may have a slight difference in timing to shift the timings of a presensing operation and a main sensing operation.

Table 3 is a truth table showing a relationship between input signals to the sense amplifier 20 and its activating state. As indicated in Table 3, such a sense amplifier is activated only when both the sense amplifier activating signal $\phi_{ACT}$ and the column address select signal $\phi_{CSLn}$ are true.

TABLE 3

| $\phi_{ACT}$ | $\overline{\phi_{ACT}}$ | $\phi_{CSLn}$ | sense amplifier |
|---|---|---|---|
| 0 | 1 | 0 | inactive |
| 1 | 0 | 0 | inactive |
| 0 | 1 | 1 | inactive |
| 1 | 0 | 1 | active |

That is, this sense amplifier 20 is not activated unless the column address select line 32 is selected even if the sense amplifier activating lines 49-1 and 49-2 are activated and the sense amplifier activating signals $\phi_{ACT}$ and $\overline{\phi_{ACT}}$ are input. Therefore, the sense amplifier 20 in only a selected column can be activated.

FIG. 41 is a circuit diagram showing the precharge circuit 24 used in the semiconductor memory device shown in FIG. 35. The precharge circuit 24 is controlled by the column address select signal $\phi_{CSLn}$ transmitted through the column address select line (CSL) 32, and the precharge signal $\phi_{PC}$ and a precharge cancel signal $\overline{\phi_{PC}}$ transmitted through the precharge circuit driving line (PC) 31 so as to precharge a bit line pair and to cancel its precharge state. For this purpose, the precharge circuit 24 is constituted by the NAND circuit 43 and precharge transistors 52-1 and 52-2. The precharge circuit 24 in FIG. 41 may be realized by using CMOS transistors as shown in FIG. 42. The arrangement in FIG. 42, except for the precharge circuit 24, is identical to the arrangement in FIG. 41.

Table 4 is a truth table showing a relationship between the precharge signal $\phi_{PC}$, the precharge cancel signal $\overline{\phi_{PC}}$, the column address select signal $\phi_{CSLn}$, and a signal $\phi_{PCn}$ input to the precharge transistors 52-1 and 52-2, in the precharge circuit 24. As indicated in Table 4, in the precharge circuit 24, the precharge transistors 52-1 and 52-2 are turned off to cancel a precharge state only when the column address select signal $\phi_{CSLn}$ and the precharge cancel signal $\overline{\phi_{PC}}$ are true.

TABLE 4

| $\phi_{PC}$ | $\overline{\phi_{PC}}$ | $\phi_{CSLn}$ | $\phi_{PCn}$ |
|---|---|---|---|
| 1 | 0 | 0 | 1 |
| 1 | 0 | 1 | 1 |
| 0 | 1 | 0 | 1 |
| 0 | 1 | 1 | 0 |

That is, in the precharge circuit 25, even if the precharge cancel signal $\overline{\phi_{PC}}$ is input, a precharge state is not canceled unless the column address select line 32 is selected. Therefore, a precharge cancel operation can be performed for only a bit line pair in a selected column.

FIG. 43 is a circuit diagram showing the equalizing circuit 25 used in the semiconductor memory device shown in FIG. 36. The equalizing circuit 25 is controlled by the column address select signal $\phi_{CSLn}$ transmitted through the column address select line (CSLn) 32 and an equalize signal $\phi_{EQ}$ and an equalized state cancel signal $\overline{\phi_{EQ}}$ which are transmitted through the equalizing circuit driving line 35 so as to equalize a bit line pair and to cancel their equalized state. For this purpose, the equaling circuit 25 is constituted by the NAND circuit 43 and an equalizing transistor 56. The equalizing circuit 25 in FIG. 43 may be realized by using CMOS transistors as shown in FIG. 44. The arrangement in FIG. 44, except for the equalizing circuit 25, is identical to the arrangement in FIG. 43.

Table 5 is a truth table showing a relationship between the equalize signal $\phi_{EQ}$, the equalized state cancel signal $\overline{\phi_{EQ}}$, the column address select signal $\phi_{CSLn}$, and a signal $\phi_{EQn}$ input to the equalizing transistor 56. As indicated in Table 5, in the equalizing circuit 25, the equalizing transistor 56 is turned off to cancel an equalized state only when the column address select signal $\phi_{CSLn}$ and the equalized stage cancel signal $\overline{\phi_{EQ}}$ are true.

TABLE 5

| $\phi_{EQ}$ | $\overline{\phi_{EQ}}$ | $\phi_{CSLn}$ | $\phi_{EQn}$ |
|---|---|---|---|
| 1 | 0 | 0 | 1 |
| 1 | 0 | 1 | 1 |
| 0 | 1 | 0 | 1 |

TABLE 5-continued

| $\phi_{EQ}$ | $\phi_{EQ}$ | $\phi_{CSLn}$ | $\phi_{EQn}$ |
|---|---|---|---|
| 0 | 1 | 1 | 0 |

That is, in the equalizing circuit 25 having such an arrangement, even if the equalized state cancel signal $\overline{\phi_{EQ}}$ is input, the equalized state of a bit line pair is not canceled unless the column address select line 32 is selected. Therefore, the equalized state of only a bit line pair in a select column can be canceled.

In the semiconductor memory device shown in FIG. 36, the precharge circuit 24 and the equalizing circuit 25 described above may be connected to the precharge circuit driving line 31 so as to be simultaneously driven. FIG. 45 is a circuit diagram showing the precharge circuit 24 and the equalizing circuit 25 having such an arrangement.

Furthermore, according to the present invention, in the precharge circuit and the equalizing circuit shown in FIG. 45, a common NAND circuit may be used in place of a NAND circuit 43-1 in the precharge circuit 24 and a NAND circuit 43-2 in the equalizing circuit 25. FIG. 46 is a circuit diagram showing a precharge circuit and an equalizing circuit 25 which share such a NAND circuit 43.

In the semiconductor memory device using the above-described peripheral circuits, the bit line pair 16-1 and 16-2 are formed on both sides of the plate line 13. It is apparent, however, that these peripheral circuits can be used in a case wherein the pair of bit lines 16-1 and 16-2 are formed on both sides of the sense amplifier 20.

The semiconductor memory device shown in FIG. 36 has all the peripheral circuits described above. In the present invention, however, these circuits may be selectively used.

A method of operating the semiconductor memory device shown in FIG. 36 to read/write information in/from the device by driving the peripheral circuits will be described below.

In a precharge state in which a control signal $\overline{CE}$ is at H level, the precharge signal $\phi_{PC}$ and the equalize signal $_{EQ}$ are respectively input to the precharge circuit 24 and the equalizing circuit 25 through the precharge circuit driving line (PC) 31 and the equalizing circuit driving line 35 to precharge and equalize a corresponding bit line pair. In this case, all the word lines (WLs) 4 and all the dummy word lines (DWLs) 33 are in a non-selected state, and the plate line driver driving lines 42, the I/O line connecting signal lines 37, and the sense amplifier activating lines (ACT) 49-1 and ($\overline{ATC}$) 49-2 are not activated. Therefore, all the plate lines 13 are in a non-selected state, and the potential of each plate line 13 is kept equal to that of the bit line pair.

When information is to be read out from an arbitrary memory cell (M/C) 11, the control signal $\overline{CE}$ is set at L level and addresses are fetched, and one word line 4 and one dummy word line 33 are selected and activated.

The column address select line (CSL) 32 is selected to transmit the column address select signal $\phi_{CSLn}$. Subsequently, the precharge cancel signal $\overline{\phi_{PC}}$ is input to all the precharge circuits 24 through the precharge circuit driving lines 31. However, since each precharge circuit 24 is not driven upon reception of the precharge cancel signal $\overline{\phi_{PC}}$ unless a corresponding one of the column address select signals 32 is selected as indicated in Table 4, the precharge circuit 24 in only the selected column is driven to cancel the precharge state of the bit line pair.

At substantially the same time, the equalized state cancel signal $\overline{\phi_{EQ}}$ is input to the equalize circuits 25 through the equalizing circuit driving line 35, and the equalizing circuit 25 in only the selected column is driven to cancel the equalized state of the bit line pair.

Subsequently, the plate line driver driving line 42 is activated to input the plate line driver driving signal $\phi_{PL}$ to the plate line driver 55, and the plate line driver 55 in the selected column is driven to activate the plate line 13. With this operation, the information in the memory cell 11 connected to the activated word and plate lines 4 and 13 is extracted to the bit line (BL) 16-1 or ($\overline{BL}$) 16-2 connected to the memory cell 11 to cause a potential difference between the bit line pair.

After this operation, the input operation of the plate line driver driving signal $\phi_{PL}$ to the plate line driver 55 is stopped, and the selected plate line 13 is restored to the non-selected state. The sense amplifier activating signals $\phi_{ACT}$ and $\overline{\phi_{ACT}}$ are input to the sense amplifier (S/A) 20. As a result, the sense amplifier 20 in the selected column is activated to amplify the potential difference caused between the bit line pair.

In addition, the plate line driver driving line 42 is activated to activate the plate line 13 at this time, and the activated state of the plate line driver driving line 42 is canceled after a lapse of a predetermined period of time to restore the plate line 13 to the nonselected state. With this operation, information is rewritten in the accessed memory cell 11.

Furthermore, the I/0 line connecting signal line 37 is activated to connect the bit line pair and the I/O line pair in the selected column to each other, so that the information extracted to the bit line pair is transferred to the I/O line pair, and the information of logic "1" or "0" is read out as an output signal $D_{out}$.

After this operation, the precharge signal $\phi_{PC}$ and the equalize signal $\phi_{EQ}$ are respectively input to the precharge circuit 24 and the equalizing circuit 25. When the selected word line 4, dummy word line 33, and column address select line (CSLn) 32 are restored to the non-selected state, the semiconductor memory device shown in FIG. 36 is set in a precharge state, thus completing one read cycle.

When information is to be rewritten in the semiconductor memory device, similar to the read operation described above, addresses are fetched to select one word line 4 and one column address select line CSL. In addition, an input signal $D_{in}$ is fetched in the chip, and its information is transferred to a corresponding I/O line pair.

Subsequently, similar to the read operation, the precharge cancel signal $\overline{\phi_{PC}}$ and the equalized state cancel signal $\overline{\phi_{EQ}}$ are respectively input to the precharge circuit 24 and the equalizing circuit 25 to precharge and equalize the bit line pair in the selected column. The I/O line connecting signal line 37 is activated to connected to the bit line pair to the I/O line pair so as to transfer the information to the bit line pair. At this time, the plate line driver driving signal $\phi_{PL}$ is input to the plate line drivers 55 through the plate line driver driving line 42 to activate the plate line 13 in the selected column. After a lapse of a predetermined period of time, the activated plate line 13 is restored to the non-selected state. With this operation, similar to the rewrite operation in the above-described read operation, the information transferred to the bit line pair can be written in the memory cell 1 connected to the selected word and plate lines 4 and 13.

As described above, in the semiconductor memory device shown in FIG. 36, all the peripheral circuits are connected to the column address select lines (CSLs) 32 so that they are not driven unless the column address select lines 32 are selected. Therefore, when a read/write operation is to be performed with respect to the semiconductor memory device, if the signal lines for driving the peripheral circuits described above are sequentially activated after one of the column address select line 32 is selected by a column address, only the peripheral circuits in the same column can be driven. This increases the speed of each operation and reduces the power consumption.

Figure 47:
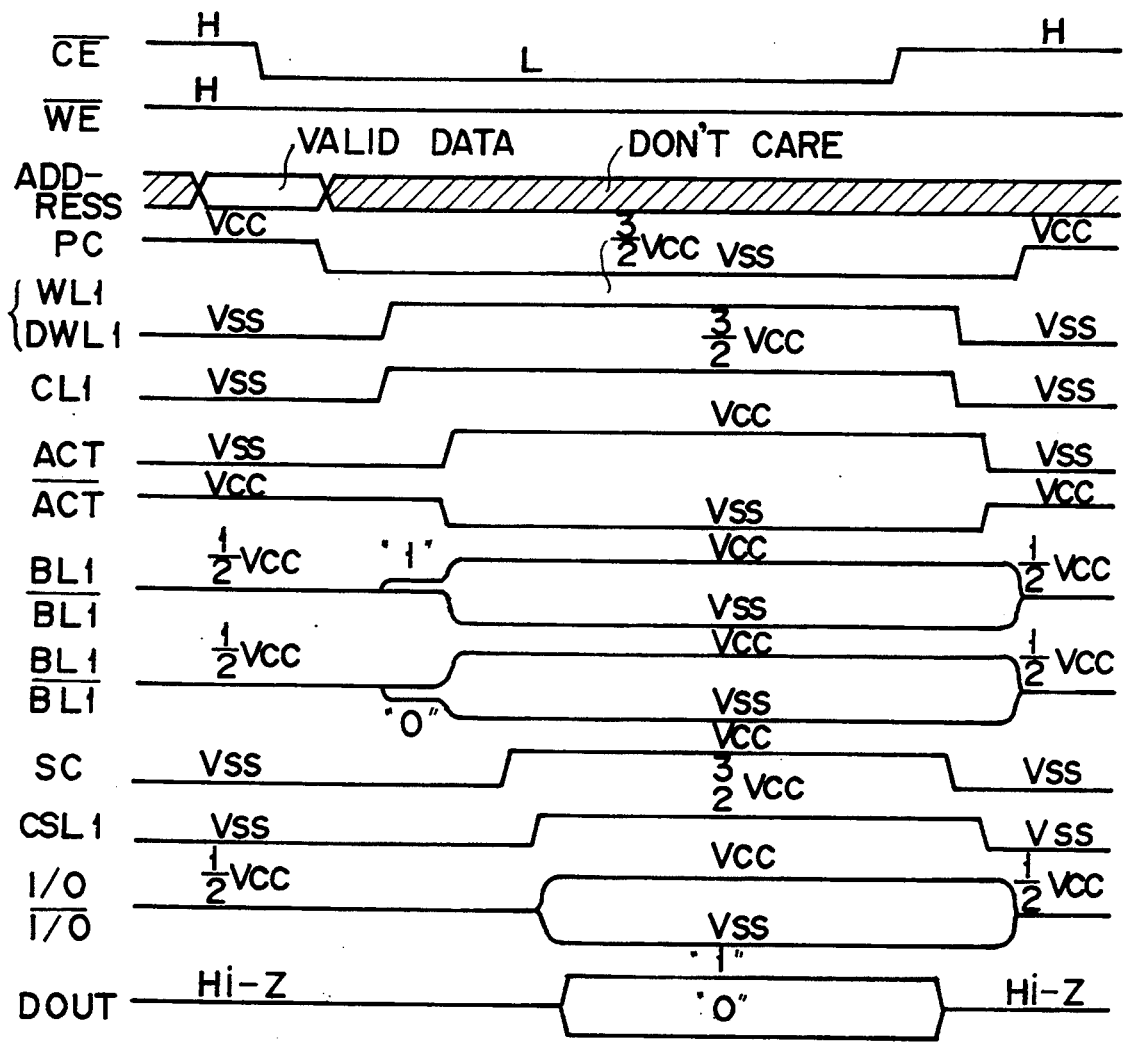
FIG. 47 is a timing chart showing the timing of each operation when information is read out from a semiconductor memory device having the memory cell shown in FIG. 9.

The method of operating the semiconductor memory device having a memory cell with the arrangement shown in FIG. 6 has been described. When a read operation is to be performed with respect to the semiconductor memory device having a memory cell with the arrangement shown in FIG. 9, since a rewrite operation has been automatically performed with respect to an accessed memory cell by the time when the read operation is completed, the rewrite operation shown in FIG. 23 need not be performed. This is because, in this semiconductor memory device, similar to a DRAM, information is stored in accordance with the presence/absence of charge stored in a capacitor constituting a memory cell. FIG. 47 is a timing chart showing the timing of each operation when a read operation is performed with respect to such a semiconductor memory device.

Assume that, in this semiconductor memory device, the capacitor consists of a normal dielectric material. In this case, as shown in FIG. 47, before a bit line is restored to the precharge state in an access operation, corresponding word and column lines must be restored to the non-selected state for the following reason. In a case wherein a normal dielectric material is used for a capacitor, with a change in potential difference between the two electrodes of the capacitor, the amount of charge stored in the capacitor is greatly changed, as shown in FIG. 1B, unlike in the case wherein a ferroelectric material is used for a capacitor. In a memory cell using such a capacitor, therefore, if the bit lines are restored to the precharge state while the word line and the column line are in a selected state, and the capacitor of the memory cell is electrically connected to the bit lines, the charge stored in the capacitor may be transferred between the bit lines, resulting in loss of information stored in the memory cell.

In addition, in the semiconductor memory device of the present invention, after the input signal $D_{in}$ is input to the bit line pair in a predetermined column, a plurality of word lines may be simultaneously selected to write information in a plurality of memory cells in the same column. FIG. 48 is a timing chart showing the timing of each operation when a write operation is performed with respect to the semiconductor memory device having the memory cell with the arrangement shown in FIG. 6.

Referring to FIG. 48, if a write enable signal $\overline{WE}$ is at L level when the control signal $\overline{CE}$ is changed from H level to L level, similar to the write operation shown in FIG. 27, the input signal $D_{in}$ is fetched into the chip, and its information is transferred to the bit line pair in a selected column through a corresponding I/O line pair. Thereafter, row addresses are sequentially selected, and information is sequentially written in memory cells connected to selected word lines. More specifically, as shown in FIG. 48, when a word line WL1 is selected by a row address, and the potential of a plate line PLλ in a selected column is boosted to $V_{CC}$ and is subsequently restored to $V_{SS}$, an information is written in a memory cell (M/C)λi connected to the word line WL1 and the plate line PLλ.

When a word line WL1 is selected, and the potential of the plate line PLλ is boosted to $V_{CC}$ and is subsequently restored to $V_{SS}$, information is written in a memory cell (M/C)λj connected to the word line WL2 and the plate line PLλ. If word lines are sequentially selected, and the potential of the plate line PLλ is boosted to $V_{CC}$ and is subsequently restored to $V_{SS}$ every time a word line is selected, information extracted to a bit line pair of a selected column can be written in a plurality of memory cells connected to the bit line pairs.

When a write operation with respect to a memory cell in a selected column is completed, the signals $\overline{CE}$ and $\overline{WE}$ are changed from L level to H level, a bit line pair to which the input signal $D_{in}$ is fetched is set in a precharge state, and a selected word line is restored to the non-selected state.

An example of multiple selection of word lines in an early write operation has been described above. In the semiconductor memory device of the present invention, however, multiple selection of word lines may be performed in a read/modify/write operation so as to write information in a plurality of memory cells in the same column.

Figure 49:
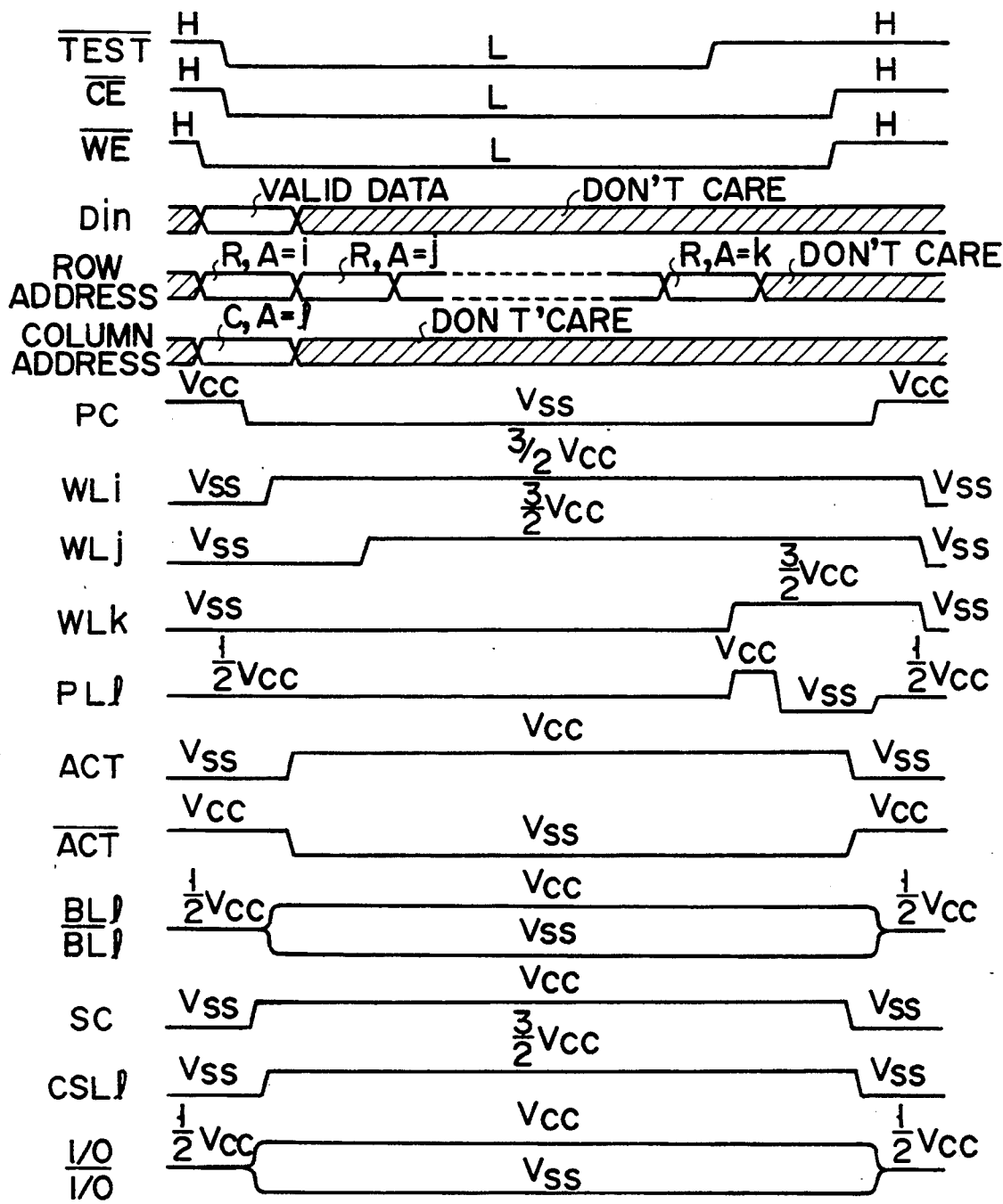
FIG. 49 is a timing chart showing another example of the timing of each operation when information is written in the semiconductor memory device having the memory cell shown in FIG. 6 by performing multiple selection of word lines.

Furthermore, in the semiconductor memory device of the present invention, multiple selection of word lines may be performed only when an operation test of the semiconductor memory device is to be performed, thus writing information in a plurality of memory cells in the same column. FIG. 49 is a timing chart showing the timing of each operation when such a write operation is performed.

When a test control signal $\overline{TEST}$ is changed from H level to L level, the semiconductor memory device is switched to a test mode to allow multiple selection of word lines. In such a semiconductor memory device, similar to the operating method described with reference to FIG. 48, the input signal $D_{in}$ is fetched into the chip to be transferred to a bit line pair in a selected column.

After this operation, word lines are sequentially selected by row addresses. In this case, in the write operation shown in FIG. 49, the potential of a plate line is not boosted every time a word line is selected. In such a write operation, the signal $\overline{TEST}$ is changed from L level to H level after multiple selection of word lines is completed, and potential of the plate line is boosted to $V_{CC}$ and is subsequently lowered to $V_{SS}$. Therefore, of the memory cells connected to the bit line pair to which the information is fetched, information is simultaneously written in all the memory cells which are also connected to the selected word line.

Subsequently, similar to the write operation shown in FIG. 48, the signals $\overline{CE}$ and $\overline{WE}$ are changed from L level to H level, the bit line pair to which the input signal $D_{in}$ is fetched is recharged, and the selected word lines are restored to the non-selected state.

In the semiconductor memory device which can perform multiple selection of word lines in the test mode in this manner, since information can be simultaneously written in memory cells in the same column, the time required for an operation test of the semiconductor memory device can be greatly shortened.

Figure 50:
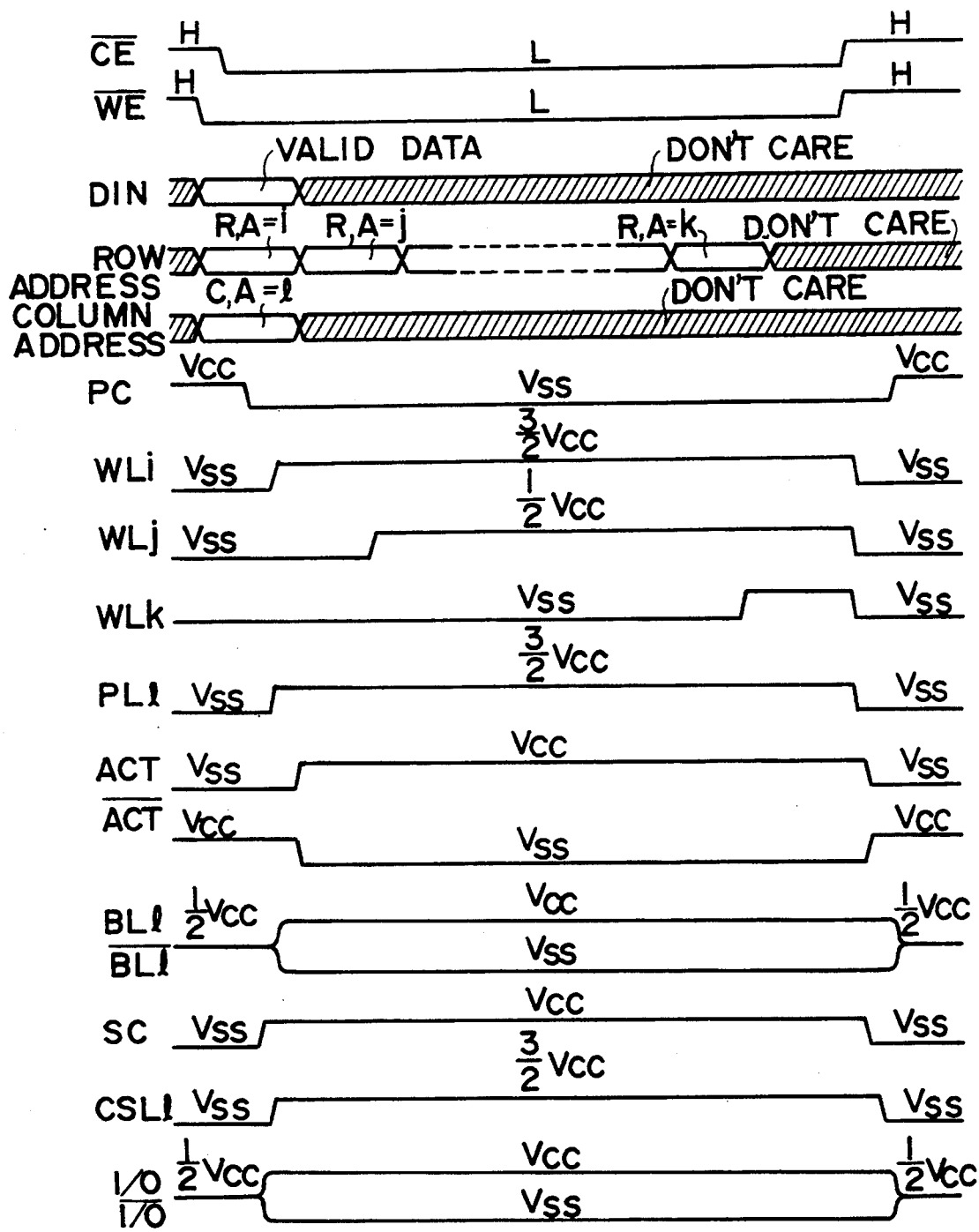
FIG. 50 is a timing chart showing the timing of each operation when information is written in the semiconductor memory device having the memory cell shown in FIG. 9 by performing multiple selection of word lines.

Furthermore, according to the present invention, similar to the above-described device, in the semiconductor memory device having the memory cell with the arrangement shown in FIG. 9, information can be written in a plurality of memory cells in the same column upon multiple selection of word lines. FIG. 50 is a timing chart showing the timing of each operation when the above-described write operation is performed with respect to such a semiconductor memory device.

In this semiconductor memory device, since information is stored in accordance with the presence/absence of charge stored in a capacitor constituting a memory cell, when the above-described write operation is to be performed, information is fetched to a bit line pair, and word lines are sequentially selected after the potential of a column line in the same column as that of the bit line pair is boosted. With this operation, every time a word line is selected, information is written in a memory cell which is connected to the selected word line and located in the same column as that of the bit line pair.

In the semiconductor memory device of the present invention, when a write operation is to be performed by performing multiple selection of word lines in the above-described manner, a static type row address buffer may be used as a peripheral circuit, which can sequentially receive external input addresses and convert them into internal addresses. In addition, an OR type decoder capable of multiple selection of word lines may be used as a word line decoder.

In the above-described method of operating the semiconductor memory device of the present invention, since a driving operation and the like in the operation mode are performed with respect to only peripheral circuits in a selected column, the time and power consumption required for each operation can be saved.

In the operation method described above, an external fetching operation of row and column addresses is controlled by the 1-pin control signal $\overline{CE}$. However, the present invention is not limited to this. For example, an address multiplex scheme may be used. In this scheme, a row address and a column address are fetched at different timings by using signals $\overline{RAS}$ and $\overline{CAS}$.

Another method of operating the semiconductor memory device of the present invention will be described below with reference to FIGS. 51 to 60.

Figure 52:
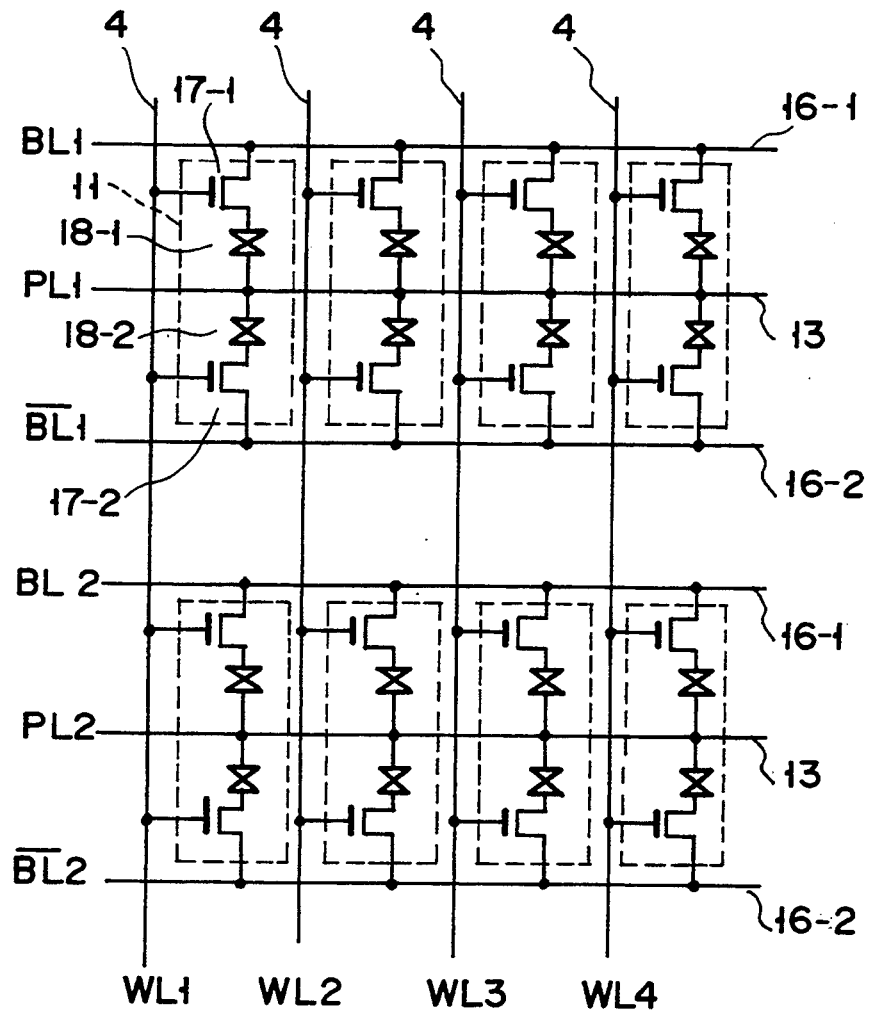
FIG. 52 is a circuit diagram showing another memory cell array according to the present invention.

FIG. 51 is a circuit diagram showing an example of a memory cell array in the semiconductor memory device according to the present invention. FIG. 52 is another circuit diagram of such a memory cell array.

As shown in FIGS. 51 and 52, a memory cell in the semiconductor memory device of the present invention is constituted by a ferroelectric capacitor 18 and a MOS transistor 17 as a switching transistor. One electrode of the ferroelectric capacitor 18 is connected to a bit line (BL) 16-1 or ($\overline{BL}$) 16-2 through the source and drain of the MOS transistor 17. The other electrode of the ferroelectric capacitor 18 is connected to a plate line (PL) 13, and the gate electrode of the MOS transistor 17 is connected to a word line (WL) 4.

In the memory cell array shown in FIG. 51, a memory cell array 11 is constituted by one MOS transistor 17 and one ferroelectric capacitor 18. In the memory cell array shown in FIG. 52, a memory cell array 11 is constituted by two MOS transistors 17-1 and 17-2 and two ferroelectric capacitors 18-1 and 18-2. Note that in the memory cell 11 shown in FIG. 52, the two ferroelectric capacitors 18-1 and 18-2 are always kept in a complementary polarization state.

Figure 3:
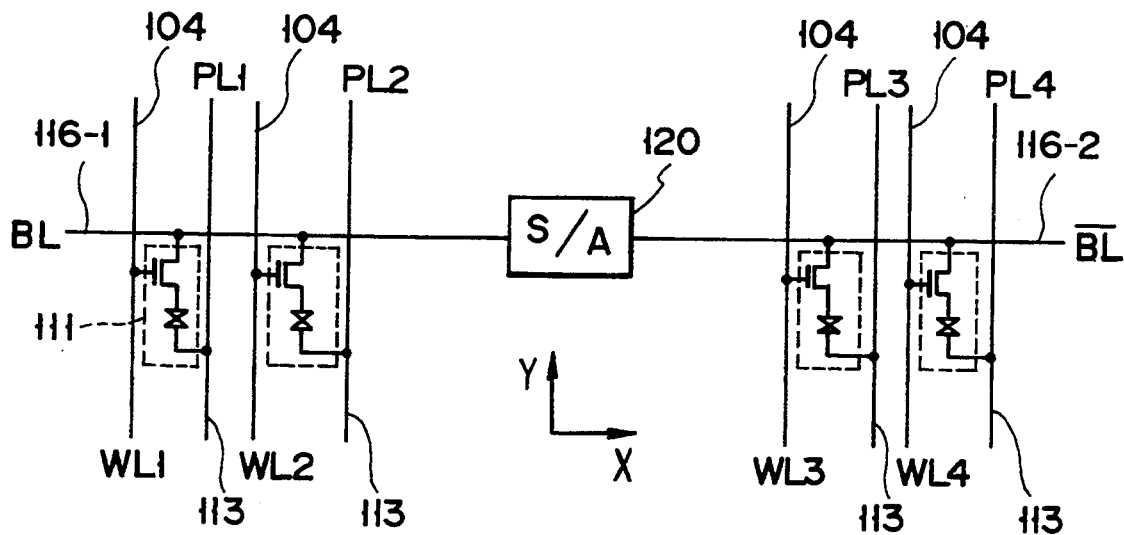
FIG. 3 is a block diagram showing a part of the layout of the conventional semiconductor memory device.
Figure 5:
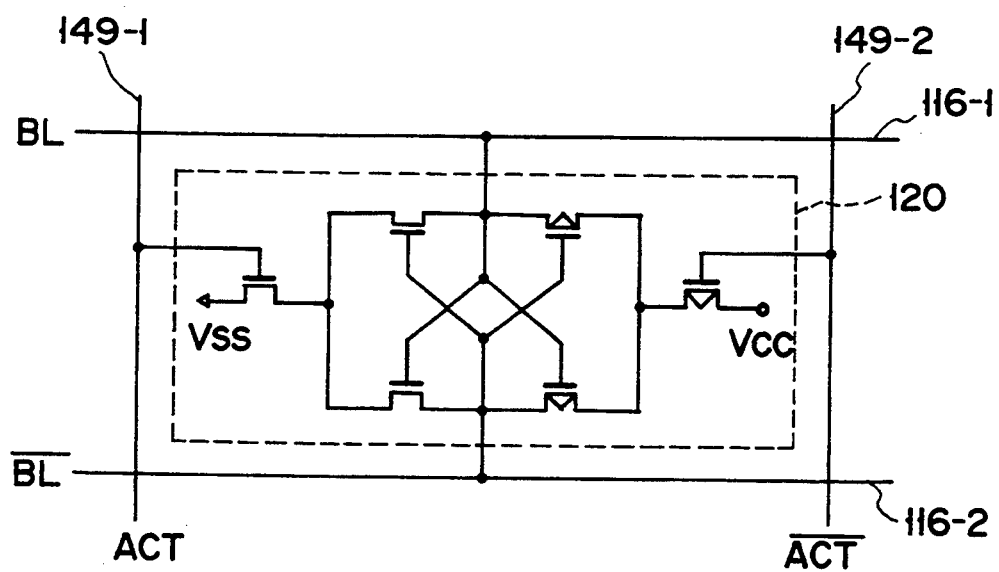
FIG. 5 is a circuit diagram showing an arrangement of a sense amplifier used in the conventional semiconductor memory device.
Figure 4:
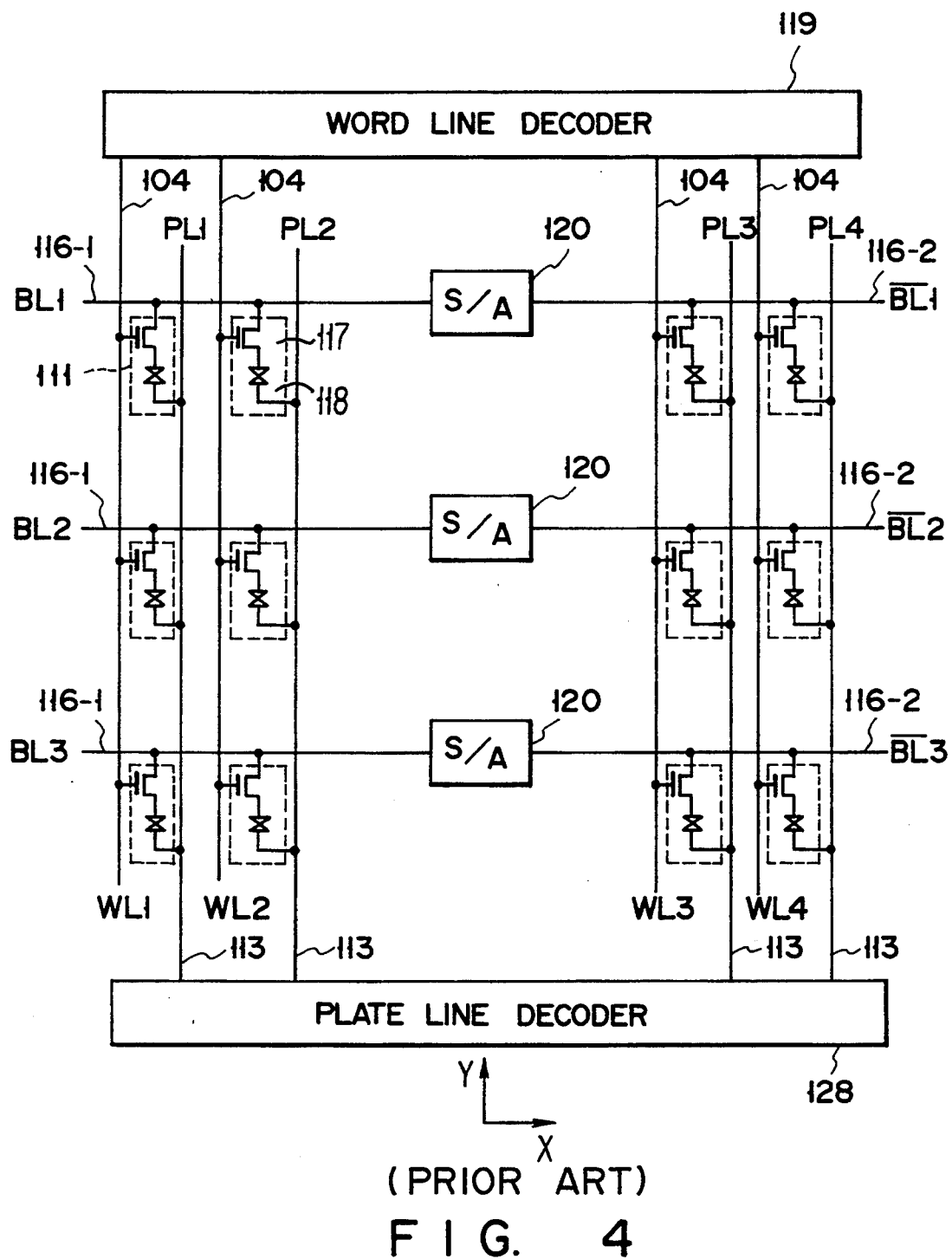
FIG. 4 is a block diagram showing the layout of the conventional semiconductor memory device.

Such memory cells 11 are arranged in the form of a matrix. In addition, word lines 4 are formed to cross bit lines 16-1 and 16-2 at right angles, and plate lines 13 are formed to be parallel with the bit lines 16-1 and 16-2. The memory cell arrays shown in FIGS. 51 and 52 are characterized in that the word lines 4 cross the plate lines 13 at right angles. In the present invention, a memory cell array is not limited to a specific arrangement, but the arrangement of the conventional memory cell array shown in FIG. 4 in which the word liens 4 and the plate lines 13 are formed to be parallel with each other may be employed.

In the memory cell arrays shown in FIGS. 51 and 52, the two bit lines 16-1 and 16-2 constituting a bit line pair are formed on both sides of the plate line 13, and a common sense amplifier is provided for the bit line pair. This arrangement is the same as that of a folded bit line scheme of a DRAM. Furthermore, in the present invention, similar to an open bit scheme of a DRAM, a bit line pair connected to one common sense amplifier can be formed on both sides of the sense amplifier. However, a bit line pair is preferably formed on both sides of a plate line as in the folded bit line scheme, as described above.

In addition, in the memory cell arrays shown in FIGS. 51 and 52, a MOS transistor is used as a switching transistor. However, the present invention is not limited to this. For example, a MOS transistor having a nitride film formed on its gate electrode portion may be used.

The memory cell array shown in FIG. 51 is formed by the process shown in FIGS. 10A to 10I and 11A to 11J or the process shown in FIGS. 12A to 12G and 13A to 13H.

Figure 53:
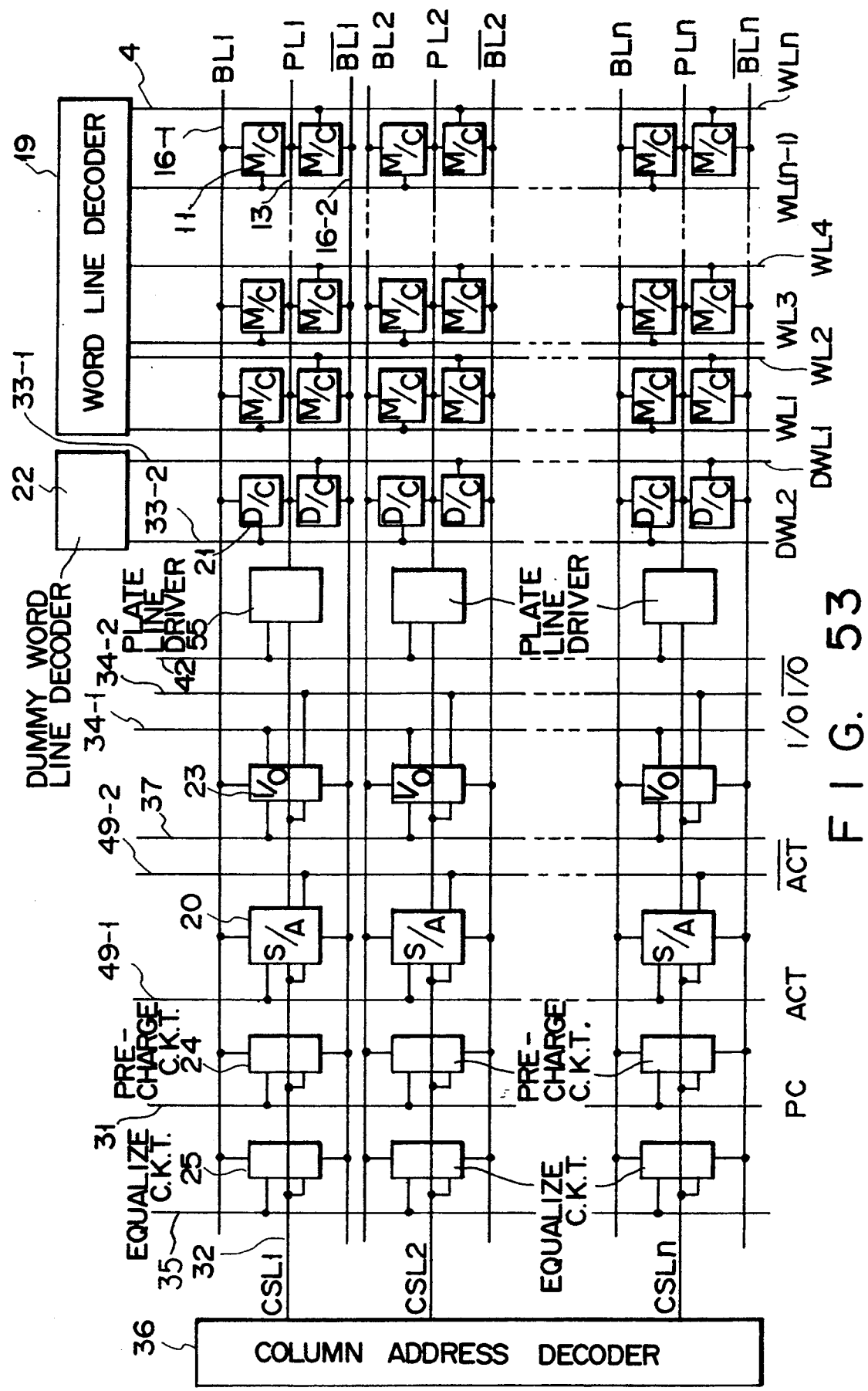
FIG. 53 is a block diagram showing a semiconductor memory device according to still another embodiment of the present invention.
Figure 54:
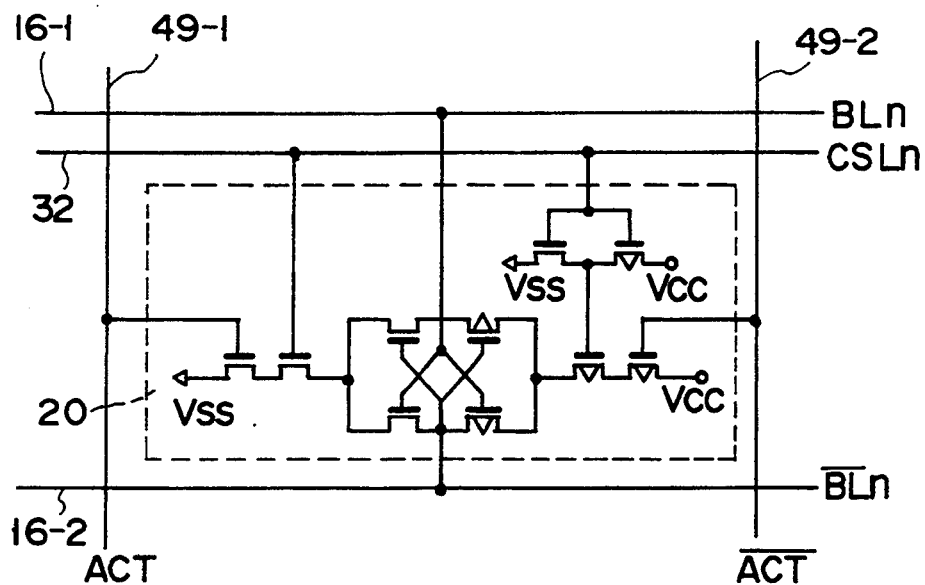
FIG. 54 is a circuit diagram showing an arrangement of a sense amplifier used in the present invention.
Figure 55:
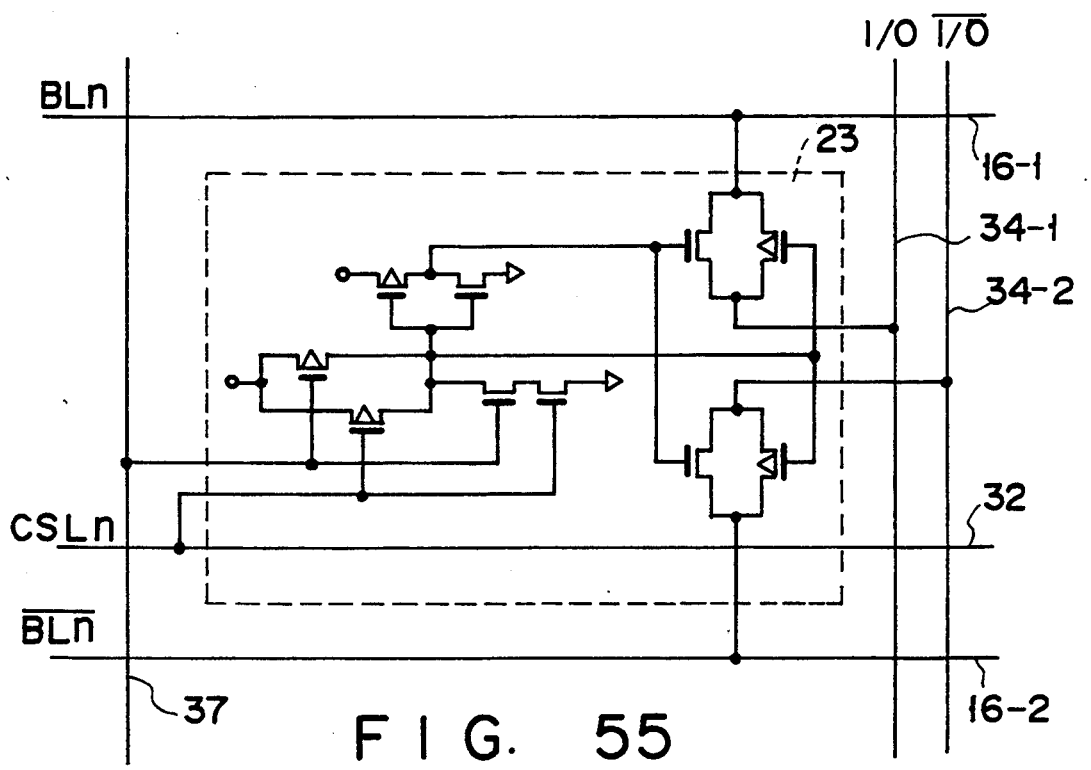
FIG. 55 is a circuit diagram showing an arrangement of an I/O connecting circuit used in the present invention.

According to the present invention, by adding proper peripheral circuits to the memory cell array described above, a semiconductor memory device capable of writing, retaining, and reading out digital information in and from arbitrary memory cells can be formed. FIG. 53 is a block diagram showing such a semiconductor memory device.

The semiconductor memory device shown in FIG. 53 is obtained by adding the following peripheral circuits to the memory cell array shown in FIG. 51, as shown in FIG. 53: a word line decoder 19, sense amplifiers (S/A)'s 20, dummy cells (D/C)'s 21, a dummy word line decoder 22, I/O connecting circuits 23, precharge circuits 24, equalizing circuits 25, plate line drivers 55, and a column address select line decoder 36.

In this semiconductor memory device, the sense amplifiers 20, the I/O connecting circuits 23, the precharge circuits 24, the equalizing circuits 25, and the plate line drivers 55, which are arranged in units of columns, are respectively connected to signal lines 49-1, 49-2, 37, 31, 35, and 42 for transmitting driving signals, and column address select lines (CSLs) 32. The peripheral circuits are controlled by signals transmitted through these two types of signal lines.

FIGS. 54, 55, 56, 57, and 58 are circuit diagrams respectively showing detailed arrangements of the sense amplifier 20, the I/O connecting circuit 23, the precharge circuit 24, the equalizing circuit 25, and the plate line driver 55.

In this semiconductor memory device, signals for driving the plate line drivers 55 are transmitted to all the plate line drivers 55 arranged in units of columns through the plate line driver driving lines 42. However, the plate line drivers 55 are not driven upon reception of only the above-mentioned signals transmitted through the plate line driver driving lines 42 but are driven only when H-level signals are transmitted through the column address select lines (CSLs) 32. Therefore, the plate line drivers 55 can be selectively driven by selecting the column address select lines 32 by using column addresses.

In the semiconductor memory device shown in FIG. 53, the column address select lines 32 are connected to the column address select line decoder 36 so that selection of the column address select lines 32 is performed by the column address select line decoder 36.

The other peripheral circuits arranged in units of columns are also controlled by signals transmitted through the two types of signal lines including the column address select lines 32 and hence can be selectively driven by selecting the column address select lines 32 using column addresses.

Furthermore, in the semiconductor memory device shown in FIG. 53, the sense amplifiers 20, the I/O connecting circuits 23, the precharge circuits 24, the equalizing circuits 25, and the plate line drivers 55 are respectively connected to the common column address select lines 32. With this arrangement, if one of the column address select lines 32 is selected, and the signal lines for driving the above-mentioned peripheral circuits are activated, only the peripheral circuits in the same column can be sequentially driven, thereby greatly saving the access time and the power consumption. In this case, the timing of activating each signal is controlled by a corresponding clock.

Note that in such a semiconductor memory device, even if the peripheral circuits are not connected to the address select line 32 of the same column, the peripheral circuits in the same column can be selected if the same signal is input through the column address select lines 32 to which the peripheral circuits are respectively connected.

Moreover, in the semiconductor memory device shown in FIG. 53, each precharge circuit 24 and each equalizing circuit 25 are connected to different signal lines, so that signals are transmitted to the precharge circuit 24 and the equalizing circuit 25 through the precharge circuit driving line (PC) 31 and the equalizing circuit driving line 35, respectively. That is, these circuits are independently controlled. In this semiconductor memory device, however, each precharge circuit and each equalizing circuit may be connected to the precharge circuit driving line 35 to be simultaneously driven.

In the present invention, all the plate lines 13 may be connected to the plate decoder without arranging the plate line drivers 55 in units of columns so that selection of the plate lines 13 can be performed by the plate line decoder.

A method of operating the semiconductor memory device shown in FIG. 53 will be described in detail below.

FIG. 59 is a timing chart showing the timing of each operation when information is written in the semiconductor memory device. A write operation with respect to the semiconductor memory device shown in FIG. 53 will be described below with reference to FIG. 59.

In this embodiment, a potential of $V_{SS}$ is externally and constantly applied to a p-type silicon substrate by a power source voltage generating means during an operation of the semiconductor memory device. Note that in the present invention, if each memory cell (M/C) 11 of the semiconductor memory device has a structure in which p-type source and drain regions are formed in an n-type silicon substrate, the substrate potential of the n-type silicon substrate is set to be $V_{CC}$.

When information is to be written in the semiconductor memory device, a signal $\overline{CE}$ (chip enable signal) is changed from H level to L level while a signal $\overline{WE}$ (write enable signal) is at L level. With this operation, the semiconductor memory device identifies the following series of operations as a write cycle. When the signal $\overline{CE}$ goes to L level, the address of the memory cell 11 in which information is written and pieces of write information are externally supplied to an address pin and a $D_{in}$ pin, respectively. In a precharge state in which the signal, $\overline{CE}$ is at H level, the precharge potential of a corresponding bit line pair is set to be $V_{SS}$, and the potential of the corresponding plate line (PL) 13 is also kept at $V_{SS}$. In this embodiment, an external fetching operation of an address and the like is controlled by a 1-pin control signal $\overline{CE}$. However, the present invention is not limited to this. For example, an address multiplex scheme may be used. In this scheme, a row address and a column address are fetched at different timings by using signals $\overline{RAS}$ and $\overline{CAS}$.

When the signal $\overline{CE}$ is set at L level, the column address select line decoder 36 decodes the column address to select one of the column address select lines (CSLs) 32. The potential of the selected column address select line 32 is raised from $V_{SS}$ to $V_{CC}$. Note that the potentials of all other column address select lines 32 which are not selected are kept at $V_{SS}$.

Subsequently, a precharge cancel signal $\overline{\phi_{PC}}$ and an equalized state cancel signal $\overline{\phi_{EQ}}$ are respectively input to the precharge circuit 24 and the equalizing circuit 25 through the precharge circuit driving line (PC) 13 and the equalizing circuit driving line 35, thus canceling the precharge state and equalized state of the bit line pair in only the selected column.

At substantially the same time, the word line decoder 18 decodes the row address to select one of the word lines (WL) 4. When a driving signal is transmitted through the selected word line 4, the MOS transistor of the memory cell 11 connected to the word line 4 is turned on. The timing of selecting this word line 4 may be set before or after the cancellation of the precharge state of the bit line pair. In addition, at this time, since the potential of each of the bit line pair and the plate line 13 is set to be $V_{SS}$, no change in polarization state of a ferroelectric capacitor occurs in the memory cell 11 in which the MOS transistor is turned on.

Meanwhile, the write information is fetched in a $D_{in}$ buffer, and the potentials of the pieces of write information are charged, as the potentials $V_{SS}$ or $V_{CC}$, in I/O line (I/O) 34-1 and $\overline{(I/O)}$ 34-2, i.e., an I/O line pair.

An I/O line connecting signal $\phi_{I/O}$ is input to the I/O connecting circuits 23 through the I/O line connecting signal line 37 to connect the bit line pair of the selected column to the I/O line pair. As a result, the potentials $V_{SS}$ and $V_{CC}$ of the I/O line pair are transferred to the bit line pair connected thereto. At this time, if the potential $V_{CC}$ is transferred to the bit line (BL) 16-1 or $\overline{(BL)}$ 16-2 connected to the memory cell (M/C) 11 which is accessed by selecting the row and column addresses, since the potential of the plate line (PL) 13 is $V_{SS}$, and the MOS transistor of the memory cell 11 is ON, information of "1" is immediately written in the memory cell 11.

If the potential $V_{CC}$ is transferred to the bit line 16-1 or 16-2 connected to the memory cell 11, the information is written when a driving signal is transmitted through the plate line 13 of the selected column. More specifically, a plate line driver driving signal $\phi_{PL}$ is input to the plate line drivers 55 through the plate line driver driving line 42 to drive the plate line driver 55 of the selected column so as to raise the potential of the plate line 13 from $V_{SS}$ to $V_{CC}$. After a lapse of a predetermined period of time, the plate line driver driving signal $\phi_{PL}$ is disabled, and the potential of the plate line 13 is lowered to $V_{SS}$. Since the MOS transistor of the memory cell 11 to which the information is to be written is ON, information of "0" is written in the memory cell 11 at this time. In other words, in the write operation in this embodiment, information can be written in the target memory cell 11 upon an access operation regardless of the information of "1" or "0".

In the semiconductor memory device according to the present invention, when the memory cell (M/C) 11 is to be accessed, the following potential difference is caused between the two electrodes of the ferroelectric capacitor of each of the other memory cells 11 in the same column as that of the accessed memory:

$$(Cd \cdot V_{CC})/(Cf+Cd)$$

where Cd is the capacitance of a depletion layer between the p-type silicon substrate and the n-type diffusion region, and Cf is the capacitance of the ferroelectric capacitor. Therefore, in order to prevent polarization reversal in the ferroelectric capacitor at this time, the capacitor must be designed to have a coercive voltage $V_O$ given by $$(Cd \cdot V_{CC})/(Cf+Cd) < V_O \leq V_{CC}$$

In this embodiment, after the memory cell (M/C) 11 is accessed, the I/O line connecting signal $\phi_{I/O}$ input to the I/O connecting circuits 23 is disabled, and the bit line pair to which the potentials $V_{SS}$ and $V_{CC}$ are transferred are disconnected from the I/O line pair. In addition, the precharge signal $\phi_{PC}$ and the equalize signal $\phi_{EQ}$ are respectively input to the precharge circuit 24 and the equalizing circuit 25 to precharge the bit line pair. At this time, the precharge potential of the bit line pair is $V_{SS}$, which is equal to the substrate potential applied to the p-type silicon substrate, and the potential of the plate line (PL) 13 is also set to be $V_{SS}$.

The word line (WL) 4 selected by the word line decoder 19 is restored to the non-selected state, and the MOS transistor of the memory cell 11 connected to the word line 4 is turned off. Thereafter, the signal $\overline{CE}$ is set at H level again, and the column address select line (CSL) 32 selected by the column address select line decoder 36 is set in a non-selected state. In addition, the I/O line pair is disconnected from the $D_{in}$ buffer to have a potential of $\frac{1}{2} V_{CC}$ i.e., a precharge state, thus completing the series of operations in the write mode.

In the present invention, a write operation is performed at the above-described operation timings so that the potential of a storage node upon completion of the operation can be set to be equal to the substrate potential of the semiconductor substrate. In addition, according to the present invention, when the information written by the above-described operations is to be retained, the potential of the plate line is preferably kept at $V_{SS}$ to set the potentials of the two electrodes of the ferroelectric capacitor of the memory cell to be equal to each other.

Figure 60:
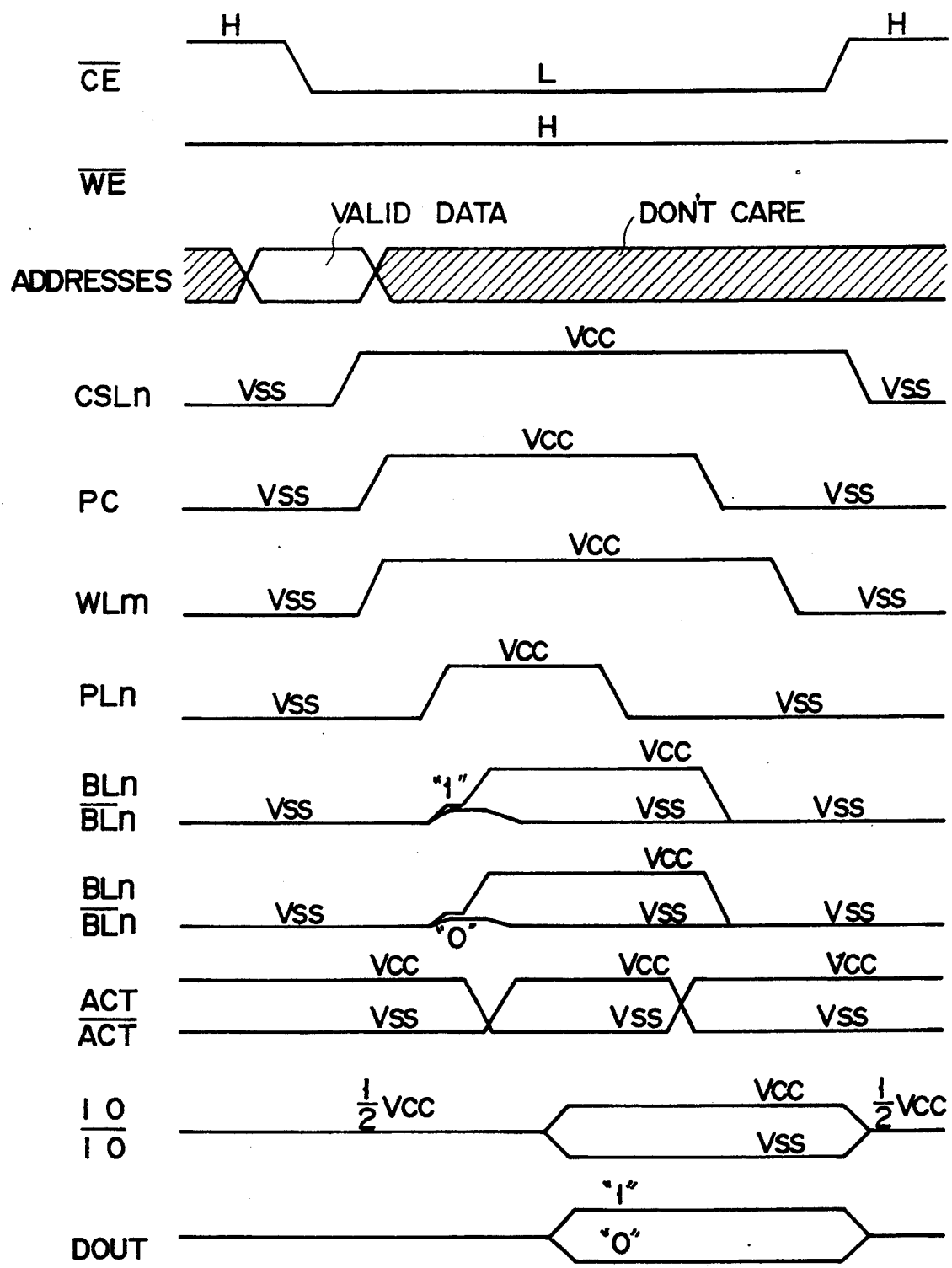
FIG. 60 is a timing chart showing the timing of each operation in a read mode according to the present invention.

FIG. 60 is a timing chart showing the timing of each operation when information is read out from the semiconductor memory device shown in FIG. 53.

When a read operation is to be performed, the signal $\overline{CE}$ is lowered from H level to L level while the signal $\overline{WE}$ is kept at H level. With this operation, the semiconductor memory device identifies the following series of operations as a read cycle.

When the signal $\overline{CE}$ is set at L level, similar to the write operation described above, one of the column address select lines (CSLs) 32 is selected by the column address select line decoder 36. The potential of the selected column address select line 32 is raised from $V_{SS}$ to $V_{CC}$. Thereafter, similar to the write operation, the precharge and equalized states of a corresponding bit line pair are canceled. At substantially the same time, one of the word lines (WLs) 4 is selected. When a driving signal is transmitted to the selected word line 4, the MOS transistor of the memory cell (M/C) 11 connected to the selected word line 4 is turned on.

Subsequently, the plate line driver driving signal $\phi_{PL}$ is input to the plate line drivers 55 through the plate line driver driving line 42 to drive the plate line driver 55 of the selected column so as to raise the potential of the plate line (PL) 13 from $V_{SS}$ to $V_{CC}$, thus transmitting the driving signal. With this operation, the information stored in the memory cell 11 connected to the plate line 13 and the selected word line 4 is extracted to the bit line (BL) 16-1 or ($\overline{BL}$) 16-2 connected thereto.

A case wherein such information is extracted to the bit line 16-1 will be described below. In this case, the potential of the bit line 16-1 is greatly raised, when the information stored in the memory cell 11 is "1", and is slightly raised, when the information is "0". Meanwhile, the dummy word lines (DWLs) 33-1 and 33-2 are selected by the dummy word line decoder 22 to drive the dummy cell (D/C) 21 so as to set the potential of the bit line 16-2 to be an intermediate value between the potentials of the bit line 16-1 which are respectively set when the pieces of extracted information are "1" and "0".

When the information stored in the memory cell (M/C) 11 is extracted to the bit line 16-1 to cause a potential difference between the bit line pair, the sense amplifier activating signals $\phi_{ACT}$ and $\overline{\phi_{ACT}}$ are input to the sense amplifiers (S/As) 20 through the sense amplifier activating lines (ACT) 49-1 and ($\overline{ATC}$) 49-2. As a result, the sense amplifier 20 in the selected column is activated. In this case, in order to perform a high-speed sensing operation, the signal $\overline{\phi_{ACT}}$ for activating the PMOS type flip-flop circuit of the sense amplifier 20 is input prior to the signal $\phi_{ACT}$ for activating the NMOS type flip-flop circuit of the sense amplifier 20. With this operation, the potential difference between the bit line pair is amplified, so that one potential is fixed to $V_{CC}$, and the other potential, $V_{SS}$.

Subsequently, the I/O line connecting signal $\phi_{I/O}$ is input to the I/O connecting circuits 23 through the I/O line connecting signal line 37 to connect the bit line pair whose potential difference is amplified by the sense amplifier 20 to the corresponding I/O line pair, thus transferring the information, extracted to the bit line pair, to the I/O line pair. After this operation, this information is read out as an output signal $D_{out}$ through an output buffer. The bit line pair and the I/O line pair are disconnected from each other after a lapse of a predetermined period of time, i.e., when the I/O line connecting signal to the I/O connecting circuit 23 is disabled. Subsequently, the potentials of the I/O line pair are respectively kept at $V_{SS}$ and $V_{CC}$.

In the semiconductor memory device according to the present invention, after the information is extracted from a predetermined one of the memory cells (M/Cs) 11 by the above-described operations, a rewrite operation is performed with respect to the memory cell 11. If the information stored in the memory cell 11 is "0", the corresponding sense amplifier 20 is activated in the above-described manner. As a result, the potential of the bit line (BL) 16-1 connected to the memory cell 11 is fixed to $V_{SS}$, and the potential of the plate line (PL) 13 is kept at $V_{CC}$. At this time, therefore, a rewrite operation is performed.

If the information stored in the memory cell 11 is "1", after the above operation, the plate line driver driving signal $\phi_{PL}$ to the plate line driver 55 is disabled to restore the potential of the plate line 13 to $V_{SS}$. Thereafter, a rewrite operation is performed. With such operations, the information is retained in the memory cell 11 after it is read out regardless of the information stored in the memory cell 11 being "1" or "0".

Furthermore, in the read operation according to the present invention, after the above-described access to the memory cell 11, the sense amplifier activating signals $\phi_{ACT}$ and $\overline{\phi_{ACT}}$ to the sense amplifier (S/A) 20 are disabled to restore the sense amplifier 20 to the nonselected state. Thereafter, the precharge signal $\phi_{PC}$ and the equalize signal $\phi_{EQ}$ are respectively input to the precharge circuit 24 and the equalizing circuit 25 to precharge the bit line pair. At this time, the precharge potential of the bit line pair is $V_{SS}$, which is equal to the substrate potential applied to the p-type silicon substrate. In addition, the potential of the plate line (PL) 13 is set at $V_{SS}$.

Subsequently, the word line (WL) 4 selected by the word line decoder 19 is restored to the non-selected state, and hence the MOS transistor of the memory cell 11 connected to the word line 4 is turned off. Thereafter, the signal $\overline{CE}$ is set at H level again, and the column address select line (CSL) 32 selected by the column address select line decoder 36 is set in a nonselected state. In addition, the I/O line pair is disconnected from the $D_{in}$ buffer to have a potential of $\frac{1}{2} V_{CC}$, i.e., a precharge state. With this operation, the series of operations in the read mode are completed.

In the present invention, by performing a read operation at the above-described operation timings, the potential of a storage node upon completion of the read operation can be set to be equal to the substrate potential of the semiconductor substrate. In addition, it is apparent that after such a read operation is completed, the information stored in the memory cell 11 is preferably retained while the potential of the plate line 13 is kept at $V_{SS}$, and the potentials of the two electrodes of the ferroelectric capacitor of the memory cell 11 are set to be equal to each other.

In the above-described method of operating the semiconductor memory device according to the present invention, after a memory is accessed, the potential of the storage node is kept equal to the substrate potential of the semiconductor substrate. In addition, when the precharge state of a predetermined bit line is canceled, the potential of the bit line is also set to be equal to the substrate potential. This reduces the possibility of diffusion/movement of charge from the semiconductor substrate to the diffusion layer, which causes soft errors and a deterioration in refresh characteristics.

Furthermore, since variations in substrate potential of the semiconductor substrate are small, a very reliable operation can be performed.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:
   a plurality of memory cells arranged in a matrix configuration having rows and columns;
   first selection means, operatively coupled to said plurality of memory cells, for selecting said memory cells in one of said rows;
   a plurality of first driving lines, each connected to said memory cells in said one of said rows, for transmitting a first driving signal to said memory cells in said one of said rows, one of said plurality of first driving lines being selected by a row address designated by said first selection means;
   second selection means, operatively coupled to said plurality of memory cells, for selecting said memory cells in one of said columns;
   a plurality of second driving lines, each connected to said memory cells in said one of said columns, for transmitting a second driving signal to said memory cells in said one of said columns, one of said plurality of second driving lines being selected by a column address designated by said second selection means;
   a plurality of read/write lines, each connected to said memory cells in said one of said columns, for performing read/write operations with respect to the memory cells in said one of said columns; and
   a plurality of sense amplifiers, each connected to an associated one of said read/write lines, and selected by the column address designated by said second selection means;
   wherein the column address designated by the second selection means selects only one of said plurality of sense amplifiers and activates said only one of said plurality of sense amplifiers.

2. A device according to claim 1, wherein each of said memory cells is constituted by one MOS transistor having a gate, a drain, and a source, and one ferroelectric capacitor having first and second electrodes,
   said first driving lines, said second driving lines, and said read/write lines are word lines, plate lines, and bit lines, respectively,
   a gate electrode of said MOS transistor is connected to one of said word lines,
   the source and drain of said MOS transistor are respectively connected to one of said bit lines and the first electrode of said ferroelectric capacitor, and
   the second electrode of said ferroelectric capacitor is connected to one of said plate lines.

3. A device according to claim 2, wherein said plate lines and said sense amplifiers are arranged in columns, each of said sense amplifiers is connected to two of said bit lines which are adjacent to each other and constituting a bit line pair, and each of said memory cells in the same column are connected to one plate line and are also connected to one of said two bit lines constituting said bit line pair.

4. A device according to claim 3, wherein said memory cells connected to one of said bit lines constituting said bit line pair are equal in number to said memory cells connected to the other of said bit lines constituting said bit line pair.

5. A device according to claim 4, wherein said memory cells in the same column are connected to said two bit lines adjacent to each other and one plate line, and said two bit lines are disposed on opposite sides of said one plate line to be parallel with each other.

6. A device according to claim 5, further comprising:
a plurality of I/O connecting circuits arranged in columns, each of said plurality of I/O connecting circuits operatively connected to respective one of said two bit lines through said respective sense amplifier in one of said columns; and
a plurality of I/O lines connected to said I/O connecting circuits.

7. A device according to claim 6, further comprising:
an I/O connecting circuit driving line, connected to each of said plurality of I/O connecting circuits, for supplying a signal for driving said I/O connecting circuits to said plurality of I/O connecting circuits,
wherein said second driving lines are connected to said I/O connecting circuits to select one of said I/O connecting circuits by the column address designated by said second selection means.

8. A device according to claim 5, further comprising:
a plurality of plate line drivers, arranged in columns, for selectively driving said plate lines; and
plate line driver driving line, connected to said plurality of plate line drivers, for supplying a signal for driving said plate line drivers to said plurality of plate line drivers,
wherein said second driving lines are connected to said plate line drivers to select one of said plate line drivers by the column address designated by said second selection means.

9. A device according to claim 8, further comprising:
I/O connecting circuits arranged in columns, each of said I/O connecting circuits being operatively connected to respective ones of said two bit lines through one of said sense amplifiers in one of said columns; and
I/O lines connected to said I/O connecting circuits.

10. A device according to claim 9, further comprising a plurality of I/O connecting circuit driving lines, connected to said plurality of I/O connecting circuits, for transmitting signals for driving said I/O connecting circuits, and
wherein said column address select lines are connected to said I/O connecting circuits, and one of said I/O connecting circuits is selected by a column address.

11. A device according to claim 5, further comprising:
a sense amplifier activating line, connected to said sense amplifiers, for supplying a signal for activating said sense amplifiers to said sense amplifiers, wherein each of said second driving lines are connected to respective ones of said sense amplifiers to select one of said sense amplifiers by the column address designated by said second selection means.

12. A device according to claim 11, further comprising:
I/O connecting circuits arranged in columns, each of said I/O connecting circuits being operatively connected to respective ones of said two bit lines through said sense amplifier in one of said columns; and
I/O lines connected to said I/O connecting circuits.

13. A device according to claim 12, further comprising:
an I/O connecting circuit driving line, connected to said plurality of I/O connecting circuits, for supplying a signal for driving said I/O connecting circuits to said plurality of I/O connecting circuits,
wherein each of said second driving lines are connected to respective ones of said I/O connecting circuits to select one of said I/O connecting circuits by the column address designated by said second selection means.

14. A device according to claim 11, further comprising:
a plurality of plate line drivers, arranged in said units of columns, for selectively driving said plate lines; and
a plate line driver driving line, connected to said plurality of plate line drivers, for supplying a signal for driving said plate line drivers to said plurality of plate line drivers,
wherein each of said second driving lines are connected to respective ones of said plurality of plate line drivers to select one of said plate line drivers by the column address designated by said second selection means.

15. A device according to claim 14, further comprising:
I/O connecting circuits arranged in columns, each of said I/O connecting circuits being operatively connected to said two bit lines through said sense amplifier in one of said columns; and
I/O lines connected to said I/O connecting circuits.

16. A device according to claim 15, further comprising:
an I/O connecting circuit driving line, connected to said I/O connecting circuits, for supplying a signal for driving said I/O connecting circuits to said I/O connecting circuits,
wherein each of said I/O connecting circuits are connected to respective ones of said second driving lines, and one of said I/O connecting circuits is selected by the column address designated by said second selection means.

17. A device according to claim 5, further comprising:
precharge circuits, arranged in columns, each of said precharge circuits connected to respective ones of said two bit lines adjacent to each other, for precharging said two bit lines.

18. A device according to claim 17, further comprising:
precharge circuit driving line, connected to said precharge circuits, for supplying a signal for driving said precharge circuits to said precharge circuits,
wherein each of said second driving lines are connected to respective ones of said precharge circuits to select one of said precharge circuits by the column address designated by said second selection means.

19. A semiconductor memory device comprising:
a plurality of memory cells arranged in a matrix configuration having rows and columns;
first selection means, operatively coupled to said plurality of memory cells, for selecting said memory cells in one of said rows;
a plurality of first driving lines, each connected to said memory cells in said one of said rows, for transmitting a first driving signal to said memory cells in said one of said rows, one of said plurality of first driving lines being selected by a row address designated by said first selection means;
second selection means, operatively coupled to said plurality of memory cells, for selecting said memory cells in one of said columns;
a plurality of second driving lines, each connected to said memory cells in said one of said columns, for transmitting a second driving signal to said memory cells in said one of said columns, one of said plurality of second driving lines being selected by a column address designated by said second selection means;
a plurality of read/write lines, each connected to said memory cells in said one of said columns, for performing read/write operations with respect to the memory cells in said one of said columns;
a plurality of sense amplifiers, each connected to an associated one of said read/write lines, and selected by the column address designated by said second selection means;
wherein each of said memory cells is constituted by one MOS transistor having a gate, a drain, and a source, and one ferroelectric capacitor having first and second electrodes,
said first driving lines, said second driving lines, and said read/write lines are word lines, plate lines, and bit lines, respectively,
a gate electrode of said MOS transistor is connected to one of said word lines,
the source and drain of said MOS transistor are respectively connected to one of said bit lines and the first electrode of said ferroelectric capacitor, and
the second electrode of said ferroelectric capacitor is connected to one of said plate lines;
wherein said plate lines and said sense amplifiers are arranged in columns,
each of said sense amplifiers is connected to two of said bit lines which are adjacent to each other and constituting a bit line pair, and
each of said memory cells in the same column are connected to one plate line and are also connected to one of said two bit lines constituting said bit line pair;
wherein said memory cells connected to one of said bit lines constituting said bit line pair are equal in number to said memory cells connected to the other of said bit lines constituting said bit line pair;
wherein said memory cells in the same column are connected to said two bit lines adjacent to each other and one plate line, and
said two bit lines are disposed on opposite sides of said one plate line to be parallel with each other;
said device further comprising:
a sense amplifier activating line, connected to said sense amplifier, for supplying a signal for activating said sense amplifiers to said sense amplifiers,
wherein each of said second driving lines are connected to respective ones of said sense amplifiers to select one of said sense amplifiers by the column address designated by said second selection means;
said device further comprising:
a plurality of plate line drivers arranged in said units of columns, for selectively driving said plate lines; and
a plate line driver driving line, connected to said plurality of plate line drivers, for supplying a signal for driving said plate line drivers to said plurality of plate line drivers,
wherein each of said second drawing lines are connected to respective ones of said plurality of plate line drivers to select one of said plate line drivers by the column address designated by said second selection means;
said device further comprising:
I/O connecting circuits arranged in columns, each of said I/O connecting circuits being operatively connected to said two bit lines through said sense amplifier in one of said columns;
I/O lines connected to said I/O connecting circuits; and
an I/O connecting circuit driving line, connected to said I/O connecting circuits, for supplying a signal for driving said I/O connecting circuits to said I/O connecting circuits,
wherein each of said I/O connecting circuits are connected to respective ones of said :second driving lines, and one of said I/O connecting circuits is selected by the column address designated by said second selection means.

20. A semiconductor memory device comprising:
a plurality of memory cells arranged in a matrix configuration having rows and columns;
first selection means, operatively coupled to said plurality of memory cells, for selecting said memory cells in one of said rows;
a plurality of first driving lines, each connected to said memory cells in said one of said rows, for transmitting a first driving signal to said memory cells in said one of said rows, one of said plurality of first driving lines being selected by a row address designated by said first selection means;
second selection means, operatively coupled to said plurality of memory cells, for selecting said memory cells in one of said columns;
a plurality of second driving lines, each connected to said memory cells in said one of said columns, for transmitting a second driving signal to said memory cells in said one of said columns, one of said plurality of second driving lines being selected by a column address designated by said second selection means;
a plurality of read/write lines, each connected to said memory cells in said one of said columns, for performing read/write operations with respect to the memory cells in said one of said columns;
a plurality of sense amplifiers, each connected to an associated one of said read/write lines, and selected by the column address designated by said second selection means;
wherein each of said memory cells is constituted by one MOS transistor having a gate, a drain, and a source, and one ferroelectric capacitor having first and second electrodes, said first driving lines, said second driving lines, and said read/write lines are word lines, plate lines, and bit lines, respectively, a gate electrode of said MOS transistor is connected to one of said word lines, the source and drain of said MOS transistor are respectively connected to one of said bit lines and the first electrode of said ferroelectric capacitor, and the second electrode of said ferroelectric capacitor is connected to one of said plate lines;

wherein said plate lines and said sense amplifiers are arranged in columns, each of said sense amplifiers is connected to two of said bit lines which are adjacent to each other and constituting a bit line pair, and each of said memory cells in the same column are connected to one plate line and are also connected to one of said two bit lines constituting said bit line pair;

wherein said memory cells connected to one of said bit lines constituting said bit line pair are equal in number to said memory cells connected to the other of said bit lines constituting said bit line pair;

wherein said memory cells in the same column are connected to said two bit lines adjacent to each other and one plate line, and said two bit lines are disposed on opposite sides of said one plate line to be parallel with each other;

said device further comprising:

precharge circuits, arranged in columns, each of said precharged circuits connected to respective ones of said bit lines adjacent to each other, for precharging said two bit lines; and a precharge circuit driving line, connected to said precharge circuits, for supplying a signal for driving said precharge circuits to said precharge circuits, wherein each of said second driving lines are connected to respective ones of said precharge circuits to select one of said precharge circuits by the column address designated by said second selection means.

21. A semiconductor memory device comprising:

a plurality of memory cells arranged in a matrix configuration having rows and columns;

first selection means, operatively coupled to said plurality of memory cells, for selecting said memory cells in one of said rows;

a plurality of first driving lines, each connected to said memory cells in said one of said rows, for transmitting a first driving signal to said memory cells in said one of said rows, one of said plurality of first driving lines being selected by a row address designated by said first selection means;

second selection means, operatively coupled to said plurality of memory cells, for selecting said memory cells in one of said columns;

a plurality of second driving lines, each connected to said memory cells in said one of said columns, for transmitting a second driving signal to said memory cells in said one of said columns, one of said plurality of second driving lines being selected by a column address designated by said second selection means;

a plurality of read/write lines, each connected to said memory cells in said one of said columns, for performing read/write operations with respect to the memory cells in said one of said columns;

a plurality of sense amplifiers, each connected to an associated one of said read/write lines, and selected by the column address designated by said second selection means;

wherein each of said memory cells is constituted by one MOS transistor having a gate, a drain, and a source, and one ferroelectric capacitor having first and second electrodes, said first driving lines, said second driving lines, and said read/write lines are word lines, plate lines, and bit lines, respectively, a gate electrode of said MOS transistor is connected to one of said word lines, the source and drain of said MOS transistor are respectively connected to one of said bit lines and the first electrode of said ferroelectric capacitor, and the second electrode of said ferroelectric capacitor is connected to one of said plate lines;

wherein said plate lines and said sense amplifiers are arranged in columns, each of said sense amplifiers is connected to two of said bit lines which are adjacent to each other and constituting a bit line pair, and each of said memory cells in the same column are connected to one plate line and are also connected to one of said two bit lines constituting said bit line pair;

wherein said memory cells connected to one of said bit lines constituting said bit line pair are equal in number to said memory cells connected to the other of said bit lines constituting said bit line pair;

wherein said memory cells in the same column are connected to said two bit lines adjacent to each other and one plate line, and said two bit lines are disposed on opposite sides of said one plate line to be parallel with each other;

said device further comprising:

a plurality of I/O connecting circuits arranged in columns, each of said plurality of I/O connecting circuits operatively connected to a respective one of said two bit lines through said respective amplifier in one of said columns;

a plurality of I/O lines connected to said I/O connecting circuits; and an I/O connecting circuit driving line, connected to each of said plurality of I/O connecting circuits, for supplying a signal for driving said I/O connecting circuits to said plurality of I/O connecting circuits, wherein said driving lines are connected to said I/O connecting circuits to select one of said I/O connecting circuits by the column address designated by said second selection means.

22. A semiconductor memory device comprising:

a plurality of memory cells arranged in a matrix configuration having rows and columns;

first selection means, operatively coupled to said plurality of memory cells, for selecting said memory cells in one of said rows;

a plurality of first driving lines, each connected to said memory cells in said one of said rows, for transmitting a first driving signal to said memory cells in said one of said rows, one of said plurality of first driving lines being selected by a row address designated by said first selection means;

second selection means, operatively coupled to said plurality of memory cells, for selecting said memory cells in one of said columns;

a plurality of second driving lines, each connected to said memory cells in said one of said columns, for transmitting a second driving signal to said memory cells in said one of said columns, one of said plurality of second driving lines being selected by a column address designated by said second selection means;

a plurality of read/write lines, each connected to said memory cells in said one of said columns, for performing read/write operations with respect to the memory cells in said one of said columns;

a plurality of sense amplifiers, each connected to an associated one of said read/write lines, and selected by the column address designated by said second selection means;

wherein each of said memory cells is constituted by one MOS transistor having a gate, a drain., and a source, and one ferroelectric capacitor having first and second electrodes, said first driving lines, said second driving lines, and said read/write lines are word lines, plate lines, and bit lines, respectively, a gate electrode of said MOS transistor is connected to one of said word lines, the source and drain of said MOS transistor are respectively connected to one of said bit lines and the first electrode of said ferroelectric capacitor, and the second electrode of said ferroelectric capacitor is connected to one of said plate lines;

wherein said plate lines and said sense amplifiers are arranged in columns, each of said sense amplifiers is connected to two of said bit lines which are adjacent to each ,other and constituting a bit line pair, and each of said memory cells in the same column are connected to one plate line and are also connected to one of said two bit lines constituting said bit line pair;

wherein said memory cells connected to one of said bit lines constituting said bit line pair are equal in number to said memory cells connected to the other of said bit lines constituting said bit line pair;

wherein said memory cells in the same column are connected to said two bit lines adjacent to each other and one plate line, and said two bit lines are disposed on opposite sides of said one plate line to be parallel with each other;

said device further comprising:

a sense amplifier activating line, connected to said sense amplifiers, for supplying a signal for activating said sense amplifiers to said sense amplifiers, wherein each of said second driving lines are connected to respective ones of said sense amplifiers to select one of said sense amplifiers by the column address designated by said second selection means;

said device further comprising:

I/O connecting circuits arranged in columns, each of said I/O connecting circuits being operatively connected to respective ones of said two bit lines through said sense amplifier in one of said columns;

I/O lines connected to said I/O connecting circuits; and an I/O connecting circuit driving line, connected to said plurality of I/O connecting circuits, for supplying a signal for driving said I/O connecting circuits to said plurality of I/O connecting circuits, wherein each of said second driving lines are connected to respective ones of said I/O connecting circuits to select one of said I/O connecting circuits by the column address designated by said second selection means.

* * * * *